United States Patent
Satoh et al.

(10) Patent No.: US 10,454,411 B2
(45) Date of Patent: Oct. 22, 2019

(54) LIGHT-CONDENSING FILM, SOLAR CELL MODULE, AND TRANSFER MOLD

(71) Applicant: DAIKIN INDUSTRIES, LTD., Osaka-shi, Osaka (JP)

(72) Inventors: Kazuyuki Satoh, Settsu (JP); Tetsuya Matsuura, Sakai (JP); Shigehito Sagisaka, Settsu (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 142 days.

(21) Appl. No.: 14/343,126

(22) PCT Filed: Sep. 28, 2012

(86) PCT No.: PCT/JP2012/075226
§ 371 (c)(1),
(2) Date: Mar. 6, 2014

(87) PCT Pub. No.: WO2013/047827
PCT Pub. Date: Apr. 4, 2013

(65) Prior Publication Data
US 2014/0216549 A1    Aug. 7, 2014

(30) Foreign Application Priority Data

Sep. 30, 2011  (JP) ................... 2011-218351
Jun. 19, 2012  (JP) ................... 2012-137816
(Continued)

(51) Int. Cl.
*G02B 1/118*    (2015.01)
*H01L 31/0236*  (2006.01)
(Continued)

(52) U.S. Cl.
CPC ............ *H02S 40/00* (2013.01); *G02B 5/0215* (2013.01); *G02B 5/0231* (2013.01);
(Continued)

(58) Field of Classification Search
None
See application file for complete search history.

(56) References Cited

U.S. PATENT DOCUMENTS 6,075,652 A * 6/2000 Ono ..................... G02B 1/11
                                                257/E31.127
6,169,633 B1   1/2001 Watanabe
(Continued)

FOREIGN PATENT DOCUMENTS

EP    2270553 A1    1/2011
EP    2447740 A1    5/2012
(Continued)

OTHER PUBLICATIONS

Ko et al. "Biomimetic microlens array with antireflective 'moth-eye' surface" Soft Matter, 2011, 7, 6404), hereinafter Ko, Ophthobook ("Compound Eye (Image)") https://web.archive.org/web/20120218093210/http://www.ophthobook.com/photos/compound-eye-image[Jan. 13, 2016 2:18:41 PM].*

(Continued)

*Primary Examiner* — Magali P Slawski
(74) *Attorney, Agent, or Firm* — Sughrue Mion, PLLC

(57) ABSTRACT

The present invention aims to provide a light-concentrating film capable of concentrating at least one of direct sunlight and diffuse sunlight with high efficiency; a photovoltaic module having the light-concentrating film; and a transfer mold (die) for producing the light-concentrating film. The present invention relates to a light-concentrating film including alternating fine concavo-convex structure on at least one surface, the film having a concavo-convex height (H) of 0.05

(Continued)

to 15 μm and a concavo-convex pitch (P) of 0.05 to 50 μm, the film concentrating at least one of direct sunlight and diffuse sunlight.

10 Claims, 8 Drawing Sheets

(30) Foreign Application Priority Data

Jun. 27, 2012 (JP) .................... 2012-144226
Sep. 27, 2012 (JP) .................... 2012-213579

(51) Int. Cl.
*H02S 40/00* (2014.01)
*G02B 5/02* (2006.01)
*H01L 31/054* (2014.01)
*H01L 51/44* (2006.01)
*F21V 8/00* (2006.01)

(52) U.S. Cl.
CPC ...... *G02B 5/0278* (2013.01); *H01L 31/02366* (2013.01); *H01L 31/0547* (2014.12); *G02B 6/0053* (2013.01); *H01L 51/447* (2013.01); *Y02E 10/52* (2013.01)

(56) References Cited

U.S. PATENT DOCUMENTS

| | | | | |
|---|---|---|---|---|
| 2002/0014263 | A1* | 2/2002 | Sasaki | H01L 31/03682 136/255 |
| 2003/0201249 | A1* | 10/2003 | Harker | B44B 5/0052 216/54 |
| 2004/0027702 | A1 | 2/2004 | Matsushita et al. | |
| 2004/0103938 | A1 | 6/2004 | Rider | |
| 2004/0169929 | A1* | 9/2004 | Sato | G02B 5/1819 359/558 |
| 2008/0223433 | A1* | 9/2008 | Hanoka | H01L 31/048 136/251 |
| 2009/0252940 | A1* | 10/2009 | Gouda | G02B 6/1221 428/213 |
| 2009/0314343 | A1* | 12/2009 | Okaniwa | H01L 31/02168 136/256 |
| 2010/0116332 | A1* | 5/2010 | Counil | H01L 31/0236 136/256 |
| 2010/0177380 | A1* | 7/2010 | Nagahama | B32B 3/30 359/359 |
| 2010/0315803 | A1 | 12/2010 | Inoue et al. | |
| 2010/0328751 | A1* | 12/2010 | Kondou | G02F 1/15 359/270 |
| 2011/0226323 | A1* | 9/2011 | Staley | H01L 31/0322 136/256 |
| 2011/0250435 | A1* | 10/2011 | Ge | B82Y 30/00 428/323 |
| 2012/0282437 | A1* | 11/2012 | Clark | B32B 38/06 428/141 |

FOREIGN PATENT DOCUMENTS

| | | |
|---|---|---|
| JP | 11-84109 A | 3/1999 |
| JP | 2002-203980 A | 7/2002 |
| JP | 2002-228819 A | 8/2002 |
| JP | 2003-255110 A | 9/2003 |
| JP | 2004-179666 A | 6/2004 |
| JP | 2005-101513 A | 4/2005 |
| JP | 3687836 B2 | 6/2005 |
| JP | 2009-94501 A | 4/2009 |
| JP | 2009-094501 A | 4/2009 |
| JP | 2009-229581 A | 10/2009 |
| JP | 2010-44379 A | 2/2010 |
| JP | 2011-44620 A | 3/2011 |
| WO | 2006/035698 A1 | 4/2006 |
| WO | 2008/105411 A1 | 9/2008 |

OTHER PUBLICATIONS

Ophthobook ("Compound Eye (Image)" https://web.archive.org/web/20120218093210/http://www.ophthobook.com/photos/compound-eye-image[Jan. 13, 2016 2:18:41 PM].*

Sharecare "How does the eye perceive light?—Eye & Vision" https://web.archive.org/web/20140123010957/http://www.sharecare.com/health/eye-vision-health/how-eye-perceive-light[Jan. 13, 2016 4:43:53 PM].*

Lee "Moth Eyes: A New Vision for Light-Harnessing Efficiency" in Remarkable Natural Material Surfaces and Their Engineering Potential edited by Michelle Lee, Springer Science & Business Media, Feb. 4, 2014, pp. 79-89.*

Williams "Winging it" Current Biology vol. 20, Issue 13, Jul. 13, 2010, pp. R544-R545.*

International Preliminary Report on Patentability and Written Opinion of the International Searching Authority dated Apr. 1, 2014 for PCT/JP2012/075226.

International Search Report of PCT/JP2012/075226 dated Dec. 25, 2012.

Communication dated May 19, 2015, issued by the European Patent Office in corresponding European Application No. 12835525.2.

* cited by examiner

LIGHT-CONDENSING FILM, SOLAR CELL MODULE, AND TRANSFER MOLD

CROSS REFERENCE TO RELATED APPLICATIONS

This is a National Stage of International Application No. PCT/JP2012/075226 filed Sep. 28, 2012, claiming priority based on Japanese Patent Application No. 2011-218351 filed Sep. 30, 2011, Japanese Patent Application No. 2012-137816 filed Jun. 19, 2012, Japanese Patent Application No. 2012-144226 filed Jun. 27, 2012, and Japanese Patent Application No. 2012-213579 filed Sep. 27, 2012, the contents of all of which are incorporated herein by reference in their entirety.

TECHNICAL FIELD

The present invention relates to a light-concentrating film, a photovoltaic module, and a transfer mold.

BACKGROUND ART

The recent increase in importance of the photovoltaic power generation in response to the emerging energy resource problems and global environmental problems has led to active expansion of the photovoltaic power generation and development of energy supply technologies.

The photovoltaic power generation is aimed at achieving the level of costs for general-purpose power in terms of cost efficiency. Accordingly, solar cells producible at a reduced module production cost and having a high generating efficiency have been desired.

To increase the generation efficiency, the light-concentration efficiency of the solar battery cell can be increased. Conventional optical parts for light concentration are, for example, (1) lenses (spherical or aspheric lenses), (2) concave mirrors, and (3) plane films.

The plane films developed are, for example, optical parts such as Fresnel lenses as described in Patent Literature 1. A conventional plane film, however, cannot achieve highly efficient concentration of a ray of light that strikes the film at a shallow angle from the in-plane direction of the film. For this reason, if the plane films are used as light-concentrating films for a solar cell, the battery needs to be, for efficient power generation, a sun-tracking solar cell which adjusts the orientation of solar battery cells to the direction of sunlight irradiation. Since sun-tracking solar cells are systems controlled to have focusing elements always face the sun, the overall structure of the systems is complicated to cause cost- and equipment-related problems.

Another known plane film is an optical element using a hologram. For example, a hologram produced by fixing a hologram diffraction pattern onto a photosensitive material through laser interference is used. Such a hologram diffraction pattern is formed by a method of recording the interference fringes of the reference light (e.g. laser light) and object light onto a photosensitive material (e.g. dichromated gelatin), and optically fixing the complex amplitude information of the object light on the recording surface.

As well as such a hologram formed by fixing a hologram diffraction pattern onto a photosensitive material through laser interference, computer generated holograms (CGHs) formed by calculating diffraction patterns using a computer have been developed.

Patent Literature 2 discloses an optical branch having at least one first optical system; a hologram element with a diffraction grating pattern formed to branch the radiating light emitted from the first optical system into a plurality of beams and to converge the beams to a plurality of spots; and a plurality of second optical systems with light receivers disposed at positions corresponding to the spots. Here, the optical phase of the diffraction plane of the hologram element can be designed by computer-generated holography using a computer. These conventional hologram elements, however, cannot concentrate rays of light striking at various angles.

A known method of reducing the reflection loss to efficiently catch the rays of sunlight at various angles is forming a moth-eye (bug-eye) structure on the surface of a film. This method forms fine, transparent objects such as cones, triangular pyramids, and quadrangular pyramids on a surface of a film to reduce the reflection loss and efficiently concentrate external light rays. With this method, however, the capture rate (transmittance) of the sunlight greatly falls at an angle to a horizontal plane of smaller than 100, leading to inefficient concentration of the sunlight. Also, the surface of the film is easily contaminated to damage the durability. The method does not have favorable productivity either.

CITATION LIST

Patent Literature

Patent Literature 1: JP 3687836 B
Patent Literature 2: JP 2002-228819 A

SUMMARY OF INVENTION

Technical Problem

The present invention aims to provide a light-concentrating film capable of concentrating at least one of direct sunlight and diffuse sunlight with high efficiency; a photovoltaic module having the light-concentrating film; and a transfer mold (die) for producing the light-concentrating film.

Solution to Problem

The present invention relates to a light-concentrating film including alternating fine concavo-convex structure on at least one surface, the film having a concavo-convex height (H) of 0.05 to 15 μm and a concavo-convex pitch (P) of 0.05 to 50 μm, the film concentrating at least one of direct sunlight and diffuse sunlight.

Each concavo-convex part preferably has a peripheral shape of at least one polygon selected from a triangle, a quadrangle, and a hexagon.

The concavo-convex parts are preferably tightly disposed with a side of each polygon overlapping one side of an adjacent polygon.

Each concavo-convex part preferably has a cross-sectional shape of a substantially isosceles trapezoid, a substantially isosceles triangle, a semi-sphere, or a parabola.

The light-concentrating film is preferably made of at least one inorganic material selected from the group consisting of quartz, glass, float glass, and optical glass.

Also, the light-concentrating film is preferably made of an organic material with a refractive index of 1.30 to 1.65.

The light-concentrating film is also preferably made of at least one fluororesin selected from the group consisting of polychlorotrifluoroethylene, an ethylene/tetrafluoroethylene copolymer, an ethylene/chlorotrifluoroethylene copolymer, a chlorotrifluoroethylene/tetrafluoroethylene copolymer, a tetrafluoroethylene/hexafluoropropylene copolymer, tetrafluoroethylene/perfluoro(alkyl vinyl ether) copolymer, polyvinylidene fluoride, and a tetrafluoroethylene/hexafluoropropylene/ethylene copolymer.

The light-concentrating film is preferably transmissive.

The present invention also relates to a photovoltaic module including the above light-concentrating film.

The present invention also relates to a photovoltaic module including: a solar battery cell; a sealing material layer with the solar battery cell sealed inside; and the above light-concentrating film formed on either or both sides of the sealing material layer.

The present invention also relates to a photovoltaic module including: a solar battery cell; a sealing material layer with the solar battery cell sealed inside; a translucent layer formed on either or both sides of the sealing material layer; and the above light-concentrating film disposed on the translucent layer.

The present invention also relates to a transfer mold including reverse alternating concavo-convex structure of the concavo-convex structure of the above light-concentrating film, on at least one surface.

The transfer mold of the present invention is preferably made of a thermoplastic resin, a thermosetting resin, or at least one inorganic material selected from the group consisting of nickel, silicon, quartz, and glass.

Advantageous Effects of Invention

The light-concentrating film of the present invention having the above structure can concentrate at least one of direct sunlight and diffuse sunlight with high efficiency. Use of the light-concentrating film for a photovoltaic module increases the light-concentration efficiency and power generation efficiency, and reduces the cost. The transfer mold (die) of the present invention can be used to produce the above light-concentrating film.

DESCRIPTION OF EMBODIMENTS

The present invention is described in detail below.

Figure 1:
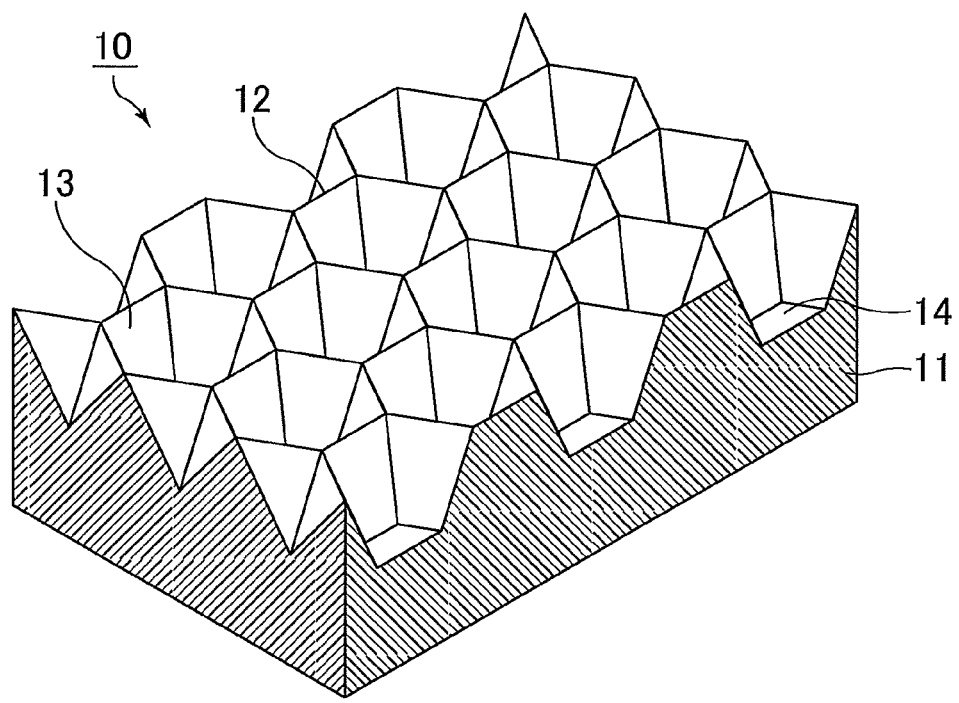
FIG. 1 is a perspective view schematically illustrating an example of the light-concentrating film of the present invention.

FIG. 1 is a perspective view illustrating an example of the structure of a light-concentrating film according to an embodiment of the present invention. The light-concentrating film of the present invention has alternating fine concavo-convex structure on at least one surface as illustrated in FIG. 1. The light-concentrating film of the present invention features a concavo-convex height (H) of 0.05 to 15 µm, and a concavo-convex pitch (P) of 0.05 to 50 µm.

Setting the concavo-convex height (H) and the concavo-convex pitch (P) in the above respective ranges enables concentration of at least one of direct sunlight and diffuse sunlight with high efficiency. If, however, the concavo-convex height (H) and the concavo-convex pitch (P) go outside the respective ranges even just a little, not only the light-concentration efficiency decreases but also the light may be scattered. Here, the direct sunlight is solar light which is not diffused or reflected before striking. The diffuse sunlight is solar light which is diffused by, for example, air and vapor before striking.

For higher light transmittance and higher light-concentration efficiency of the light-concentrating film, the concavo-convex height (H) is preferably at least 0.05 µm, more preferably at least 0.68 µm, still more preferably at least 2.7 µm, and particularly preferably at least 5.4 µm, while it is preferably 50 µm at most, more preferably 25 µm at most, still more preferably 15 µm at most, particularly preferably 10.8 µm at most, and most preferably 9.6 µm at most. Too large a concavo-convex height (H) causes the light-concentrating film to reflect many of the light rays striking the film especially at an angle of at least 850 from the normal direction of the film, which may possibly decrease the light transmittance of the film.

For higher light transmittance and higher light-concentration efficiency of the light-concentrating film, the concavo-convex pitch (P) is preferably at least 0.05 µm, more preferably at least 0.10 µm, still more preferably at least 0.12 µm, and particularly preferably at least 0.14 µm, while it is preferably 50 µm at most, more preferably 36 µm at most, still more preferably 4.50 µm at most, and particularly preferably 2.25 µm at most.

Figure 2:
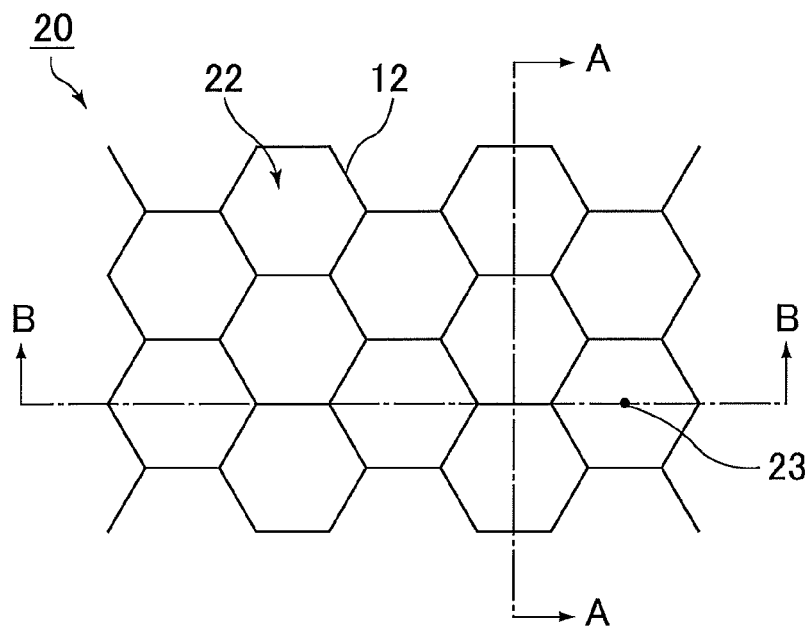
FIG. 2 is a plan view illustrating an example of concavo-convex shape of the light-concentrating film of the present invention.
Figure 3:
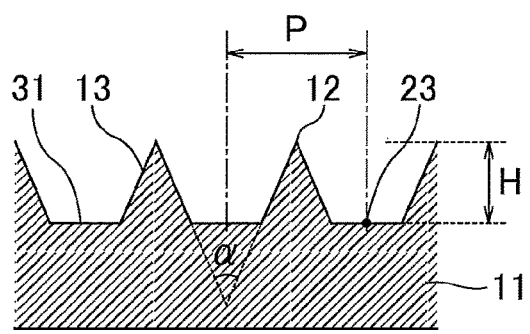
FIG. 3 is a cross-sectional view of an embodiment of the light-concentrating film taken along the A-A line in FIG. 2.

FIG. 2 is a plan view illustrating an example of the concavo-convex shape of the light-concentrating film. Here, concavo-convex parts each are formed by a hexagonal periphery 12 and a non-periphery part 22. The non-periphery part 22 is formed by slopes 13 and a base surface 14 illustrated in FIG. 1. The base surface 14 has a center 23 of the concavo-convex part. FIG. 3 is a cross-sectional view taken along the A-A line in FIG. 2, and illustrates an exemplary cross-section of the alternating concavo-convex structure of the light-concentrating film of the present invention. In the light-concentrating film illustrated in FIG. 3, concavo-convex parts each are formed by a lower base 31, the slopes 13, and the periphery 12. The peripheries form the peaks of the convex parts, and the lower bases 31 correspond to the base surfaces 14 in FIG. 1. As illustrated in FIG. 3, the concavo-convex height (H) of each concavo-convex part is the height from the base surface 14 (lower base 31) to the periphery 12 which form the concavo-convex part, and the concavo-convex pitch (P) is the distance between the centers 23 of adjacent concavo-convex parts. When the height of the periphery is not constant, the concavo-convex height (H) is the height from the base surface 14 (lower base 31) to the highest point of the periphery.

Figure 16:
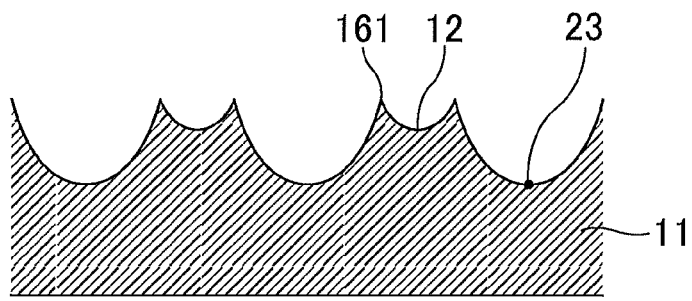
FIG. 16 is a cross-sectional view of an embodiment of the light-concentrating film taken along the B-B line in FIG. 2.

The concavo-convex height (H) and the concavo-convex pitch (P) may each be almost constant or may be variable. For example, as illustrated in FIG. 16, the cross-sectional shape (edge line shape) of the periphery 12 may be a parabola with an intersection 161 of the peripheries of adjacent concavo-convex parts serving as the peak or the lowest point. The concavo-convex pitch (P) is preferably almost constant because the concavo-convex parts can be tightly disposed on the surface of the light-concentrating film, and the light-concentration efficiency can be increased.

Figure 11:
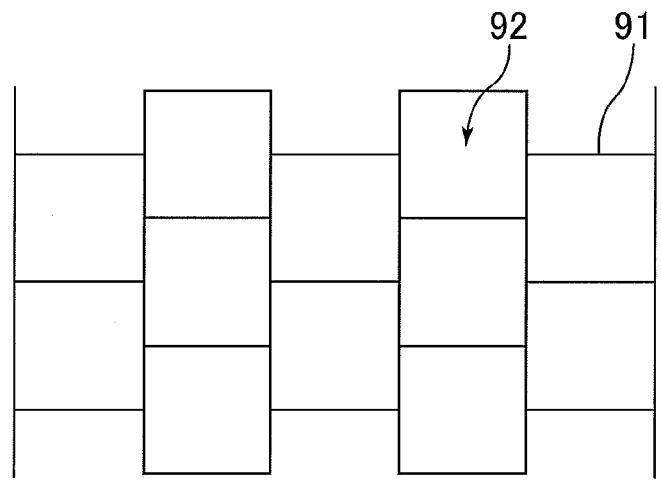
FIG. 11 is a plan view illustrating an example of the concavo-convex shape of the light-concentrating film of the present invention.
Figure 12:
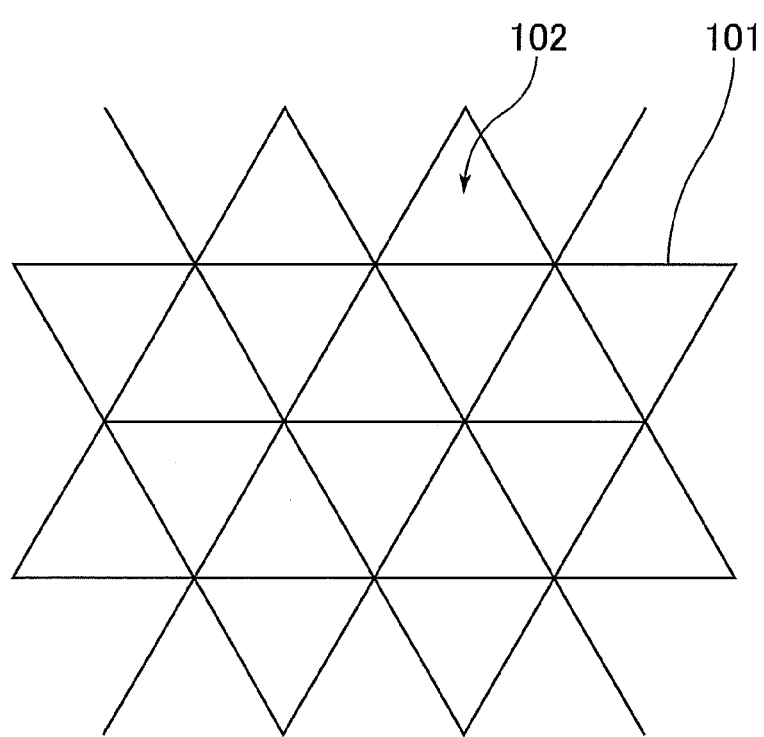
FIG. 12 is a plan view illustrating another example of the concavo-convex shape of the light-concentrating film of the present invention.

In the light-concentrating film of the present invention, the shape of the convex parts or the concave parts forming the peripheries of the respective concavo-convex parts can be at least one polygon selected from a triangle, a quadrangle, and a hexagon. FIG. 2, FIG. 11, and FIG. 12 each are a front view schematically illustrating the surface of the light-concentrating film of the present invention. FIG. 2 illustrates an example in which alternating hexagonal concavo-convex structure is formed on the surface of the light-concentrating film. FIGS. 11 and 12 each illustrate an example in which alternating quadrangular or triangular concavo-convex structure is formed on the surface of the light-concentrating film.

In the light-concentrating film of the present invention, the concavo-convex parts are preferably tightly disposed with a side of each polygon overlapping one side of an adjacent polygon. In FIG. 2, the shape of the peripheries 12 (boundary lines) formed by the convex parts or the concave parts is a right hexagonal shape, and the convex parts or the concave parts are tightly disposed with a side of each right hexagon overlapping one side of an adjacent right hexagon. When triangular, quadrangular, or hexagonal concavo-convex parts are disposed to form a honeycomb shape on the light-concentrating film, the area of the peripheries of the concavo-convex parts can be reduced, so that high light-concentration efficiency can be achieved.

The shape of the convex parts or concave parts forming the periphery of the concavo-convex parts is preferably at least one polygon selected from a right triangle, a square, and a right hexagon to give excellent concentration properties throughout a day to the light-concentrating film.

Figure 4:
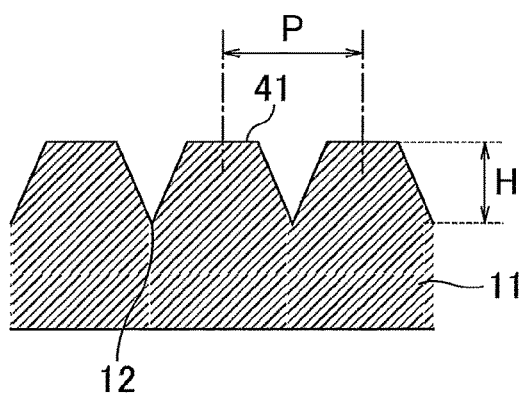
FIG. 4 is a cross-sectional view of an embodiment of the light-concentrating film taken along the A-A line in FIG. 2.
Figure 5:
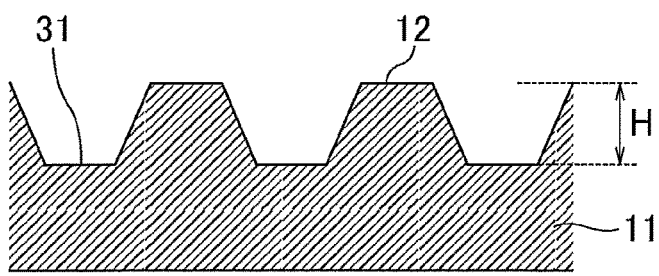
FIG. 5 is a cross-sectional view of an embodiment of the light-concentrating film taken along the B-B line in FIG. 2.
Figure 6:
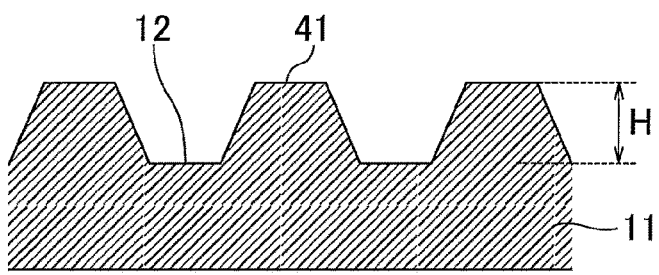
FIG. 6 is a cross-sectional view of an embodiment of the light-concentrating film taken along the B-B line in FIG. 2.

The cross-sectional shape of the concave parts or the convex parts forming the concavo-convex parts may be a substantially isosceles trapezoid, a substantially isosceles triangle, a semi-sphere, or a parabola. Among these, a semi-sphere and a parabola are preferred for high light-concentration efficiency. The substantially isosceles trapezoid, the substantially isosceles triangle, the semi-sphere, or the parabola may constitute a concave part or a convex part if they respectively are a substantially isosceles trapezoid, a substantially isosceles triangle, a semi-sphere, or a parabola in a cross-section parallel to the normal direction to the film surface. Stated differently, the alternating concavo-convex structure may be vertically positive/negative inverted; for example, the peripheries of the concavo-convex parts may be by concave parts as illustrated in FIGS. 3, 5, and 7 to 10, or may be convex parts as illustrated in FIGS. 4 and 6. The slopes constituting the concavo-convex parts preferably have the least unevenness. The slopes constituting the concavo-convex parts are more preferably not stairs, and are still more preferably smooth.

FIG. 3 is a cross-sectional view taken along the A-A line in FIG. 2. FIG. 5 is a cross-sectional view taken along the B-B line in FIG. 2. In the light-concentrating films illustrated in FIGS. 3 and 5, the peripheries 12 of the concavo-convex parts are formed by convex parts, and the shape of the concave parts is a substantially isosceles trapezoid narrowing towards the film. Each concave part is formed by the two slopes 13 and the lower base 31. The lower base 31 corresponds to the flat surface 14 illustrated in FIG. 1. The angle α formed by two slopes of the isosceles trapezoid is preferably 1 to 179°, and more preferably 1 to 125°.

FIG. 4 is a cross-sectional view of another embodiment taken along the A-A line in FIG. 2. FIG. 6 is a cross-sectional view taken along the B-B line in FIG. 2. As illustrated in FIG. 4 and FIG. 6, the peripheries 12 of the concavo-convex parts may be the concave parts and isosceles trapezoids may be formed to be projected from the film. In this case, narrow upper bases 41 constitute flat tops of the convex parts.

Especially when the cross-sectional shape of the concavo-convex parts is a substantially isosceles trapezoid, the concavo-convex height (H) is preferably 0.05 to 15 μm, and the concavo-convex pitch (P) is preferably 0.05 to 50 μm.

Figure 7:
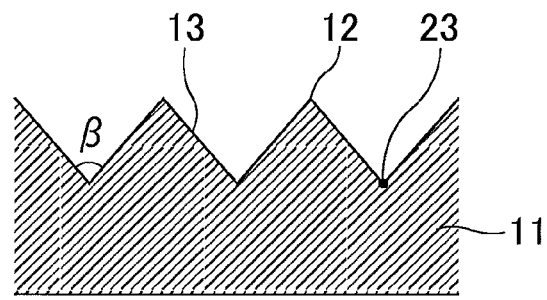
FIG. 7 is a cross-sectional view of an embodiment of the light-concentrating film taken along the A-A line in FIG. 2.
Figure 8:
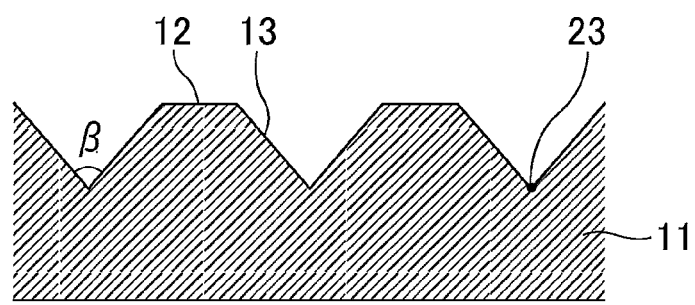
FIG. 8 is a cross-sectional view of an embodiment of the light-concentrating film taken along the B-B line in FIG. 2.

FIG. 7 is a cross-sectional view taken along the A-A line in FIG. 2. FIG. 8 is a cross-sectional view taken along the B-B line in FIG. 2. These figures each illustrate an embodiment in which the cross-sectional shape is an isosceles triangle. In FIG. 7, the peripheries of the concavo-convex parts are convex parts with the peak of each isosceles triangle being on the film side. The peripheries of the concavo-convex parts may be concave parts to form isosceles triangles projecting from the film (not illustrated). In this case, the peaks of the isosceles triangles constitute the tops of the convex parts. The apex angle β of the isosceles triangles is preferably 1 to 179°, and more preferably 1 to 125°.

Especially when the cross-sectional shape of the concavo-convex parts is an isosceles triangle, the concavo-convex height (H) is preferably at least 0.05 μm, more preferably at least 0.68 μm, and still more preferably at least 2.7 μm, while it is preferably 25 μm at most, more preferably 15 μm at most, and still more preferably 10.8 μm at most. The concavo-convex pitch (P) is preferably at least 0.05 μm, more preferably at least 0.10 μm, and still more preferably at least 0.14 μm, while it is preferably 50 μm at most, more preferably 36 μm at most, and still more preferably 4.50 μm at most.

The shape of the isosceles trapezoid and the isosceles triangle may be beveled with the slopes 13 being either straight or curved.

Figure 9:
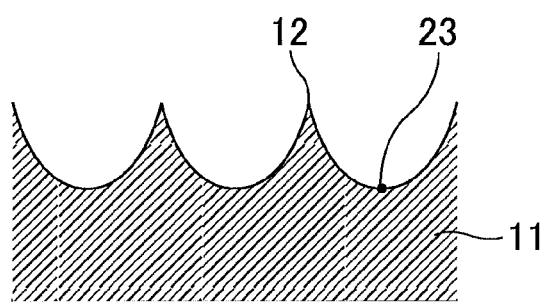
FIG. 9 is a cross-sectional view of an embodiment of the light-concentrating film taken along the A-A line in FIG. 2.
Figure 10:
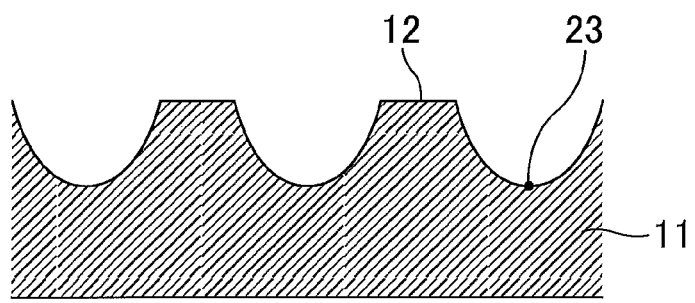
FIG. 10 is a cross-sectional view of an embodiment of the light-concentrating film taken along the B-B line in FIG. 2.

FIG. 9 is a cross-sectional view taken along the A-A line in FIG. 2. FIGS. 10 and 16 are cross-sectional views taken along the B-B line illustrated in FIG. 2. These figures each illustrate an embodiment in which the cross-sectional shape is a parabola (bowl shape). The cross-sectional shape may be a semi-sphere. In FIG. 9, the peripheries 12 of the concavo-convex parts are convex parts with the tops 23 of the parabolas being on the film side. The peripheries of the concavo-convex parts may be concave parts to form dome-like parabolas projecting from the film (not illustrated). In this case, the tops of the parabolas constitute the tops of the convex parts.

Especially when the cross-sectional shape of the concavo-convex parts is a semi-sphere or a parabola, the concavo-convex height (H) is preferably at least 0.05 µm, more preferably at least 0.68 µm, and still more preferably at least 2.7 µm, while it is preferably 25 µm at most, more preferably 15 µm at most, and still more preferably 10.8 µm at most. The concavo-convex pitch (P) is preferably at least 0.05 µm, more preferably at least 0.10 µm, and still more preferably at least 0.14 µm, while it is preferably 50 µm at most, more preferably 36 µm at most, and still more preferably 4.50 µm at most.

The light-concentrating film of the present invention may have alternating fine concavo-convex structure on one surface, with the other surface being smooth. The film may have alternating fine concavo-convex structure on both surfaces. Here, the light may be irradiated to either surface. Also, the concavo-convex shapes may give an aesthetic quality to the light-concentrating film.

The light-concentrating film of the present invention is preferably a transmissive light-concentrating film. The "transmissive light-concentrating film" refers to a light-concentrating film that, upon reception of light on one surface, emits the light from the surface opposite to the surface that received the light.

The light-concentrating film preferably has a light transmittance of at least 81%, more preferably at least 89%, and still more preferably at least 94%, for light with a wavelength of 600 nm which strikes the film at an angle of at least 800 from the normal direction to the film. Increasing the light transmittance of the organic material forming the light-concentrating film can also increase the light-concentration efficiency. Also, increasing the light transmittance can suppress deterioration because of factors (e.g. accumulated heat) to enable long-term usage, so that the film can be particularly suitable for applications such as solar cells. The light transmittance can be measured by a method using a variable angle ultraviolet-visible spectrophotometer (product of Otsuka Electronics Co., Ltd.).

Here, an angle of 0° from the normal direction is the angle of the vertical axis, and an angle of 85° from the normal direction is an angle of 5° from the horizontal axis.

The light transmittance can be a value determined by averaging the values measured at every 5° in the range of 0 to 85° by the number of measured values.

The material for forming the light-concentrating film of the present invention may be either an inorganic material or an organic material.

The light-concentrating film of the present invention is preferably made of at least one inorganic material selected from the group consisting of quartz, glass, float glass, and optical glass because they have high durability and long-term stability.

The light-concentrating film of the present invention is also preferably made of an organic material because it also has high durability and long-term stability.

The organic material preferably has a refractive index of 1.30 to 1.65 at a wavelength of 350 to 800 nm. The upper limit of the refractive index is more preferably 1.60, still more preferably 1.55, and particularly preferably 1.45. The refractive index can be measured by a method using the Abbe refractometer (Digital thermometer 2T, product of Atago Co., Ltd.). The measurement was performed at 25° C. using a sodium D line with a wavelength of 589 nm as the light source. The optimal refractive index in light-concentrating film applications is, for example, preferably 1.34, 1.38, or 1.40, and more preferably 1.42.

Preferred examples of the organic material include, but are not particularly limited to, thermoplastic resins. The organic material is, for example, preferably at least one compound selected from the group consisting of polymethyl methacrylate (PMMA), polycarbonate (PC), polyethylene naphthalate (PEN), polyethylene terephthalate (PET), triacetyl cellulose (TAC), polyethersulfone (PES), and fluororesins. These thermoplastic resins are also weather-resistant organic materials.

In addition to the thermoplastic resins, polymer materials (e.g. curable resins described later as coating layers over the resins), and organic/inorganic nanocomposite materials for use as materials such as sol/gel materials, for example, are usable.

Also, the organic material is preferably a fluororesin. Up until now, polymethylmethacrylate (PMMA) materials have been used for plastic optical components. PMMA materials are mixed with additives such as plasticizers and thermal oxidation inhibitor in molding, and thus PMMA materials, when used in focusing elements for solar cells, cause problems such as yellowing (increase in the ΔYI value) to be practically unusable.

Fluororesins have excellent properties such as weather resistance, heat resistance, water vapor permeation resistance, and transparency which prevent deterioration of the materials caused by, for example, sunlight, so that the light-concentrating film has long-term durability. Fluororesins also have excellent light transmittance.

The fluororesin may be any melt-processable fluororesin, but is preferably a homopolymer or copolymer having a repeating unit derived from at least one fluorinated ethylenic monomer.

The fluororesin may be obtained by polymerizing fluorinated ethylenic monomers only, or by polymerizing fluorinated ethylenic monomers and ethylenic monomers without a fluorine atom.

The fluororesin preferably has a repeating unit derived from at least one fluorinated ethylenic monomer selected from the group consisting of vinyl fluoride [VF], tetrafluoroethylene [TFE], vinylidene fluoride [VdF], chlorotrifluoroethylene [CTFE], vinyl fluoride, hexafluoropropylene [HFP], hexafluoroisobutene, a monomer represented by $CH_2=CZ^1(CF_2)_nZ^2$ (where $Z^1$ is H or F, $Z^2$ is H, F, or Cl, and n is an integer of 1 to 10), perfluoro(alkyl vinyl ether) [PAVE] represented by $CF_2=CF-ORf^1$ (where $Rf^1$ represents a $C_{1-8}$ perfluoroalkyl group), and an alkyl perfluorovinyl ether derivative represented by $CF_2=CF-O-CH_2-Rf^2$ (where $Rf^2$ is a $C_{1-5}$ perfluoroalkyl group).

Examples of the PAVE include perfluoro(methyl vinyl ether) [PMVE], perfluoro(ethyl vinyl ether) [PEVE], perfluoro(propyl vinyl ether) [PPVE], and perfluoro(butyl vinyl ether). Among these, PMVE, PEVE, and PPVE are more preferred.

The alkyl perfluoro vinyl ether derivative is preferably one where $Rf^2$ is a $C_{1-3}$ perfluoroalkyl group, and more preferably one represented by $CF_2=CF-O-CH_2-CF_2CF_3$.

The fluororesin may have a repeating unit derived from an ethylenic monomer without a fluorine atom. In terms of maintaining properties such as heat resistance and chemical resistance, the fluororesin with a repeating unit derived from a $C_5$ or lower ethylenic monomer is also preferred. The fluororesin is also preferred to have at least one non-fluorinated ethylenic monomer selected from the group consisting of ethylene, propylene, 1-butene, 2-butene, vinyl chloride, vinylidene chloride, and an unsaturated carboxylic acid.

The unsaturated carboxylic acid preferably has at least one copolymerizable carbon-carbon unsaturated bond per molecule, and has at least one carbonyloxy group [—C(=O)—O—] per molecule. The unsaturated carboxylic acid may be an aliphatic unsaturated monocarboxylic acid or aliphatic unsaturated polycarboxylic acid having at least two carboxyl groups, such as the unsaturated carboxylic acids mentioned in WO 2005/100420 A1.

The aliphatic unsaturated carboxylic acid is preferably at least one selected from the group consisting of (meth)acrylic acid, crotonic acid, maleic acid, maleic anhydride, fumaric acid, itaconic acid, itaconic anhydride, citraconic acid, citraconic anhydride, mesaconic acid, and aconitic acid.

The fluororesin is preferably at least one selected from the group consisting of polychlorotrifluoroethylene [PCTFE], ethylene [Et]/TFE copolymer [ETFE], Et/CTFE copolymer, CTFE/TFE copolymer, TFE/HFP copolymer [FEP], TFE/PAVE copolymer [PFA], polyvinylidene fluoride [PVdF], and TFE/HFP/ethylene copolymer [EFEP], and more preferably at least one fluororesin selected from the group consisting of PCTFE, ETFE, EFEP, CTFE/TFE copolymer, FEP, PFA, and PVdF.

The chlorotrifluoroethylene [CTFE]/tetrafluoroethylene [TFE] copolymer preferably has a molar ratio of CTFE units to TFE units of CTFE:TFE=2:98 to 98:2, more preferably 5:95 to 90:10, and still more preferably 20:80 to 90:10. Too small a number of the CTFE units tends to make the melt-processing difficult, while too large a number of the CTFE units may deteriorate the heat resistance and chemical resistance in molding.

The CTFE/TFE copolymer is preferably a copolymer of CTFE, TFE, and a monomer copolymerizable with CTFE and TFE. Examples of the monomer copolymerizable with CTFE and TFE include ethylene, VdF, HFP, a monomer represented by $CH_2$=$CZ^1(CF_2)_nZ^2$ (where $Z^1$ is H or F, $Z^2$ is H, F, or Cl, and n is an integer of 1 to 10), a perfluoro(alkyl vinyl ether) [PAVE] represented by $CF_2$=$CF$—$ORf^1$ (where $Rf^1$ represents a $C_{1-8}$ perfluoroalkyl group), and an alkyl perfluorovinyl ether derivative represented by $CF_2$=$CF$—$O$—$CH_2$—$Rf^5$ (where $Rf^5$ represents a $C_{1-5}$ perfluoroalkyl group). Among these, at least one selected from the group consisting of ethylene, VdF, HFP, and PAVE is preferred, and PAVE is more preferred.

Examples of the PAVE include perfluoro(methyl vinyl ether) [PMVE], perfluoro(ethyl vinyl ether) [PEVE], perfluoro(propyl vinyl ether) [PPVE], and perfluoro(butyl vinyl ether). Among these, PMVE, PEVE, and PPVE are more preferred.

The alkyl perfluoro vinyl ether derivative is preferably one where $Rf^5$ is a $C_{1-3}$ perfluoroalkyl group, and more preferably one represented by $CF_2$=$CF$—$O$—$CH_2$—$CF_2CF_3$.

The CTFE/TFE copolymer preferably has 0.1 to 10 mol % of a monomer unit derived from a monomer copolymerizable with CTFE and TFE, and 90 to 99.9 mol % in total of the CTFE unit and the TFE unit. Too small an amount of the copolymerizable monomer unit is likely to deteriorate the moldability, environmental-stress-cracking resistance, and stress cracking resistance, while too large an amount tends to deteriorate the properties such as the heat resistance, mechanical properties, and productivity. The lower limit of the monomer unit derived from a monomer copolymerizable with CTFE and TFE is more preferably 0.5 mol %, and the upper limit thereof is more preferably 5 mol %.

The FEP is preferred because it can give particularly excellent heat resistance. FEP is not particularly limited, but is preferably a copolymer with 70 to 99 mol % of the TFE unit and 1 to 30 mol % of the HFP unit, and more preferably a copolymer with 80 to 97 mol % of the TFE unit and 3 to 20 mol % of the HFP unit. An amount of the TFE unit of less than 70 mol % tends to decrease the mechanical properties, while an amount of more than 99 mol % tends to increase the melting point very high to decrease the moldability.

The FEP may be a copolymer of TFE, HFP and a monomer copolymerizable with TFE and HFP where the monomer may be one of the monomers mentioned as examples of the monomer copolymerizable with CTFE and TFE. Examples of the monomer include perfluoro(alkyl vinyl ether) [PAVE] represented by $CF_2$=$CF$—$ORf6$ (where $Rf6$ represents a $C_{1-5}$ perfluoroalkyl group), a vinyl monomer represented by $CZ^3Z^4$=$CZ^5(CF_2)_nZ^6$ (where $Z^3$, $Z^4$, and $Z^5$ are the same as or different from one another, each representing a hydrogen atom or a fluorine atom, $Z^6$ represents a hydrogen atom, a fluorine atom, or a chlorine atom, and n represents an integer of 2 to 10), and an alkyl perfluoro vinyl ether derivative represented by $CF_2$=$CF$—$OCH_2$—$Rf^7$ (where $Rf^7$ represents a $C_{1-5}$ perfluoroalkyl group). Among these, PAVE is preferred. Examples of the PAVE and the alkyl perfluoro vinyl ether derivative are the same as those mentioned as examples of the monomer copolymerizable with CTFE and TFE.

The FEP preferably has 0.1 to 10 mol % of the monomer unit derived from a monomer copolymerizable with TFE and HFP, and 90 to 99.9 mol % in total of the TFE unit and the HFP unit. An amount of the copolymerizable monomer unit of less than 0.1 mol % tends to deteriorate the moldability, environmental-stress-cracking resistance, and stress cracking resistance, while an amount of more than 10 mol % tends to deteriorate the heat resistance, mechanical properties, and productivity.

The PFA is preferred because it can give particularly excellent heat resistance. PFA is not particularly limited, but is preferably a copolymer with 70 to 99 mol % of the TFE unit and 1 to 30 mol % of the PAVE unit, and more preferably a copolymer with 80 to 98.5 mol % of the TFE unit and 1.5 to 20 mol % of the PAVE unit. An amount of the TFE unit of less than 70 mol % tends to decrease the mechanical properties, while an amount of more than 99 mol % tends to increase the melting point very high to decrease the moldability.

Examples of the PAVE include those mentioned above. Among these, at least one selected from the group consisting of PMVE, PEVE, and PPVE is more preferred, and PMVE is still more preferred.

The PFA may be a copolymer of TFE, PAVE, and a monomer copolymerizable with TFE and PAVE, and the monomer may be any of the monomers mentioned as examples of the monomer copolymerizable with CTFE and TFE. Examples of the monomer include a vinyl monomer represented by $CZ^3Z^4$=$CZ^5(CF_2)_nZ^6$ (where $Z^3$, $Z^4$ and $Z^5$ are the same as or different from one another, each representing a hydrogen atom or a fluorine atom, $Z^6$ represents a hydrogen atom, a fluorine atom, or a chlorine atom, and n represents an integer of 2 to 10), and an alkyl perfluoro vinyl ether derivative represented by $CF_2$=$CF$—$OCH_2$—$Rf^7$ (where $Rf^7$ represents a $C_{1-5}$ perfluoroalkyl group).

Examples of the alkyl perfluoro vinyl ether derivative are the same as those mentioned as examples of the monomer copolymerizable with CTFE and TFE.

The PFA preferably has 0.1 to 10 mol % of the monomer unit derived from a monomer copolymerizable with TFE and PAVE, and 90 to 99.9 mol % in total of the TFE unit and the PAVE unit. An amount of the copolymerizable monomer unit of less than 0.1 mol % tends to deteriorate the moldability, environmental-stress-cracking resistance, and stress cracking resistance, while an amount of more than 10 mol % tends to deteriorate the heat resistance, mechanical properties, and productivity.

The ETFE is preferred because it improves the mechanical properties. The molar ratio of the TFE unit and the ethylene unit is preferably 20:80 to 90:10, more preferably 37:63 to 85:15, and still more preferably 38:62 to 80:20.

The ETFE may be a copolymer of TFE, ethylene, and a monomer copolymerizable with TFE and ethylene. Examples of the copolymerizable monomer include monomers represented by the following formulas $CH_2=CZ^7R_f^3$, $CF_2=CFRf^3$, $CF_2=CFORf^3$, and $CH_2=C(R_f3)_2$ (where $Z^7$ represents a hydrogen atom or a fluorine atom, and $R_f3$ represents a fluoroalkyl group which may contain an ether-linkable oxygen atom other than HFP). Among these, fluorinated vinyl monomers represented by $CF_2=CFR_f3$, $CF_2=CFOR_f^3$ and $CH_2=CZ^7R_f3$ are preferred, and a perfluoro(alkyl vinyl ether) [PAVE] represented by $CF_2=CF-OR_f4$ (where $R_f4$ represents a $C_{1-5}$ perfluoroalkyl group), and a fluorinated vinyl monomer represented by $CH_2=CZ^7R_f^3$ where $R_f3$ is a $C_{1-5}$ fluoroalkyl group are more preferred.

Specific examples of the fluorine-containing vinyl monomer represented by the above formula include 1,1-dihydroperfluoropropene-1,1,1-dihydroperfluorobutene-1; 1,1,5-trihydroperfluoropentene-1,1,1,7-trihydroperfluoroheptene-1; 1,1,2-trihydroperfluorohexene-1; 1,1,2-trihydroperfluorooctene-1; 2,2,3,3,4,4,5,5-octafluoropentyl vinyl ether; perfluoro(methyl vinyl ether); perfluoro(propylvinyl ether); perfluoro butene-1,3,3,3-trifluoro-2-(trifluoromethyl)propene-1; 2,3,3,4,4,5,5-heptafluoro-1-pentene ($CH_2=CFCF_2CF_2CF_2H$).

The monomer copolymerizable with TFE and ethylene may be any of the above-mentioned aliphatic unsaturated carboxylic acids such as itaconic acid and itaconic anhydride.

The monomer copolymerizable with TFE and ethylene is preferably used in an amount of 0.1 to 10 mol %, more preferably 0.1 to 5 mol %, and particularly preferably 0.2 to 4 mol %, relative to the amount of the fluorinated polymer.

The EFEP preferably has a molar ratio of the TFE unit to the ethylene unit of 20:80 to 90:10, more preferably 37:63 to 85:15, and still more preferably 38:62 to 80:20. The hexafluoropropylene is preferably used in an amount of 0.1 to 10 mol %, more preferably 0.1 to 5 mol %, and particularly preferably 0.2 to 4 mol %, relative to the amount of the fluorinated polymer.

The fluororesin is still more preferably at least one fluororesin selected from the group consisting of ETFE, EFEP, PCTFE, FEP, PFA, and PVdF. PMMA having been used as a concentrating material has a total light transmittance of 90% at most, and shows a large amount of light absorption particularly on the lower wavelength side. The ETFE, EFEP, PCTFE, FEP, PFA, and PVdF are materials with high light transmittance and a high thin-film property as well, and therefore can suppress absorption and reflection of light to increase the light-concentration efficiency.

In one preferred embodiment, the fluororesin is a perhalo polymer. Use of a perhalo polymer results in excellent properties such as chemical resistance. The perhalo polymer is a polymer in which every carbon atom constituting the main chain of the polymer is bonded to a halogen atom. The perhalo polymer is preferably at least one selected from the group consisting of the above CTFE/TFE copolymer, FEP, and PFA.

The amount of each monomer constituting the copolymer can be calculated by appropriately combining NMR, FT-IR, elementary analysis, and X-ray fluorescence analysis depending on the monomer species.

The fluororesin in the present invention is not particularly limited, but is preferably one having a melting point of 160 to 270° C. The molecular weight of the fluororesin is preferably in the range that enables the light-concentrating film to express the desired properties such as mechanical properties. For example, if a melt flow rate [MFR] is taken as an index of the molecular weight, the fluororesin preferably has an MFR of 0.5 to 100 g/10 min at any temperature in the range of about 230 to 350° C. which is a molding temperature range for fluororesins in general. The melting point of each resin used herein is a temperature corresponding to the maximum value in a heat of fusion curve determined by increasing the temperature of the resin at a rate of 10° C./min using a DSC device (product of SEIKO Co.). The MFR is determined by measuring the weight (g) of the polymer flowing out of a nozzle (diameter: 2 mm, length: 8 mm) per unit time (10 min) at each temperature under a load of 5 kg using a melt indexer (product of Toyo Seiki Seisaku-Sho Ltd.).

The fluororesin can be obtained by a known polymerization method such as suspension polymerization, solution polymerization, emulsion polymerization, and block polymerization. In the polymerization, the conditions such as temperature and pressure, the polymerization initiator, and other additives used can be appropriately set depending on the desired composition and amount of the fluororesin.

(Examples of Organic Material)

Hereinafter, organic materials usable for the light-concentrating film of the present invention are described in more detail. The organic material may be a resin such as the thermoplastic resins as described above, or may be, for example, a polymer material (e.g. curable resin) as a coating layer onto the resins, or an organic/inorganic nanocomposite material for use as, for example, a sol/gel material.

The curable resin used as a coating layer onto resins including thermoplastic resins is preferably used as a coating onto a base material, or as a coating material for forming a coating layer by itself. That is, the curable resin, when used as a coating material, may be applied to a base material, cured, and peeled off the base material to be used as a film; if possible, the cured resin may be processed into a light-concentrating film without being peeled off the base material.

Hereinafter, the organic material is described.

(Weather Resistant Organic Material)

The organic material constituting the light-concentrating film of the present invention is not particularly limited, but is preferably a weather resistant organic material. Examples of the weather resistant organic material, other than the resins such as the thermoplastic resins described above, include polymer materials such as curable resins used as coating layers onto the resins. The weather resistant organic material is preferably an organic material containing a fluororesin. Examples of the organic material containing a fluororesin include the above organic materials containing a fluororesin. Preferred are, for example, an organic material containing a thermoplastic fluororesin; an organic material containing at least one compound selected from the group consisting of (I) a fluoroolefin copolymer with a hydroxy group and/or a carboxyl group, (V) a fluorosilicone resin, (VI) a homopolymer or copolymer of fluorinated vinylidene without a functional group, and (VII) a fluororesin without a functional group; and at least one organic material selected from the group consisting of (VIII) the following curable resin compositions and (IX) the following curable resin compositions.

The thermoplastic fluororesin is preferred in terms of the hydrolysis resistance. The organic material or the curable resin composition containing the compound (I), (V), (VI), (VII), (VIII), or (IX) is preferred in terms of the light resistance. The weather resistant organic material is preferably soluble in a solvent.

Examples of the weather resistant organic material, other than the organic materials containing the above compounds, include organic materials containing a resin such as (II) acrylic lacquer resins, (III) acrylic polyol resins, and (IV) acrylic silicone resins. Regarding the actual usage so far, the weather resistant organic material is also preferably an organic material containing at least one compound selected from the group consisting of (I) fluoroolefin copolymers having a hydroxy group and/or a carboxyl group, and (III) acrylic polyol resins.

Examples of the fluoroolefin copolymers (I) having a hydroxy group and/or a carboxyl group include those described in documents such as JP S60-21686 B, JP H3-121107 A, JP H4-279612 A, JP H4-28707 A, and JP H2-232221A. The number-average molecular weight (determined by GPC) of the copolymers is 1000 to 100000, and preferably 1500 to 30000. Here, a molecular weight of less than 1000 tends to result in insufficient curability and weather resistance, while a molecular weight of more than 100000 tends to cause problems in workability and coatability.

The hydroxy value of the fluoroolefin copolymers having a hydroxy group and/or a carboxyl group is 0 to 200 (mgKOH/g), and is preferably 0 to 150 (mgKOH/g). Here, a small hydroxy value is likely to cause insufficient curing, while a hydroxy value of more than 200 (mgKOH/g) tends to cause problems in flexibility.

The acid value of the fluoroolefin copolymers having a hydroxy group and/or a carboxyl group is 0 to 200 (mgKOH/g), and is preferably 0 to 100 (mgKOH/g). Here, a larger acid value tends to cause problems in flexibility.

The examples of the fluoroolefin copolymers having a hydroxy group and/or a carboxyl group also include a tetrafluoroethylene copolymer in terms of the contamination adhesion resistance, the decontaminability, and the rust resistance.

Examples of the fluoroolefin copolymers having a hydroxy group and/or a carboxyl group include commercially available products such as ZEFFLE (registered trademark) produced by Daikin Industries, Ltd., LUMIFLON (registered trademark) produced by ASAHI GLASS Co., Ltd., CEFRAL COAT (registered trademark) produced by CENTRAL GLASS Co., Ltd., FLUONATE (registered trademark) produced by Dainippon Ink and Chemicals, and ZAFLON (registered trademark) produced by TOAGOSEI Co., Ltd.

Examples of the acrylic polyol resins (III) include polymers of (a) hydroxy group-containing ethylenically unsaturated monomers such as hydroxy group-containing (meth) acrylic acid ester, hydroxy vinyl ether, and allyl alcohol, and (b) hydroxy group-free unsaturated monomers such as olefins without a hydroxy group, vinyl ether, allyl ether, vinyl ester, propenyl ester, (meth)acrylic acid ester, vinyl aromatic compound, (meth)acrylonitrile, carboxyl group-containing unsaturated monomers, epoxy group-containing unsaturated monomers, and amino group-containing unsaturated monomers. The acrylic polyol resin may have at least one group selected from the group consisting of a hydroxy group, a carboxyl group, an epoxy group, and an amino group.

The hydroxy value of the acrylic polyol resin (III) is 0 to 200 (mgKOH/g), and preferably 0 to 100 (mgKOH/g). A larger hydroxy value tends to cause problems in flexibility.

The acid value of the acrylic polyol resin (III) is 0 to 200 (mgKOH/g), and preferably 0 to 100 (mgKOH/g). A larger acid value tends to cause problems in flexibility.

Examples of the acrylic lacquer resins (II) include resins that are obtained from monomers (raw materials) used for acrylic polyol resins and that have a hydroxy value of zero and an acid value of 0 to 10.

For the acrylic polyol resin (III) or the acrylic lacquer resin (II), usable materials are, for example, commercially available products such as DYANAL (registered trademark) produced by MITSUBISHI RAYON CO., Ltd., ACRYDICK (registered trademark) produced by Dainippon Ink and Chemicals, HITALOID (registered trademark) produced by Hitachi Chemical Co., Ltd., and OLESTER (registered trademark) produced by Mitsui Toatsu Chemicals Inc.

Examples of the acrylic silicone resin (IV) include a copolymer of an acrylic silicone monomer having at least one silane group and a radical polymerizable unsaturated group per molecule with the hydroxy group-containing ethylenically unsaturated monomers (a) and/or the hydroxy group-free unsaturated monomers (b). The acrylic silicone resin (IV) may have a hydrolyzable silyl group, a hydroxy group, and an epoxy group.

The acrylic silicone resins (IV) are, for example, commercially available products such as Zemlac (registered trademark) produced by KANEKA CORPORATION and Clearmer (registered trademark) produced by Sanyo Chemical Industries, Ltd.

Addition of an organometallic compound having a hydrolyzable leaving group, an oligomer thereof and/or a cooligomer of at least two of the organometallic compounds to the weather resistant organic material allows the material to be used as a surface-hydrophilized resin.

The organometallic compound is preferably an organometallic compound represented by the following formula (1):

$$Z^8{}_e M(OR^{22})_d R^{23}{}_f \qquad (1)$$

wherein d represents an integer of 0 or 1 to 6, e represents an integer of 0 or 1 to 5, f represents an integer of 0 or 1 to 6 (here, d+e+f≥3, and d and f do not represent 0 at the same time); $Z^8$s may be the same as or different from one another, each representing a hydrogen atom or a monovalent organic group optionally containing at least one of an oxygen atom, a nitrogen atom, a fluorine atom and chlorine atom; M is an at least trivalent metallic atom; $R^{22}$s may be the same as or different from one another, each representing a siloxane residue, a hydrogen atom, or a $C_{1-1000}$ monovalent organic atom optionally containing at least one of an oxygen atom, a nitrogen atom, a fluorine atom, and a chlorine atom; and $R^{23}$s may be the same as or different from one another, each representing a $C_{1-20}$ organic group having a chelating ability and optionally containing at least one of an oxygen atom, a nitrogen atom, a fluorine atom, and a chlorine atom. Particularly, a fluorinated organometallic compound with at least one of $R^{22}$ and $R^{23}$ being a fluorine-containing group is preferred.

The organometallic compound is preferably a compound represented by the above formula (1). These organometallic compounds, oligomers thereof, and cooligomers of at least two species thereof are described in WO 97/11130 A. However, organometallic compounds represented by the following formula (2) excluded in the document,

[Chem. 1]

(2)

(wherein n is an integer of 1 to 20, $R^{15}$s all may be different from one another or at least two of $R^{15}$s are the same, each representing a $C_{1-1000}$ monovalent organic group, and optionally containing at least one of an oxygen atom, a nitrogen atom, and a silicon atom, and part or all of the hydrogen atoms in the organic group may be replaced by a fluorine atom or by a fluorine atom and a chlorine atom) are also usable in the present invention.

The organometallic compounds hydrophilize the surface of the coating film; depending on the objective functions and the intended use, more preferred substituents or molecular weights may be selected for use.

In the following, a preferred embodiment of the organometallic compounds represented by formula (1) in the present invention is described.

In formula (1), d is an integer of 0 or 1 to 6, and preferably an integer of 2 to 4 in terms of the surface concentratability, the hydrolyzability, and the leaving ability.

In formula (1), e is an integer of 0 or 1 to 5, and preferably an integer of 0 or 1 in terms of the surface concentratability and the hydrophilicity.

In formula (1), f is an integer of 0 or 1 to 6, and preferably an integer of 0 to 3 in terms of the surface concentratability, the hydrolyzability, and the leaving ability.

Here, the total amount of d, e, and f depends on the valence of the metallic atom M. Still, in formula (1), since either one of $OR^{22}$ and $R^{23}$ is necessary for the contamination adhesion resistance, the surface concentratability, and the hydrolyzability, d and f do not represent 0 at the same time, and the total amount of d, e, and f is at least 3.

In formula (1), $Z^8$ may be a hydrogen atom, and is preferably a $C_{1-5000}$ monovalent organic group optionally containing at least one of an oxygen atom, a nitrogen atom, a fluorine atom, and a chlorine atom, as mentioned under the following items (1) to (3).

(1) Examples of the organic group $Z^8$ include $H(CH_2)_p$, $(CH_3)_2CH$, $H(CH_2)_pC=O$, $F(CF_2)_q(CH_2)_p$, $(CF_3)_2CH$, $H(CF_2)_q(CH_2)_p$ (where p is an integer of 0 or 1 to 6, q is an integer of 1 to 10, and part of fluorine atoms may be substituted with a chlorine atom). The organic groups may be linear or branched.

Specific examples thereof include $CH_3$, $CH_3CH_2$, $CH_3CH_2CH_2$, $(CH_3)_2CH$, $CF_3CH_2$, $CF_3CF_2CH_2$, $(CF_3)_2CH$, $F(CF_2)_4CH_2CH_2$, $F(CF_2)_8CH_2CH_2$, and $H(CF_2)_4$—$CH_2$. In terms of the surface concentratability, the hydrolyzability, and the leaving ability, $CF_3CF_2CH_2$ and $(CF_3)_2CH$ are preferred.

(2) Examples of the organic group $Z^8$ include organic groups having functional groups such as $NH_2$, a secondary amino group, a tertiary amino group, OH, NCO, $CO_2H$, $CO_2Na$, $CO_2K$, $SO_3H$, $SO_2Na$, $SO_3K$, an epoxy group, and an oxyethylene group ($CH_2CH_2O$).

Specific examples thereof include $H_2N(CH_2)_3$, $OCN(CH_2)_3$, $CH_3$—O—$(CH_2CH_2O)(CH_2)_3$, $CH_3$—O—$(CH_2CH_2O)_5(CH_2)_3$, $CH_3$—O—$(CH_2CH_2O)_{10}(CH_2)_3$, and a functional group represented by the following formula.

[Chem. 2]

In terms of the hydrophilicity, the compatibility, and the adhesion, $OCN(CH_2)_3$ and $CH_3$—O—$(CH_2CH_2O)_5(CH_2)_3$ are preferred.

(3) Examples of the organic group $Z^8$ include polymerizable organic groups optionally containing, for example, any of an oxygen atom, a nitrogen atom, a fluorine atom, a chlorine atom, and a silicon atom.

The specific examples thereof include $CH_2=C(CH_3)CO_2$ $(CH_2)_3$, $CH_2=CH$, $CH_2=CHCH_2$, $CH_2=CHO$ $(CH_2)_3$, $CH_2=CHOCO(CH_2)_3$, $CH_2=CHC_6H_4$, and $CH_2=CHCO_2$ $(CH_2)_3$. In terms of the polymerizability and availability, $CH_2=C(CH_3)CO_2(CH_2)_3$ and $CH_2=CHO$ $(CH_2)_3$ are preferred.

Also preferred herein are polymers or copolymers which can be obtained by polymerizing or copolymerizing compound(s) having such a polymerizable organic group and represented by formula (1), and which have a molecular weight of 2000 to 200000, and preferably 5000 to 20000.

In the formula (1), $R^{22}$s may be the same as or different from one another, each optionally containing at least one of an oxygen atom, a nitrogen atom, a fluorine atom, and a chlorine atom. In terms of the surface concentratability, the hydrolyzability, and the leaving ability, $R^{22}$ is a $C_{1-1000}$ monovalent organic group, a siloxane residue, or a hydrogen atom. The number of carbon atoms is preferably 1 to 100, and more preferably 1 to 16.

Preferred examples of the monovalent organic group for $R^{22}$ in formula (1) include $H(CH_2)_m$, $(CH_3)_2CH$, $H(CH_2)_mC=O$, $F(CF_2)_n(CH_2)_m$, $(CF_3)_2CH$, $H(CF_2)_n(CH_2)_m$, $F(CF_2)_n(CH_2)_mC=O$, $H(CF_2)_n(CH_2)_mC=O$, $(F(CF_2)_n(CH_2)_m)_2N$, $((CF_3)_2CH)_2N$, $(H(CF_2)_n(CH_2)_m)_2N$, $F(CF_2)_nO(CF(CF_3)CF_2O)_mCF$ $(CF_3)$ $C=O$, $(F(CF_2)_n(CH_2)_m)_2C=N$, $((CF_3)_2CH)_2C=N$, $(H(CF_2)_n(CH_2)_m)_2C=N$, $F(CF_2)_n(CH_2)_mC=ONR^3$, $H(CF_2)_n(CH_2)_m C=ONR^3$, $F(CF_2)_n(CH_2)_mC=CH_2$, $H(CF_2)_n(CH_2)_m CCH_2$, $F(CF_2)_n(CH_2)_mC=CF_2$, and $H(CF_2)_n(CH_2)_m C=CF_2$ (wherein m represents an integer of 0 or 1 to 6, n represents an integer of 1 to 10, and $R^3$ represents a $C_{1-6}$ alkyl group which may be linear or branched).

Specific examples of these organic groups include $CF_3CH_2$, $CF_3CF_2CH_2$, $CF_3(CF_2)_2CH_2$, $CF_3(CF_2)_3CH_2CH_2$, $(CF_3)_2CH$, $CF_3(CF_2)_7CH_2CH_2$, $H(CF_2)_2CH_2$, $H(CF_2)_3CH_2$, $H(CF_2)_4CH_2$, $CF_3C=O$, $CF_3CF_2C=O$, $CF_3(CF_2)_6C=O$, and $CF_3(CF_2)_7C=O$. In terms of the surface concentratability, the hydrolyzability, and the leaving ability, $CF_3CH_2$, $CF_3CF_2CH_2$, $CF_3(CF_2)_2CH_2$, $CF_3$ $(CF_2)_3CH_2CH_2$, $CF_3C=O$, and $CF_3CF_2C=O$ are preferred, and $CF_3CH_2$ and $CF_3CF_2CH_2$ are more preferred.

In formula (1), examples of the siloxane residue for $R^{22}$ include $(Si(OR^{22})_2O)_nR^{22}$ (where $R^{22}$ is the same as the above monovalent organic group for $R^{22}$).

In formula (1), $R^{23}$s may be the same as or different from one another, each being an organic group which may contain a fluorine atom and/or a chlorine atom, has a chelating ability, and has 1 to 20 carbon atoms, preferably 2 to 10 carbon atoms, in terms of the surface concentratability, the hydrolyzability, and the leaving ability.

Use herein of such an organometallic compound to which an organic group having a chelating ability is bonded gives better storage stability, reactivity, solubility, and compatibility.

Preferred examples of a compound which can serve as such an organic group having a chelating ability include β-diketones such as 2,4-pentanedione and 2,4-heptanedione; ketoesters such as methyl acetoacetate, ethyl acetoacetate, and butyl acetoacetate; hydroxycarboxylic acids and esters or salts thereof, such as lactic acid, methyl lactate, ethyl lactate, an ammonium lactate salt, salicylic acid, methyl salicylate, ethyl salicylate, malate, ethyl malate, tartarate, and ethyl tartarate; keto alcohols such as 4-hydroxy-4-methyl-2-pentanone, 4-hydroxy-2-pentanone, 4-hydroxy-2-heptanone, and 4-hydroxy-4-methyl-2-heptanone; amino alcohols such as monoethanolamine, diethanolamine, triethanolamine, N-methylmonoethanolamine, N-ethylmonoethanolamine, N,N-dimethylethanolamine, and N,N-diethylethanolamine; enolic active hydrogen compounds such as diethyl malonate, methylolmelamine, methylolurea, and methylolacrylamide. More preferred examples thereof include compounds obtained by replacing part or all of the hydrogen atoms of these compounds with a fluorine atom and/or a chlorine atom in terms of the surface concentratability.

Examples of the metal atom M in formula (1) include B, Al, Ga, In, Ti, Sc, Y, La, Ac, Si, Ge, Sn, Pb, Ti, Zr, Hf, As, Sb, Bi, V, Nb, Ta, Te, Po, Cr, Mo, W, At, Mn, Tc, Re, Fe, Co, Ni, Ru, Rh, Pd, Os, Ir, and Pt. In terms of ease of synthesis and availability, Al, Ti, B, Zr, and Si are preferred, and Si is particularly preferred.

Examples of the oligomers and cooligomers in the present invention include linear, branched, cyclic, three-dimensional, or other oligomers and cooligomers.

The degree of polymerization of the oligomers or cooligomers in the present invention is preferably 2 to 100, and more preferably 4 to 20. A smaller degree of polymerization is likely to give a low boiling point to the oligomers or cooligomers to lead to easy volatilization during application, thereby inhibiting the oligomers or cooligomers from being incorporated into the resulting coating film. A degree of polymerization of higher than 100 is likely to cause difficulty in controlling the degree of polymerization in synthesis, or to increase the viscosity of the oligomers or cooligomers too high, thereby deteriorating the workability. When the oligomers or cooligomers are ones containing a fluorine atom and represented by formula (1) with d being 4, e and f being 0, and M being Si, the degree of polymerization thereof is preferably higher than 4 and 30 or lower in terms of the coating film appearance, anti-sagging properties, and alkali resistance.

Addition of an organometallic compound having a hydrolyzable leaving group, an oligomer thereof, and/or a cooligomer of two or more of the organometallic compounds to the weather resistant organic material enables addition of a curing agent to the resulting hydrophilized resin.

Examples of the curing agent include isocyanate compounds, block isocyanate compounds, melamine resins, dibasic acids, non-hydrolyzable group-containing silane compounds, epoxy resins, and acid anhydrides. In terms of the weather resistance and the acid rain resistance, isocyanate compounds, block isocyanate compounds, and epoxy resins are preferred.

Examples of the isocyanate compounds and the block isocyanate compounds include, but are not limited to, 2,4-tolylene diisocyanate, diphenylmethane-4,4'-diisocyanate, xylylene diisocyanate, isophorone diisocyanate, lysine methyl ester diisocyanate, methylcyclohexyl diisocyanate, trimethyl hexamethylene diisocyanate, hexamethylene diisocyanate, n-pentane-1,4-diisocyanate, trimers thereof, adduct forms thereof, biuret forms thereof, polymers thereof having two or more isocyanato groups, and blocked isocyanates.

The mixing ratio NCO/OH (molar ratio) of an isocyanate and the weather resistant organic material is preferably 0.5 to 5.0, and more preferably 0.8 to 1.2. If the isocyanate is of a moisture curing type, the ratio is preferably 1.1 to 1.5.

Examples of the melamine resins other than melamine resins include, but are not limited to, methylolated melamine resin obtained by methylolating melamine, and alkyl etherified melamine resin obtained by etherifying methylolated melamine with an alcohol such as methanol, ethanol, or butanol.

Examples of the epoxy compounds include compounds represented by the following formulas:

[Chem. 3]

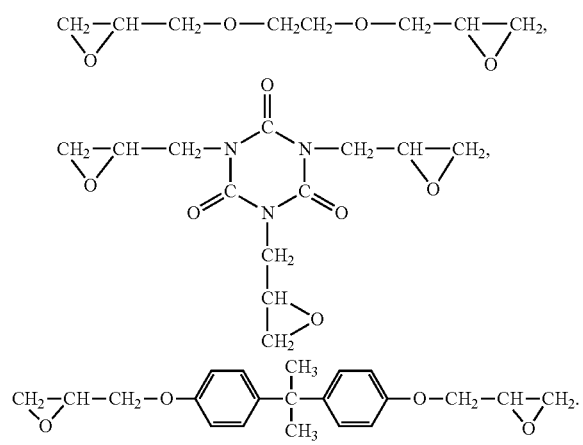

The epoxy compounds, however, are not limited to these compounds.

Examples of the acid anhydride may include, but are not limited to, phthalic anhydride, trimellitic anhydride, pyromellitic anhydride, 1,2-cyclohexyl dicarboxylic acid anhydride, succinic anhydride, and maleic anhydride.

Dibasic acids such as fumaric acid, succinic acid, adipic acid, azelaic acid, sebacic acid, dodecanedioic acid, and 1,2-cyclohexyl dicarboxylic acid can also be used as curing agents.

Examples of the curing catalyst include organotin compounds, organic alkyl acid phosphates, organic titanate compounds, reaction products of alkyl acid phosphates and amines, saturated or unsaturated polyhydric carboxylic acids or acid anhydrides thereof, organic sulfonic acids, amine compounds, aluminum chelate compounds, titanium chelate compounds, and zirconium chelate compounds.

Specific examples of the organotin compounds include dibutyltin dilaurate, dibutyltin maleate, dioctyltin maleate, and dibutyltin diacetate.

Compounds represented by the following formulas:

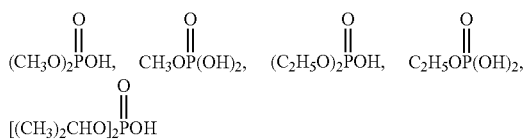
[Chem. 4]

may be specific examples of the organic alkyl acid phosphates.

Examples of the organic titanate compounds include titanium acid esters such as tetrabutyl titanate, tetraisopropyl titanate, and triethanolamine titanate.

Specific examples of the amine compounds include amine compounds such as butylamine, octylamine, dibutylamine, monoethanolamine, diethanolamine, triethanolamine, diethylenetriamine, triethylenetetramine, oleylamine, cyclohexylamine, benzylamine, diethylaminopropylamine, xylylenediamine, triethylenediamine, guanidine, diphenylguanidine, 2,4,6-tris(dimethylaminomethyl)phenol, morpholine, N-methylmorpholine, and 1,8-diazabicyclo(5.4.0)undecene-7 (DBU), salts thereof with an acid such as carboxylic acid, low-molecular-weight polyamide resins obtainable from excess polyamines and polybasic acids, and reaction products of excess polyamines and epoxy compounds.

Specific examples of the chelate compound include aluminum tris(ethyl acetoacetate), aluminum tris(acetyl acetonate), zirconium tetrakis(acetyl acetonate), and diisopropoxy/bis(ethyl acetoacetate)titanate.

The fluororesins (VII) without a functional group may be a compound such as a homopolymer or copolymer of vinylidene fluoride described in documents such as JP S43-10363 B, JP H3-28206 A, and JP H4-189879 A, which can be blended with resins having the functional groups. When resins free from functional groups are used, a curing agent or curing catalyst is not necessarily required.

The following curable resin composition (VIII) can also be used as the weather resistant organic material. The curable resin composition (VIII) contains (A) a reaction product of a hydroxy group-containing fluorinated copolymer (A-1) containing a fluoroolefin unit and a hydroxy group-containing radical-polymerizable unsaturated monomer unit, and an isocyanato group-containing unsaturated compound (A-2) having one isocyanato group and at least one radical-polymerizable unsaturated group; and (B) an acrylic monomer.

The fluoroolefin units in the hydroxy group-containing fluorinated copolymer (A-1) may be, for example, one of, or a combination of, a tetrafluoroethylene (TFE) unit, a chlorotrifluoroethylene (CTFE) unit, a vinyl fluoride (VF) unit, a vinylidene fluoride (VdF) unit, a hexafluoropropylene (HFP) unit, a trifluoroethylene (TrFE) unit, and a perfluoro (alkyl vinyl ether) (PAVE) unit. Examples of the PAVE unit include a perfluoromethyl vinyl ether unit and a perfluoropropyl vinyl ether unit.

Examples of a combination of the units including the TFE unit include a TFE/HFP unit, a TFE/PAVE unit, a TFE/ethylene unit, a TFE/vinyl ether unit, a TFE/vinyl ester unit, a TFE/vinyl ester/vinyl ether unit, and a TFE/vinyl ether/allyl ether unit. Among these, a TFE/ethylene unit, a TFE/vinyl ether unit, a TFE/vinyl ester unit, a TFE/vinyl ester/vinyl ether unit, and a TFE/vinyl ether/allyl ether unit are preferred because they are well-mixed with an ethylenically unsaturated group-containing monomer.

Examples of a combination of the units including the CTFE unit include a CTFE/HFP unit, a CTFE/PAVE unit, a CTFE/ethylene unit, a CTFE/vinyl ether unit, a CTFE/vinyl ester unit, a CTFE/vinyl ester/vinyl ether unit, and a CTFE/vinyl ether/allyl ether unit. Among these, a CTFE/ethylene unit, a CTFE/vinyl ether unit, a CTFE/vinyl ester unit, a CTFE/vinyl ester/vinyl ether unit, and a CTFE/vinyl ether/allyl ether unit are preferred because they are well-mixed with an ethylenically unsaturated group-containing monomer.

Examples of a combination of the units including the HFP unit include a CTFE/HFP unit, a TFE/HFP unit, an HFP/vinyl ether unit, an HFP/vinyl ester unit, an HFP/vinyl ester/vinyl ether unit, and an HFP/vinyl ether/allyl ether unit. Among these, an HFP/vinyl ether unit, an HFP/vinyl ester unit, an HFP/vinyl ester/vinyl ether unit, and an HFP/vinyl ether/allyl ether unit are preferred because they are well-mixed with an ethylenically unsaturated group-containing monomer.

Examples of a combination of the units including the VdF unit include a VdF/TFE unit, a VdF/HFP unit, a VdF/TFE/HFP unit, a VdF/CTFE unit, a VdF/TFE/PAVE unit, a VdF/CTFE/TFE unit, and a VdF/CTFE/HFP unit. These combinations each preferably have at least 50 mol % of the VdF unit in the polymer so as to be well-mixed with an ethylenically unsaturated group-containing monomer.

Specific examples of the hydroxy group-containing radical-polymerizable unsaturated monomer unit in the hydroxy group-containing fluorinated copolymer (A-1) include hydroxyalkyl vinyl ether and hydroxyalkyl allyl ether represented by the following formula:

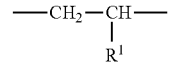
[Chem. 5]

(wherein $R^1$ is $—OR^2$ or $—CH_2OR^2$ where $R^2$ is an alkyl group containing a hydroxy group). $R^2$ is, for example, a $C_{1-8}$ linear or branched alkyl group to which 1 to 3 hydroxy groups, preferably 1 hydroxy group, are bonded. Examples thereof include a 2-hydroxyethyl vinyl ether unit, a 3-hydroxypropyl vinyl ether unit, a 2-hydroxypropyl vinyl ether unit, a 2-hydroxy-2-methylpropyl vinyl ether unit, a 4-hydroxybutyl vinyl ether unit, a 4-hydroxy-2-methylbutyl vinyl ether unit, a 5-hydroxypentyl vinyl ether unit, a 6-hydroxyhexyl vinyl ether unit, a 2-hydroxyethyl allyl ether unit, a 4-hydroxybutyl allyl ether unit, an ethylene glycol monoallyl ether unit, a diethylene glycol monoallyl ether unit, a triethylene glycol monoallyl ether unit, and a glycerol monoallyl ether unit. Among these, particularly $C_{3-8}$ hydroxyalkyl vinyl ether, specifically a 4-hydroxybutyl vinyl ether unit and a 2-hydroxyethyl vinyl ether unit are preferred in terms of ease of polymerization.

The hydroxy group-containing fluorinated copolymer (A-1) preferably further contains hydroxy group-free non-fluorinated vinyl ether unit and/or non-fluorinated vinyl ester unit, in terms of enhancing the solubility in acrylic monomers.

Specific examples of the hydroxy group-free non-fluorinated vinyl ether unit and/or non-fluorinated vinyl ester unit in the hydroxy group-containing fluorinated copolymer (A-1) include alkyl vinyl ethers and alkyl allyl ethers represented by the following formula:

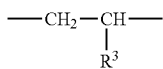

(wherein $R^3$ is —$OR^4$, —$COOR^4$, or —$OCOR^4$ where $R^4$ is an alkyl group). $R^4$ is, for example, $C_{1-8}$ linear, branched, or cyclic alkyl group. Examples thereof include a cyclohexyl vinyl ether unit, a methyl vinyl ether unit, an ethyl vinyl ether unit, a propylvinyl ether unit, an n-butyl vinyl ether unit, an isobutyl vinyl ether unit, a vinyl acetate unit, a vinyl propionate unit, a vinyl butyrate unit, a vinyl isobutyrate unit, a vinyl pivalate unit, a vinyl caproate unit, a vinyl versatate unit, a vinyl laurate unit, a vinyl stearate unit, and a vinyl cyclohexyl carboxylate unit. Among these, vinyl versatate, vinyl laurate, vinyl stearate, vinyl cyclohexyl carboxylate, and vinyl acetate are more preferred because they have excellent weather resistance, solubility, and inexpensiveness. Here, in terms of chemical resistance, non-aromatic vinyl carboxylate esters are preferred, specifically $C_6$ or higher vinyl carboxylate esters are preferred, and $C_9$ or higher vinyl carboxylate esters are more preferred. The upper limit of the number of carbons of carboxylic acid in a vinyl carboxylate ester is preferably 20 at most, and more preferably 15 at most. Specifically, vinyl versatate is most preferred.

The hydroxy group-containing fluorinated copolymer (A-1) may contain a carboxyl group-containing monomer unit.

The carboxyl group-containing monomer unit contains a carboxyl group but is not a hydroxy group or an aromatic group, which makes this unit different from other units. The carboxyl group-containing monomer unit, when mixed into the curable resin composition, improves the dispersibility and curing reactivity of the hydroxy group-containing fluorinated copolymer (A-1) to improve the properties of the resulting coating film such as the glossiness, hardness, and adhesion to the base material.

Examples of the carboxyl group-containing monomer unit include carboxyl group-containing vinyl monomers represented by the following formula:

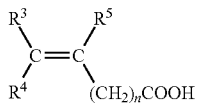

(wherein $R^3$, $R^4$, and $R^5$ are the same as or different from one another, each representing a hydrogen atom, an alkyl group, a carboxyl group, or an ester group, and n is 0 or 1), or by the following formula:

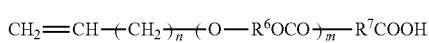

(wherein $R^6$ and $R^7$ are the same as or different from one another, each representing saturated or unsaturated, linear or cyclic alkyl group, n is 0 or 1, and m is 0 or 1).

Specifically, the carboxyl group-containing monomer unit is, for example, one of, or a combination of, acrylic acid, methacrylic acid, vinyl acetate, crotonic acid, cinnamic acid, 3-allyloxy propionic acid, itaconic acid, itaconic acid monoester, maleic acid, maleic acid monoester, maleic anhydride, fumaric acid, fumaric acid monoester, vinyl phthalate, and vinyl pyromellitate. Particularly, crotonic acid, itaconic acid, maleic acid, maleic acid monoester, fumaric acid, fumaric acid monoester, and 3-allyloxy propionic acid which have low homopolymerizability are preferred.

The lower limit of the proportion of the carboxyl group-containing monomer unit is 0.1 mol %, and preferably 0.4 mol %, while the upper limit is 2.0 mol %, and preferably 1.5 mol %. A proportion of higher than 2.0 mol % is not preferred in terms of the curing rate of the coating film.

Specific examples of the hydroxy group-containing fluorinated copolymer (A-1) include

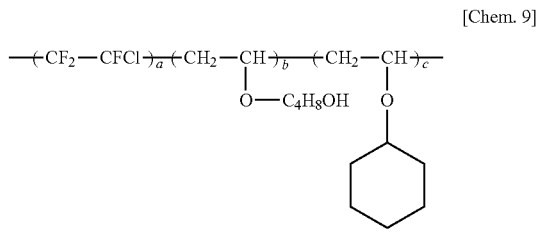

(wherein the ratio of a, b, and c by moles is a:b:c=40 to 60:3 to 15:5 to 45);

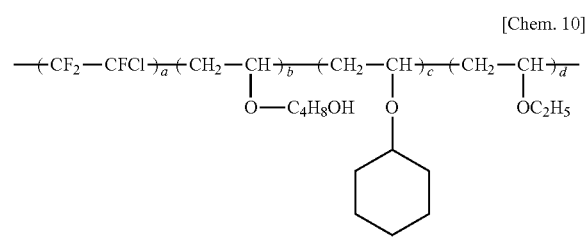

(wherein the ratio of a, b, c, and d by moles is a:b:c:d=40 to 60:3 to 15:5 to 45:5 to 45);

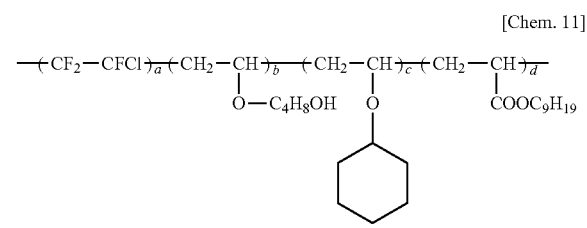

(wherein the ratio of a, b, c, and d by moles is a:b:c:d=40 to 60:3 to 15:5 to 45:5 to 45);

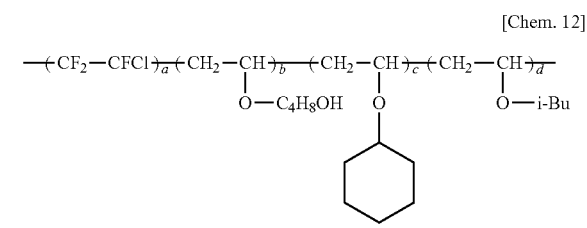

(wherein the ratio of a, b, c and d by moles is a:b:c:d=40 to 60:3 to 15:5 to 45:5 to 45, and i-Bu is an isobutyl group);

tetrafluoroethylene/vinyl versatate/hydroxybutyl vinyl ether; tetrafluoroethylene/vinyl versatate/hydroxyethyl vinyl ether/tert-butyl vinyl benzoate; tetrafluoroethylene/vinyl versatate/hydroxybutyl vinyl ether/crotonic acid; and tetrafluoroethylene/vinyl versatate/hydroxyethyl vinyl ether/vinyl benzoate/crotonic acid.

Examples of the radical-polymerizable unsaturated groups in the isocyanato group-containing unsaturated compound (A-2) include a methacrylic group, an acrylic group, a 2-fluoroacrylic group, and a 2-chloroacrylic group. In terms of the polymerization reactivity, the cost, and the ease of synthesis, a methacrylic group and an acrylic group are preferred, and an acrylic group is most preferred.

Examples of the isocyanato group-containing unsaturated compound (A-2) include alkyl vinyl ethers and alkyl allyl ethers represented by the following formula:

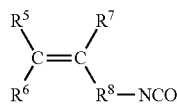

[Chem. 13]

(wherein $R^5$, $R^6$, or $R^7$ may be the same as or different from one another, each representing a hydrogen atom, a fluorine atom, a chlorine atom, or a $C_{1-4}$ alkyl group, and $R^8$ is —COO—$R^9$—, —OCO—$R^9$—, or —O—$R^9$— where $R^9$ is a $C_{1-20}$ alkyl group).

Examples of the isocyanato group-containing unsaturated compound (A-2) include 2-isocyanate ethyl acrylate represented by the following formula:

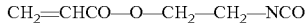

$CH_2=CHCO-O-CH_2-CH_2-NCO$    [Chem. 14]

and 2-isocyanate ethyl methacrylate represented by the following formula:

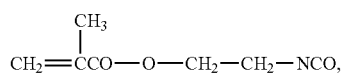

[Chem. 15]

4-isocyanate butyl acrylate, and 4-isocyanate butyl methacrylate.

The examples also include reaction products with one isocyanato group, each obtained by reacting an unsaturated monoalcohol with a polyvalent isocyanate. Examples of the polyvalent isocyanate include 2,4-tolylene diisocyanate, 2,6-tolylene diisocyanate, mixed isocyanates of 2,4-tolylene diisocyanate and 2,6-tolylene diisocyanate, P,P'-diphenylmethane diisocyanate, 1,5-naphthylene diisocyanate, paraphenylene diisocyanate, 1,6-hexamethylene diisocyanate, isophorone diisocyanate, and hydrogenated xylylene diisocyanate. Examples of the unsaturated monoalcohol include monoalcohols having an acryloyl group or a methacryloyl group, such as 2-hydroxyethyl acrylate, 2-hydroxyethyl methacrylate, 2-hydroxypropyl acrylate, 2-hydroxypropyl methacrylate, 4-hydroxybutyl acrylate, and 4-hydroxybutyl methacrylate; and monoalcohols having an allyl group, such as allyl alcohol, allyl cellosolve, and trimethyl propane diallyl ether. Among these, 2-isocyanate ethyl acrylate and 2-isocyanate ethyl methacrylate are preferred in terms of ease of the synthesis and high reactivity.

The reaction product (A) is produced through urethane bonding between the hydroxy group in the hydroxy group-containing fluorinated copolymer (A-1) and the isocyanato group in the isocyanato group-containing unsaturated compound (A-2).

The amount of fluorine in the reaction product (A) is preferably at least 2% by mass, more preferably at least 5% by mass, and still more preferably at least 10% by mass, in terms of favorable weather resistance, water and oil repellency, and antifouling properties. The amount of fluorine in the reaction product (A) is preferably 50% by mass at most, more preferably 30% by mass at most, and still more preferably 25% by mass at most, in terms of favorable solubility in the acrylic monomer.

The number average molecular weight of the reaction product (A) is preferably at least 1000, more preferably at least 2000, and still more preferably at least 3000, in terms of the strength and surface hardness of the cured article obtained by curing a curable composition containing the reaction product (A). The number average molecular weight of the reaction product (A) is preferably 100000 at most for preventing high viscosity which makes the handling difficult, more preferably 50000 at most for the favorable solubility in an acrylic monomer, and still more preferably 30000 at most for low viscosity which leads to favorable handleability of the composition.

The acrylic monomer (B) in the curable resin composition (VIII) refers to a monomer having a single or multiple acryloyl groups, methacryloyl groups, 2-fluoroacryloyl groups, or 2-chloroacryloyl groups, and is different from the isocyanato group-containing unsaturated compound (A-2) having a radical-polymerizable unsaturated group.

The number of the radical-polymerizable unsaturated groups in the acrylic monomer (B) is preferably one for high dissolving in the hydroxy group-containing fluorinated copolymer (A-1) and giving low viscosity to the composition. The number is more preferably at least 2 for favorable strength of the cured article obtained by curing a curable composition containing the acrylic monomer (B). The number is more preferably at least 3 for favorable curing rate of the curable composition.

Specific examples of the acrylic monomer (B) include methacrylate monomers such as methyl methacrylate (MMA), methacrylic acid (MA), ethyl methacrylate (EMA), n-butyl methacrylate (nBMA), isobutyl methacrylate (iBMA), 2-ethylhexyl methacrylate, phenyl methacrylate, cyclohexyl methacrylate, 3-(trimethoxysilyl)propyl methacrylate (MSPM), 2-(phenylphosphoryl)ethyl methacrylate (phenyl-P), 2,2-bis(4-methacryloxyphenyl)propane (BP-DMA), 2,2-bis(4-methacryloxyethoxyphenyl)propane (Bis-MEPP), 2,2-bis(4-methacryloxypolyethoxyphenyl)propane (Bis-MPEPP), di(methacryloxyethyl)trimethylhexamethylene diurethane (UDMA), trimethylolpropanetrimethacrylate (TMPT), pentaerythritol triacrylate, pentaerythritol tetraacrylate, dipentaerythritol hexaacrylate, ethylene glycol dimethacrylate (EDMA or 1G), diethylene glycol dimethacrylate (DiEDMA), triethylene glycol dimethacrylate (TriEDMA), 1,4-butanediol dimethacrylate (1,4-BuDMA), 1,3-butanediol dimethacrylate (1,3-BuDMA), and 1,6-hexanediol diacrylate (16 $HZ^6$); and hydroxy group-containing methacrylate monomers such as 2-hydroxyethyl methacrylate (HEMA), 2-hydroxy-3-(J-naphthoxy)propyl methacrylate (HNPM), N-phenyl-N-(2-hydroxy-3-methacryloxy)propylglycine (NPG-GMA), and 2,2-bis[4-(2-hydroxy-3-methacryloxypropoxy)phenyl]propane (Bis-GMA). The examples also include the acrylates and 2-chloroacrylates corresponding to these.

Examples of the fluorinated acrylic monomers include
2-fluoroacrylates corresponding to the methacrylate monomers or the hydroxy group-containing methacrylate monomers, $CH_2$=$C(CH_3)COOCH_2CF_3$ (3FMA),
$CH_2$=$C(CH_3)COOCH_2CF_2CF_2H$ (4FMA),
$CH_2$=$C(CH_3)COOCH_2CF_2CF_3$ (5FMA),
$CH_2$=$C(CH_3)COOCH_2CF_2CFHCF_3$ (6FMA),
$CH_2$=$C(CH_3)COOCH_2 (CF_2)_3CF_2H$ (8FMA),
$CH_2$=$C(CH_3)COOCH_2CH_2 (CF_2)_3CF_3$ (9FMA),
$CH_2$=$C(CH_3)COOCH_2 (CF_2)_5CF_2H$ (12FMA),
$CH_2$=$C(CH_3)COOCH_2CH_2 (CF_2)_5CF_3$ (13FMA),
$CH_2$=$C(CH_3)COOCH_2CH_2(CF_2)_7CF_3$ (17FMA),
$CH_2$=$C(CH_3)COOCH(CF_3)_2$ (HFIP-MA),
$CH_2$=$C(CH_3)COOCH_2CCH_3(CF_3)_2$(6FNP-MA),
$CH_2$=$C(CH_3)COOCH_2CF(CF_3)OCF_2CF_2CF_3$ (6FOn1-MA), and the acrylates, 2-fluoroacrylates, and 2-chloroacrylates corresponding to these.

Examples of the 2-fluoroacrylate include
$CH_2$=$CFCOOCH_2CF_2CF_2H$ (4FFA),
$CH_2$=$CFCOOCH_2CF_2CF_3$ (5FFA),
$CH_2$=$CFCOOCH_2 (CF_2)_3CF_2H$ (8FFA),
$CH_2$=$CFCOOCH_2 (CF_2)_5CF_2H$ (12FFA), and
$CH_2$=$CFCOOCH(CF_3)_2$ (HFIP-FA).

Use of an acrylic monomer having a curable functional group is preferred because the resulting cured article has excellent properties such as adhesion, chemical resistance, and curability. Examples of the acrylic monomer having a curable functional group include acrylic monomers with groups such as a hydroxy group, a carboxyl group, an epoxy group, or an amino group. Specific examples thereof include the specific examples mentioned above, such as curable functional group-containing acrylic monomers exemplified by hydroxyethyl(meth)acrylate, 2-hydroxypropyl(meth) acrylate, 2-hydroxyethyl vinyl ether, (meth)acrylic acid, glycidyl(meth)acrylate, 2-aminoethyl(meth)acrylate, and 2-aminopropyl(meth)acrylate.

These acrylic monomers can be mentioned as examples, but for favorable dissolving in the hydroxy group-containing fluorinated copolymer (A-1), the isocyanato group-containing unsaturated compound (A-2), and the reaction product thereof (A), methyl methacrylate, ethyl methacrylate, methyl acrylate, and ethyl acrylate are preferred.

The mass ratio of the reaction product (A) to the acrylic monomer (B) is preferably 95:5 to 5:95, more preferably 80:20 to 20:80, and still more preferably 70:30 to 30:70. A mass of the reaction product (A) of larger than the mass in the mass ratio of the reaction product (A) to the acrylic monomer (B) of 95:5 tends to increase the viscosity, thereby decreasing the handleability. A mass of the reaction product (A) of smaller than the mass in the mass ratio of the reaction product (A) to the acrylic monomer (B) of 5:95 tends to decrease the fluorine content, thereby decreasing the weather resistance, water and oil repellency, and antifouling properties of the cured article obtained by curing the curable composition.

The ratio of the reaction product (A) to the acrylic monomer (B) is, in another perspective, that the acrylic monomer (B) preferably presents in an amount of at least 10 parts by mass, more preferably at least 40 parts by mass, and still more preferably at least 60 parts by mass, for each 100 parts by mass of the reaction product (A). A smaller amount of the acrylic monomer (B) tends to increase the viscosity, thereby decreasing the handleability. The amount of acrylic monomer (B) for each 100 parts by mass of the reaction product (A) is preferably 1500 parts by mass at most, more preferably 1200 parts by mass at most, and still more preferably 1000 parts by mass at most. A larger amount of the acrylic monomer (B), however, tends to decrease the fluorine content, and thereby decreases the weather resistance, water and oil repellency, and antifouling properties of the cured article obtained by curing the curable composition.

The viscosity of the curable resin composition at 25° C. is preferably at least 5 mPa·s because too low a viscosity often causes sagging to decrease the handleability. The viscosity is more preferably at least 10 mPa·s for favorable thin-film forming ability, and still more preferably at least 50 mPa·s because it makes shrinkage upon curing small. The viscosity of the curable resin composition at 25° C. is preferably 100000 mPa·s at most because it gives favorable handleability. The viscosity is more preferably 5000 mPa·s at most for spreading the curable composition entirely in mold-processing, and still more preferably 3000 mPa·s at most for favorable leveling properties (surface smoothness) upon formation of a thin film.

The curable resin composition may further contain a curing agent. The curing agent is a compound which reacts with the curable reactive group of the hydroxy group-containing fluorinated copolymer (A-1) for crosslinking. For example, isocyanates free from an unsaturated bond, amino resins, acid anhydrides, polyepoxy compounds, and isocyanato group-containing silane compounds, are typically used.

Specific examples of the isocyanates free from an unsaturated bond include, but are not limited to, 2,4-tolylene diisocyanate, diphenylmethane-4,4'-diisocyanate, xylylene diisocyanate, isophorone diisocyanate, lysine methyl ester diisocyanate, methylcyclohexyl diisocyanate, trimethyl hexamethylene diisocyanate, hexamethylene diisocyanate, and n-pentane-1,4-diisocyanate, trimers thereof, adduct forms thereof, biuret forms thereof, polymers thereof having at least two isocyanato groups, and further blocked isocyanates.

Specific examples of the amino resins include, but are not limited to, urea resin, melamine resin, benzoguanamine resin, glycoluril resin, methylolated melamine resin obtained by methylolating melamine, and alkyl etherified melamine resin obtained by etherifying methylolated melamine with an alcohol such as methanol, ethanol, or butanol.

Specific examples of the acid anhydrides include, but are not limited to, phthalic anhydride, pyromellitic anhydride, and mellitic anhydride.

The polyepoxy compounds and the isocyanato group-containing silane compounds may be, for example, those described in documents such as JP H2-232250 A and JP H2-232251A. Suitable examples thereof include

[Chem. 16]

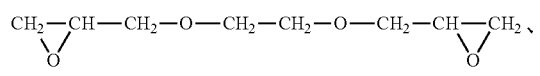

[Chem. 17]

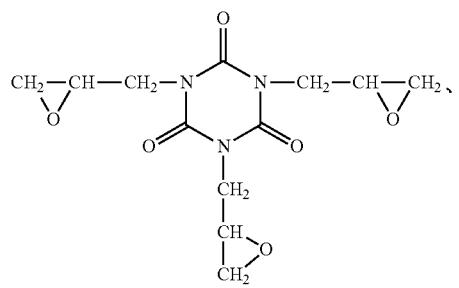

[Chem. 18]

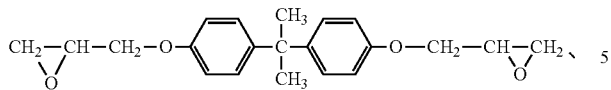

OCNC$_3$H$_6$Si(OC$_2$H$_5$)$_3$, and OCNC$_2$H$_4$Si(OCH$_3$)$_3$.

The amount of the curing agent is 0.1 to 5 Eq., and preferably 0.5 to 1.5 Eq. per Eq. of chemically curable reactive groups in the hydroxy group-containing fluorinated copolymer (A-1). The composition of the present invention can be typically cured in few minutes or about 10 days at 0 to 200° C.

In curing of the curable resin composition, the reaction product (A) and the acrylic monomer (B) are polymerized by UV irradiation. Hence, the curable resin composition may contain a photopolymerization initiator. Specific examples of the photopolymerization initiator include acetophenone compounds such as acetophenone, chloroacetophenone, diethoxy acetophenone, hydroxy acetophenone, and α-aminoacetophenone; benzoin compounds such as benzoin, benzoin methyl ether, benzoin ethyl ether, benzoin isopropyl ether, benzoin isobutyl ether, and benzyl dimethyl ketal; benzophenone compounds such as benzophenone, benzoylbenzoic acid, methyl benzoylbenzoate, 4-phenyl-benzophenone, hydroxy benzophenone, hydroxy-propyl-benzophenone, acrylated benzophenone, and Michler's ketone; thioxanthones such as thioxanthone, chlorothioxanthone, methyl thioxanthone, diethyl thioxanthone, and dimethyl thioxanthone; and other compounds such as benzyl, α-acyl oxime ester, acyl phosphine oxide, glyoxy ester, 3-ketocoumarin, 2-ethylanthraquinone, camphorquinone, and anthraquinone.

Optionally, known photoinitiator aids such as amines, sulfones, and sulfines may be added.

The curable resin composition preferably does not contain an organic solvent free from a radical reactive group and a fluorine solvent in that the step of removing the solvent after curing the curable resin composition is unnecessary, and there are no adverse effects such as reduction of the heat resistance, reduction of the strength, and cloudiness caused by the residual solvents.

These curing catalysts may be used alone or in combination. Preferred examples of the curing catalyst include organotin compounds and aluminum chelate compounds.

The examples also include alkyl acid phosphate, reaction products of alkyl acid phosphates and amines, saturated or unsaturated polyvalent carboxylic acid or acid anhydride thereof, organic titanate compounds, amine compounds, and lead octoate.

Specific examples of the organotin compounds include dibutyltin dilaurate, dibutyltin maleate, dioctyltin maleate, dibutyltin diacetate, dibutyltin phthalate, tin octylate, tin naphthenate, and dibutyltin methoxide.

The alkyl acid phosphate is a phosphoric acid ester containing the moiety represented by

[Chem. 19]

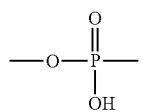

and examples thereof include organic alkyl acid phosphates represented by:

[Chem. 20]

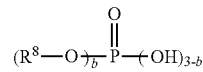

(wherein b represents 1 or 2, and R$^8$ represents an organic residue). Specifically, compounds such as

[Chem. 21]

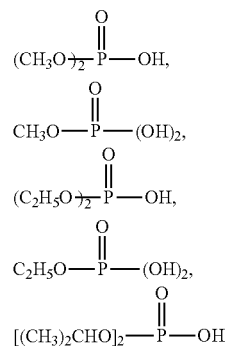

may be mentioned.

Examples of the organic titanate compounds include titanium acid esters such as tetrabutyl titanate, tetraisopropyl titanate, and triethanolamine titanate.

Specific examples of the amine compounds include amine compounds (e.g. butylamine, octylamine, dibutylamine, monoethanolamine, diethanolamine, triethanolamine, diethylenetriamine, triethylenetetramine, oleylamine, cyclohexylamine, benzylamine, diethylaminopropylamine, xylylene diamine, triethylenediamine, guanidine, diphenyl guanidine, 2,4,6-tris(dimethylaminomethyl)phenol, morpholine, N-methylmorpholine, 1,8-diazabicyclo(5.4.0)undecene-7 (DBU)), salts thereof with an acid such as carboxylic acid, low-molecular-weight polyamide resins obtained from excess polyamines and polybasic acids, and reaction products of excess polyamines and epoxy compounds.

The curing catalysts may be used alone or in combination. A curing accelerator is preferably used in an amount of $1.0 \times 10^{-6}$ to $1.0 \times 10^{-2}$ parts by mass, more preferably $5.0 \times 10^{-5}$ to $1.0 \times 10^{-3}$ parts by mass, for each 100 parts by mass of the copolymer.

The amount ratio between the organometallic compound and the weather resistant organic material is different depending on the purpose and the use, but the amount of the organometallic compound is typically 0.1 to 50 parts by weight, preferably 1 to 30 parts by weight, for each 100 parts by weight of the weather resistant organic material. An amount of less than 0.1 parts by weight tends to cause insufficient hydrophilization effects, while an amount of more than 50 parts by weight tends to cause poor appearance of the coating film and reduction of the compatibility with the resin.

The weather resistant organic material may also be the following curable resin composition (IX). The curable resin composition (IX) contains (A) a reaction product of a hydroxy group-containing fluorinated polymer (A-1) containing a radical-polymerizable unsaturated monomer unit containing a fluorine atom and a hydroxy group, and an isocyanato group-containing unsaturated compound (A-2) having one isocyanato group and at least one radical-polymerizable unsaturated group; and (B) an acrylic monomer.

Specific examples of the hydroxy group-containing radical-polymerizable unsaturated monomer unit in the hydroxy group-containing fluorinated copolymer (A-1) include hydroxy group-containing fluorinated ethylenic monomers represented by the formula (1):

[Chem. 22]

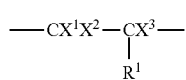
(I)

(wherein $X^1$ and $X^2$ may be the same as or different from one another, each representing a fluorine atom or a hydrogen atom; $X^3$ is a fluorine atom, a hydrogen atom, a chlorine atom, a methyl group, or a trifluoromethyl group; $R^1$ is a $C_{1-30}$ linear or branched alkyl group, fluoroalkyl group, or perfluoroalkyl group containing at least one hydroxy group, which may contain an ether bond, an ester bond, or an urethane bond in the chain; and at least one fluorine atom is contained in any of $X^1$ to $X^3$ and $R^1$).

Among these, hydroxy group-containing fluorinated ethylenic monomers represented by formula (II) are more preferred.

[Chem. 23]

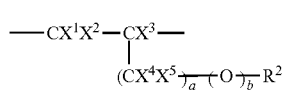
(II)

Here, $X^1$ and $X^2$ may be the same as or different from one another, each representing a fluorine atom or a hydrogen atom; $X^3$ is a fluorine atom, a hydrogen atom, a chlorine atom, a methyl group, or a trifluoromethyl group; $X^4$ and $X^5$ may be the same as or different from one another, each representing a hydrogen atom, a fluorine atom, a methyl group, or a trifluoromethyl group; a is an integer of 0 to 3; b is 0 or 1; and $R^2$ is a $C_{1-29}$ linear or branched alkyl group, fluoroalkyl group, or perfluoroalkyl group which contains at least one hydroxy group, and optionally contains an ether bond, an ester bond, or an urethane bond in the chain; and at least one fluorine atom is contained in any of $X^1$ to $X^5$ and $R^2$).

More preferred hydroxy group-containing fluorinated ethylenic monomer is represented by formula (III):

[Chem. 24]

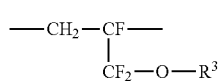
(III)

(wherein $R^3$ is a $C_{1-29}$ linear or branched alkyl group, fluoroalkyl group, or perfluoroalkyl group which contains at least one hydroxy group, and optionally contains an ether bond, an ester bond, or a urethane bond in the chain).

Next, hydroxy groups contained in any of $R^1$ to $R^3$ are described. A carbon atom to which a hydroxy group is directly bonded can be generally classified into one of three kinds, namely primary carbon atoms, secondary carbon atoms, and tertiary carbon atoms, depending on the number of carbon atoms bonded to the carbon atom to which a hydroxy group is bonded.

A carbon atom is a primary carbon atom when the number of carbon atoms bonded to the carbon atom to which a hydroxy group is bonded is one, as in the case of R—$CH_2$—OH (where R is a $C_1$ or higher organic group).

Specifically, monovalent hydroxy group-containing organic groups such as

[Chem. 25]

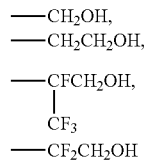

may be mentioned.

A carbon atom is a secondary carbon atom when the number of carbon atoms bonded to the carbon atom to which a hydroxy group is bonded is two, as in the case of R—CR'H—OH, (where R and R' each are a $C_1$ or higher organic group).

Specifically, monovalent hydroxy group-containing organic groups such as

[Chem. 26]

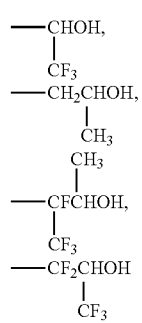

may be mentioned.

A carbon atom is a tertiary carbon atom when the number of carbon atoms bonded to the carbon to which a hydroxy group is bonded is three, as in the case of R—CR'R"—OH (where R, R', and R" each are a $C_1$ or higher organic group). Specifically, monovalent hydroxy group-containing organic groups such as

[Chem. 27]

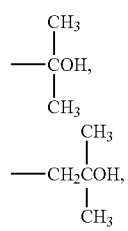

-continued

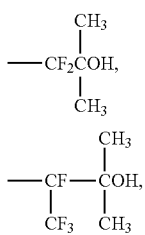

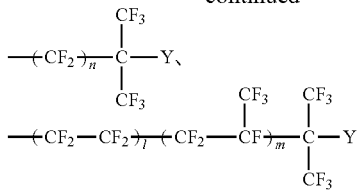

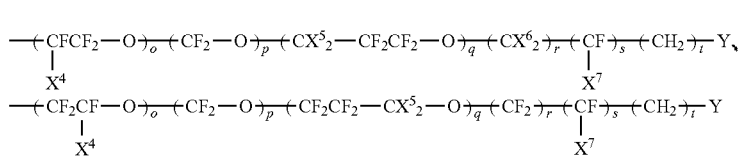

(wherein l, m, and n each are an integer, l is 1 to 10, m is 1 to 10, and n is 1 to 5), and

[Chem. 29]

(wherein $X^4$ and $X^7$ each are F or $CF_3$; $X^5$ and $X^6$ each are H or F; o+p+q is 1 to 10; r is 0 or 1; and s and t each are 0 or 1) may be mentioned as examples.

Specific examples of the monomers represented by formula (III) include

-continued

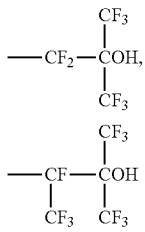

may be mentioned.

Among these, hydroxy group-containing organic groups with the hydroxy group bonded to a primary or secondary carbon atom are preferred in terms of the steric hindrance, and hydroxy group-containing organic groups with the hydroxy group bonded to a primary carbon atom are preferred in terms of the reactivity.

In the following, specific structures of $R^1$ to $R^3$ are described using Y which refers to $Y^1$ or simply a hydroxy group; $Y^1$ is a $C_{1-10}$ monovalent hydroxy group-containing organic group with the hydroxy group bonded to one of the primary to tertiary carbon atoms as described above.

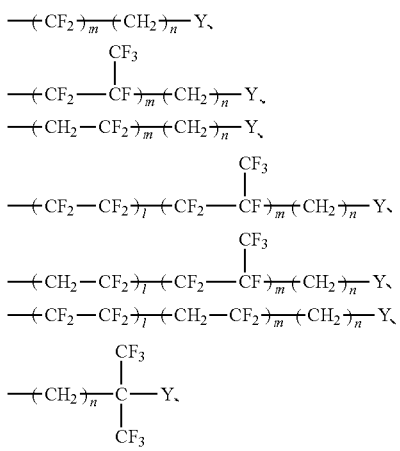

[Chem. 28]

[Chem. 30]

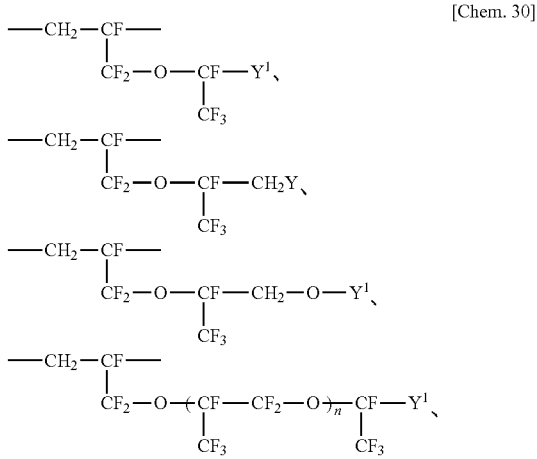

[Chem. 31]

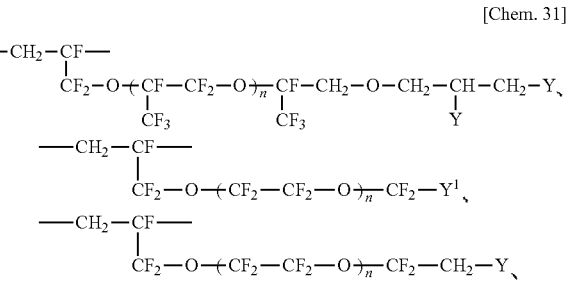

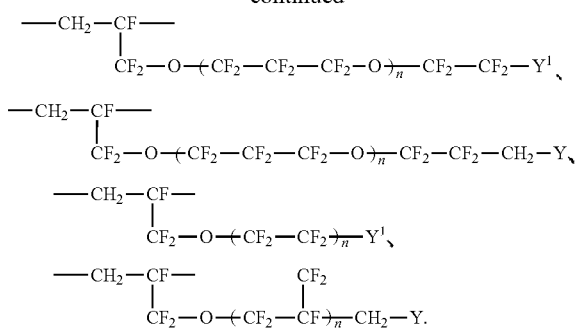

More specifically, compounds such as

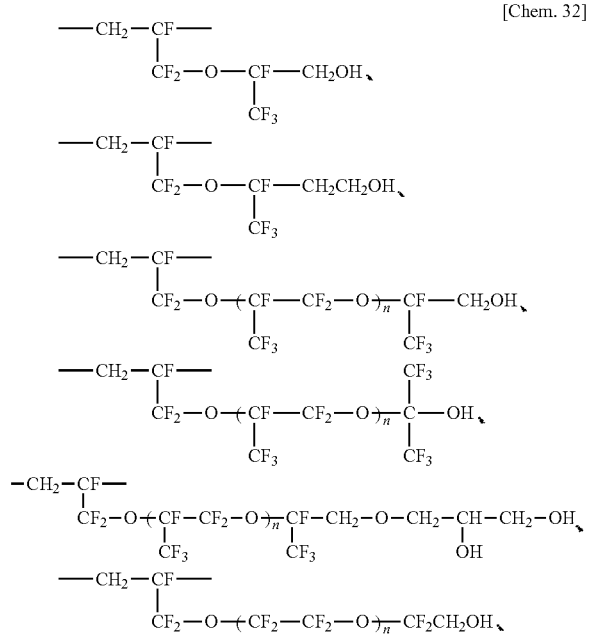

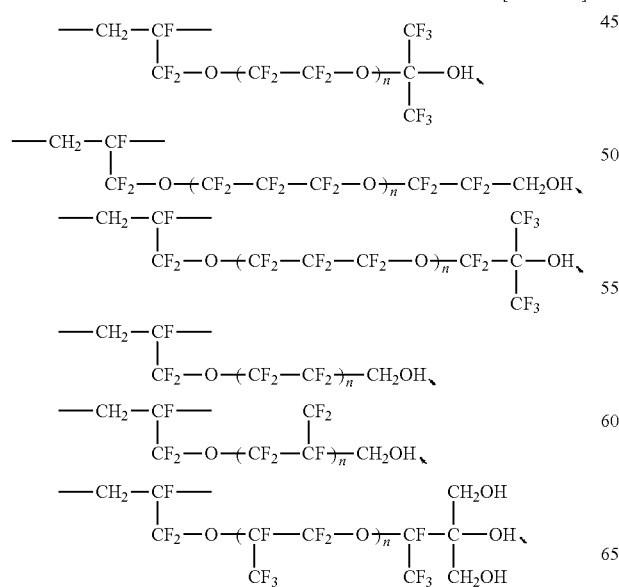

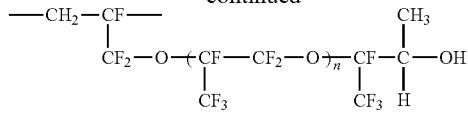

may be mentioned as examples.

Among these, in terms of the solubility in an acrylic monomer and the reactivity with an isocyanato group (—NCO),

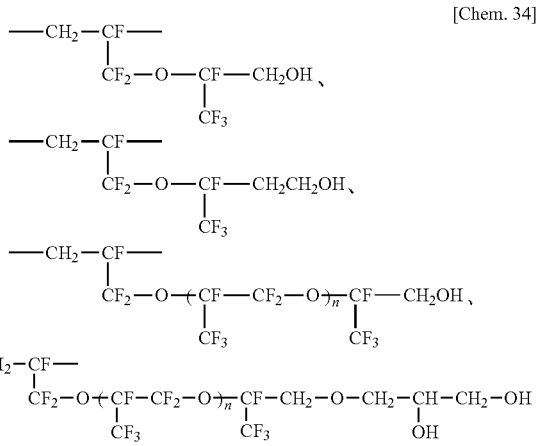

are particularly preferred.

The hydroxy group-containing fluoropolymer may also contain monomer units free from hydroxy groups if the solubility in an acrylic monomer is not deteriorated. Specific examples of such monomer units include every monomer unit in which the structural unit A or M described in WO 02/18457 A is free from hydroxy groups.

Particularly, in terms of the solubility in acrylic monomers,

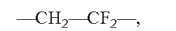

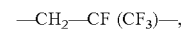

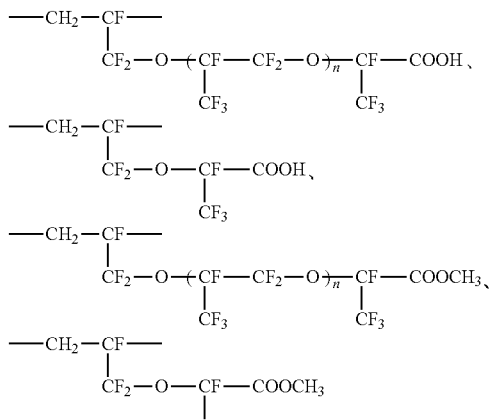

are preferred.

Specific examples of the hydroxy group-containing fluorinated polymers include, in terms of the solubility in acrylic monomers and the reactivity with NCO,

[Chem. 36]

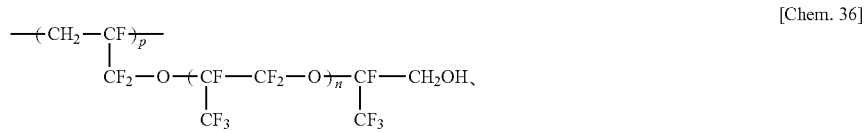
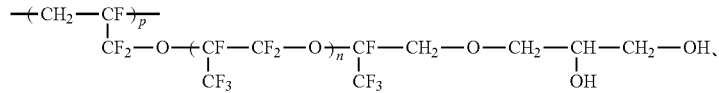
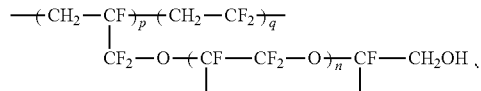
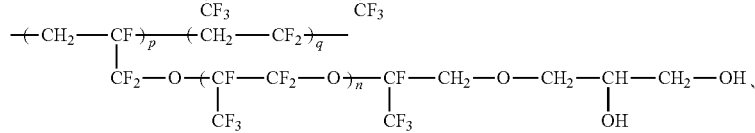

[Chem. 37]

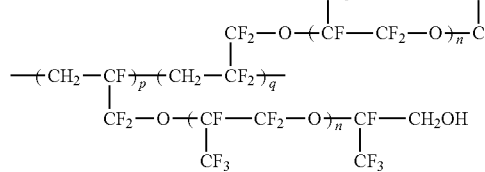
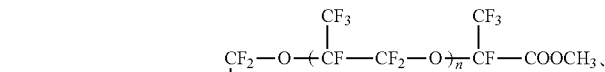
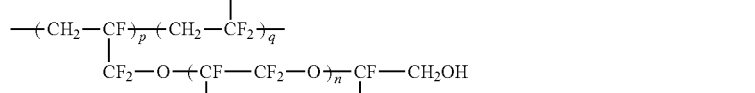
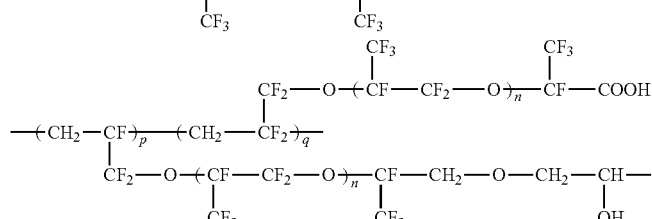
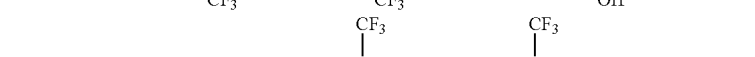
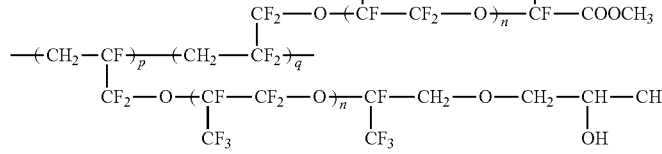

(wherein the molar ratio of p to q is 20/80 to 99/1).

Examples of the radical-polymerizable unsaturated groups in the isocyanato group-containing unsaturated compound (A-2) include a methacrylic group, an acrylic group, a 2-fluoroacrylic group, and a 2-chloroacrylic group. In terms of the polymerization reactivity, the cost, and the ease of synthesis, a methacrylic group and an acrylic group are preferred, and an acrylic group is particularly preferred.

Examples of the isocyanato group-containing unsaturated compounds (A-2) include alkyl vinyl ethers and alkyl allyl ethers represented by formula (IV):

[Chem. 38]

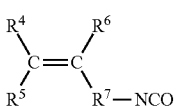

(IV)

(wherein $R^4$, $R^5$, and $R^6$ may be the same as or different from one another, each representing a hydrogen atom, a fluorine atom, a chlorine atom, or a $C_{1-4}$ alkyl group, and $R^7$ is —COO—$R^8$—, —OCO—$R^8$, or —O—$R^8$— (where $R^8$ is a $C_{1-20}$ alkylene group)).

Examples of the isocyanato group-containing unsaturated compounds (A-2) include 2-isocyanate ethyl acrylate represented by formula (V):

$$CH_2=CHCOOCH_2CH_2NCO \quad (V)$$

2-isocyanate ethyl methacrylate represented by formula (VI):

$$CH_2=C(CH_3)COOCH_2CH_2NCO \quad (VI)$$

the compound represented by formula (VII):

[Chem. 39]

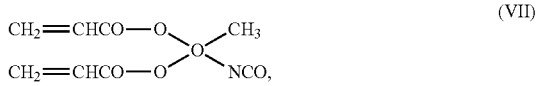

(VII)

4-isocyanate butyl acrylate, and 4-isocyanate butyl methacrylate.

The examples also include reaction products with one isocyanato group, each obtained by reacting an unsaturated monoalcohol with a polyvalent isocyanate. Examples of the polyvalent isocyanate include 2,4-tolylene diisocyanate, 2,6-tolylene diisocyanate, mixed isocyanates of 2,4-tolylene diisocyanate and 2,6-tolylene diisocyanate, P,P'-diphenylmethane diisocyanate, 1,5-naphthylene diisocyanate, para-phenylene diisocyanate, 1,6-hexamethylene diisocyanate, isophorone diisocyanate, and hydrogenated xylylene diisocyanate. Examples of the unsaturated monoalcohol include monoalcohols having an acryloyl group or a methacryloyl group, such as 2-hydroxyethyl acrylate, 2-hydroxyethyl methacrylate, 2-hydroxypropyl acrylate, 2-hydroxypropyl methacrylate, 4-hydroxybutyl acrylate, and 4-hydroxybutyl methacrylate; and monoalcohols having an allyl group, such as allyl alcohol, allyl cellosolve, and trimethyl propane diallyl ether. Among these, 2-isocyanate ethyl acrylate and 2-isocyanate ethyl methacrylate are preferred in terms of ease of the synthesis and high reactivity.

The reaction product (A) is produced through urethane bonding between the hydroxy group in the hydroxy group-containing fluorinated polymer (A-1) and the isocyanato group in the isocyanato group-containing unsaturated compound (A-2).

The amount of fluorine in the reaction product (A) is preferably at least 20% by mass in terms of favorable weather resistance, water and oil repellency, and antifouling properties, more preferably at least 40% by mass in terms of favorable transparency in a wide wavelength range from visible to near infrared wavelengths, and still more preferably at least 50% by mass. The amount of fluorine in the reaction product (A) is preferably 75% by mass at most, more preferably 70% by mass at most, and still more preferably 65% by mass at most, in terms of favorable solubility in acrylic monomers.

The number average molecular weight of the reaction product (A) is preferably at least 1000, more preferably at least 2000, and still more preferably at least 3000 in terms of favorable strength and surface hardness of the cured article obtained by curing a curable composition containing the reaction product (A). The number average molecular weight of the reaction product (A) is preferably 500000 at most for preventing high viscosity to give favorable handleability, more preferably 100000 at most for favorable solubility in acrylic monomers, and still more preferably 50000 at most for low viscosity which leads to favorable handleability of the composition.

The acrylic monomer (B) in the curable resin composition (IX) refers to a monomer having a single or multiple acryloyl groups, methacryloyl groups, 2-fluoroacryloyl groups, or 2-chloroacryloyl groups, and is different from the isocyanato group-containing unsaturated compound (A-2) having a radical reactive group.

The number of the radical-polymerizable unsaturated groups in the acrylic monomer (B) is preferably one for high dissolving in the hydroxy group-containing fluorinated polymer (A-1) and giving low viscosity. The number is more preferably at least 2 for favorable strength of the cured article obtained by curing a curable composition containing the acrylic monomer (B). The number is still more preferably at least 3 for favorable curing rate of the curable composition.

Specific examples of the acrylic monomer (B) include methyl methacrylate (MMA), methacrylic acid (MA), ethyl methacrylate (EMA), n-butyl methacrylate (nBMA), isobutyl methacrylate (iBMA), 2-ethylhexyl methacrylate, 2-hydroxyethyl methacrylate (HEMA), phenyl methacrylate, cyclohexyl methacrylate, 3-(trimethoxysilyl)propyl methacrylate (MSPM), 2-(phenyl phosphoryl)ethyl methacrylate (phenyl-P), 2-hydroxy-3-(1-naphthoxy)propyl methacrylate (HNPM), N-phenyl-N-(2-hydroxy-3-methacryloxy)propyl-glycine (NPG-GMA), ethylene glycol dimethacrylate (EDMA or 1G), diethylene glycol dimethacrylate (DiEDMA), triethylene glycol dimethacrylate (TriEDMA), 1,4-butanediol dimethacrylate (1,4-BuDMA), 1,3-butanediol dimethacrylate (1,3-BuDMA), 1,6-hexanediol diacrylate (16HX), 2,2-bis[4-(2-hydroxy-3-methacryloxy propoxy)phenyl]propane (Bis-GMA), 2,2-bis(4-methacryloxy phenyl)propane (BPDMA), 2,2-bis(4-methacryloxy ethoxy phenyl)propane (Bis-MEPP), 2,2-bis(4-methacryloxypolyethoxyphenyl)propane (Bis-MPEPP), di(methacryloxyethyl)trimethylhexamethylene diurethane (UDMA), trimethylolpropanetrimethacrylate (TMPA), pentaerythritol triacrylate, pentaerythritol tetraacrylate, and dipentaerythritol hexaacrylate (DPEHA), and the acrylates, 2-fluoroacrylates, and 2-chloroacrylates corresponding to these.

Examples of the fluorinated acrylic monomers include
$CH_2=C(CH_3)COOCH_2CF_3$ (3FMA),
$CH_2=C(CH_3)COOCH_2CF_2CF_2H$ (4FMA),
$CH_2=C(CH_3)COOCH_2CF_2CF_3$ (5FMA),
$CH_2=C(CH_3)COOCH_2CF_2CFHCF_3$ (6FMA),
$CH_2=C(CH_3)COOCH_2(CF_2)_3CF_2H$ (8FMA),
$CH_2=C(CH_3)COOCH_2CH_2(CF_2)_3CF_3$ (9FMA),
$CH_2=C(CH_3) COOCH_2 (CF_2)_5CF_2H$ (12FMA),
$CH_2=C(CH_3) COOCH_2CH_2 (CF_2)_5CF_3$ (13FMA),
$CH_2=C(CH_3)COOCH_2CH_2 (CF_2)_7CF_3$ (17FMA),
$CH_2=C(CH_3)COOCH(CF_3)_2$(HFIP-MA),
$CH_2=C(CH_3)COOCH_2CCH_3(CF_3)_2$(6FNP-MA),
$CH_2=C(CH_3) COOCH_2CF (CF_3)OCF_2CF_2CF_3$ (6FOnl-MA), and
the acrylates, 2-fluoroacrylates, and 2-chloroacrylates corresponding to these.

Examples of the 2-fluoroacrylate include
$CH_2=CFCOOCH_2CF_2CF_2H$ (4FFA),
$CH_2=CFCOOCH_2CF_2CF_3$ (5FFA),
$CH_2=CFCOOCH_2(CF_2)_3CF_2H$ (8FFA),
$CH_2=CFCOOCH_2(CF_2)_5CF_2H$ (12FFA), and
$CH_2=CFCOOCH(CF_3)_2$(HFIP-FA)

Among the above acrylic monomers, in terms of excellent dissolving in the hydroxy group-containing fluorinated polymer (A-1), the isocyanato group-containing unsaturated compound (A-2), and the reaction product thereof (A), methyl methacrylate, ethyl methacrylate, methyl acrylate, and ethyl acrylate are preferred.

The mass ratio of the reaction product (A) to the acrylic monomer (B) is preferably 95:5 to 5:95, more preferably 80:20 to 20:80, and still more preferably 70:30 to 30:70. A mass of the reaction product (A) larger than the mass ratio of the reaction product (A) to the acrylic monomer (B) of 95:5 tends to increase the viscosity, decreasing handleability. A mass of the reaction product (A) of smaller than the mass in the mass ratio of the reaction product (A) to the acrylic monomer (B) of 5:95 tends to decrease the fluorine content, thereby decreasing the weather resistance, water and oil repellency, and antifouling properties of the cured article obtained by curing the curable composition.

The viscosity of the curable resin composition at 30° C. is preferably at least 5 mPa·s because too low a viscosity often causes sagging to decrease the handleability. The viscosity is more preferably at least 10 mPa·s for favorable thin-film forming ability, and still more preferably at least 50 mPa·s because it makes shrinkage upon curing small. The viscosity of the curable resin composition at 30° C. is preferably 100000 mPa·s at most because it gives favorable handleability. The viscosity is more preferably 50000 mPa·s at most for spreading the curable composition entirely in mold-processing, and still more preferably 20000 mPa·s at most for favorable leveling properties (surface smoothness) upon formation of a thin film.

The curable resin composition (IX) may further contain a curing agent. The curing agent is a compound which reacts with the curable reactive group of the hydroxy group-containing fluorinated polymer (A-1) for crosslinking. For example, isocyanates free from an unsaturated bond, amino resins, acid anhydrides, polyepoxy compounds, and isocyanato group-containing silane compounds.

Specific examples of the isocyanates free from an unsaturated bond include, but are not limited to, 2,4-tolylene diisocyanate, diphenylmethane-4,4'-diisocyanate, xylylene diisocyanate, isophorone diisocyanate, lysine methyl ester diisocyanate, methylcyclohexyl diisocyanate, trimethyl hexamethylene diisocyanate, hexamethylene diisocyanate, and n-pentane-1,4-diisocyanate, trimers thereof, adduct forms thereof, biuret forms thereof, polymers thereof having at least two isocyanato groups, and further blocked isocyanates.

Specific examples of the amino resins include, but are not limited to, urea resin, melamine resin, benzoguanamine resin, and glycoluril resin. Other examples include methylolated melamine resin obtained by methylolating melamine, and alkyl etherified melamine resin obtained by etherifying methylolated melamine with an alcohol such as methanol, ethanol, or butanol.

Specific examples of the acid anhydrides include, but are not limited to, phthalic anhydride, pyromellitic anhydride, and mellitic anhydride.

The polyepoxy compounds and the isocyanato group-containing silane compounds may be, for example, those described in documents such as JP H2-232250 A and JP H2-232251A. Suitable examples thereof include

[Chem. 40]

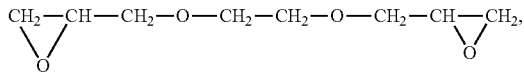

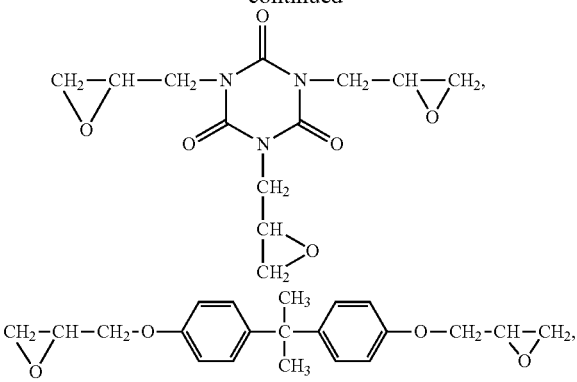

OCNC$_3$H$_6$Si (OC$_2$H$_5$)$_3$, and
OCNC$_2$H$_4$Si (OCH$_3$)$_3$.

The amount of the curing agent is preferably 0.1 to 5 Eq., and preferably 0.5 to 1.5 Eq. per Eq. of chemically curable reactive groups in the hydroxy group-containing fluorinated polymer (A-1). The composition of the present invention can be typically cured in few minutes or about 10 days at 0 to 200° C.

In curing of the curable resin composition, the reaction product (A) and the acrylic monomer (B) are polymerized by UV irradiation. Hence, the curable resin composition may contain a photopolymerization initiator. Specific examples of the photopolymerization initiator include acetophenone compounds such as acetophenone, chloroacetophenone, diethoxy acetophenone, hydroxy acetophenone, and α-aminoacetophenone; benzoin compounds such as benzoin, benzoin methyl ether, benzoin ethyl ether, benzoin isopropyl ether, benzoin isobutyl ether, and benzyl dimethyl ketal; benzophenone compounds such as benzophenone, benzoylbenzoic acid, methyl benzoylbenzoate, 4-phenylbenzophenone, hydroxy benzophenone, hydroxy-propyl-benzophenone, acrylated benzophenone, Michler's ketone, and 2-hydroxy-2-methylpropiophenone; thioxanthones such as thioxanthone, chlorothioxanthone, methyl thioxanthone, diethyl thioxanthone, and dimethyl thioxanthone; and other compounds such as benzyl, α-acyl oxime ester, acyl phosphine oxide, glyoxy ester, 3-ketocoumarin, 2-ethylanthraquinone, camphorquinone, and anthraquinone.

Optionally, known photoinitiator aids such as amines, sulfones, and sulfines may be added.

The curable resin composition (IX) preferably does not contain an organic solvent free from a radical reactive group and a fluorine solvent in that the step of removing the solvent after curing the curable resin composition is unnecessary, and there are no adverse effects such as reduction of the heat resistance, reduction of the strength, and cloudiness caused by the residual solvents.

As in the case of the curable resin composition (VIII), the curing catalysts described above can be used for the curable resin composition (IX).

Depending on the intended use, an organic solvent can also be mixed into the weather resistant organic material.

Examples of the organic solvent include hydrocarbon solvents such as xylene, toluene, Solvesso 100, Solvesso 150, and hexane; ester solvents such as methyl acetate, ethyl acetate, butyl acetate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, ethylene glycol acetate, and diethylene glycol acetate; ether solvents such as dimethyl ether, diethyl ether, dibutyl ether, ethylene glycol monomethyl ether, ethylene glycol monoethyl ether, ethylene glycol monobutyl ether, ethylene glycol dimethyl ether, ethylene glycol diethyl ether, ethylene glycol dibutyl ether, diethylene glycol monomethyl ether, diethylene glycol monoethyl ether, diethylene glycol monobutyl ether, diethylene glycol dimethyl ether, diethylene glycol diethyl ether, diethylene glycol dibutyl ether, and tetrahydrofuran; ketone solvents such as methyl ethyl ketone, methyl isobutyl ketone, and acetone; amide solvents such as N,N-dimethylacetamide, N-methylacetamide, acetamide, N,N-dimethylformamide, N,N-diethylformamide, and N-methylformamide; sulfonate solvents such as dimethyl sulfoxide; and alcohol solvents such as methanol, ethanol, isopropanol, butanol, ethylene glycol, diethylene glycol, polyethylene glycol (degree of polymerization: 3 to 100), $CF_3CH_2OH$, $F(CF_2)_2CH_2OH$, $(CF_3)_2CHOH$, $F(CF_2)_3CH_2OH$, $F(CF_2)_4C_2H_5OH$, $H(CF_2)_2CH_2OH$, $H(CF_2)_3CH_2OH$, and $H(CF_2)_4CH_2OH$. In terms of the compatibility, coating film appearance, and storage stability, alcohol solvents such as lower alcohols and fluorine-containing lower alcohols are preferred.

Regarding the amount ratio between the weather resistant organic material and the alcohol solvent, the amount of the alcohol solvent is 1 to 50 parts by weight for each 100 parts by weight of the weather resistant organic material, and is preferably 1 to 25 parts by weight in terms of the curability and coating film appearance.

In the case of a curing agent having high reactivity with alcohols, such as an ordinary temperature-curable isocyanate, the amount is more preferably 1 to 15 parts by weight, and the alcohols are also preferably secondary or tertiary alcohols.

The curable resin composition can contain a hydrophilization accelerator, and also an ultraviolet absorber and a silane coupling agent, for example, can be added to an adhesive layer between the light-concentrating film and the photovoltaic module.

The adhesive layer is an ordinary-temperature curing adhesive (e.g. urethane, acrylic, silicone, or acrylic-silicone adhesives), a heat-curing adhesive produced from a thermosetting resin such as EVA or PVB, or a UV-curing adhesive.

An ultraviolet absorber, if used, gives better base protection and weather resistance to the coating film.

Specifically, for example, benzophenone, benzotriazole, or triazine ultraviolet absorbers, and cyano acrylate ultraviolet absorbers are suitable. Particularly effective among these are benzophenone ultraviolet absorbers such as 2,2'-dihydroxy-4,4'-dimethoxy benzophenone, 2,2'-dihydroxy-4-methoxybenzophenone, and 2,2',4,4'-tetrahydroxy benzophenone, and benzotriazole ultraviolet absorbers such as 2-(2'-hydroxy-5'-methylphenyl)benzotriazole, 2-(2'-hydroxy-5'-methylphenyl)-5,6-dichlorobenzotriazole, 2-(2'-hydroxy-5'-tert-butylphenyl)benzotriazole, 2-(2'-hydroxy-3',5'-di-tert-butylphenyl)-5-chlorobenzotriazole, 2-(2'-hydroxy-5'-phenylphenyl)-5-chlorobenzotriazole, 2-(2'-hydroxy-3'-tert-butylphenyl)-5-chlorobenzotriazole, 2-(2'-hydroxy-3',5'-di-tert-butylphenyl)benzotriazole, and 2-(2'-hydroxy-5'-tert-octylphenyl)benzotriazole.

Effective cyano acrylate UV absorbers are, for example, 2-ethylhexyl-2-cyano-3,3-diphenylacrylate, and ethyl-2-cyano-3,3-diphenylacrylate.

Particularly suitable UV absorbers are those represented by the following formula:

[Chem. 41]

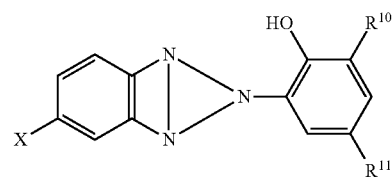

wherein $R^{10}$ and $R^{11}$ are the same as or different from one another, each representing a hydrogen atom, a lower alkyl group (especially a branched lower alkyl group), or an aryl group (especially a phenyl group), and X is a hydrogen atom or a halogen atom, particularly a chlorine atom. Cyano acrylate UV absorbers are particularly preferred because they are less likely to be affected by hydrolysis.

Silane coupling agents impart the recoating adhesion to the coating film. Specific examples of the silane coupling agents include methyl trimethoxysilane, ethyl triethoxysilane, dimethyl dimethoxysilane, trimethyl methoxysilane, vinyl trimethoxysilane, 3-(glycidyloxy)propyl trimethoxysilane, N-(2-aminoethyl)-3-aminopropyl trimethoxysilane, 3-aminopropyl trimethoxysilane, 3-aminopropyl triethoxysilane, 3-mercaptopropyl trimethoxysilane, 3-trimethoxysilylpropyl isocyanate, 3-triethoxysilylpropyl isocyanate, and methyl tris(ethyl methyl ketoxime)silane. Those containing an alkyl ketoxime group or an isocyanato group are preferable. Particularly for favorable recoatability, a silane coupling agent having an isocyanato group or an epoxy group is preferable.

Addition of a hydrophilization accelerator herein helps hydrolysis of the organometallic compounds having high hydrophilizability to promote hydrophilization of the coating film surface. If the resin for coating in the organic material is curable, the addition contributes to promotion of curing of the coating film. Specific examples thereof include ones described as examples for the curing catalyst. In terms of the hydrophilization, organotin compounds and aluminum chelate compounds are preferred.

The weather resistant organic material can be mixed with other additives such as a thickener, a leveling agent, an anti-foaming agent, a film-forming aid, HALS, a matting agent, a filler, colloidal silica, a fungicide, an anti-skinning agent, an antioxidant, a flame retarder, a dripping inhibitor, an antistatic agent, a rust inhibitor, and a water-soluble resin (such as polyvinyl alcohol or polyethylene oxide).

The method of forming a film of an organic material can be a known method suited to the intended use. For example, if the film thickness needs to be controlled, employable methods are roll coating, gravure coating, microgravure coating, flow coating, bar coating, spray coating, die coating, spin coating, dip coating, and batch heat pressing.

A curing method which is optimum for the material is used; still, typically, either one of thermal imprinting or optical imprinting is used. The thermal imprinting includes bringing a thermoplastic material into contact with a mold at a high temperature, and lowering the temperature to release the material from the mold. The optical imprinting includes putting a material, such as a photo-curable resin or sol/gel material, in a mold, irradiating the material with ultraviolet rays to cure the material, and releasing the material from the mold. For the mold release, a known mold release agent such as OPTOOL DSX (trade name, product of Daikin Industries, Ltd.) or DURASURF HD-1100 and 2100 series (trade names, products of HARVES Co., Ltd.).

The light-concentrating film preferably has a light transmittance of at least 81% for light with a wavelength of 600 nm which enters the film at an angle of at least 80° from the normal direction to the film. The light transmittance can be measured by a method using a photodetector, i.e., a method using a variable angle ultraviolet-visible spectrophotometer (product of Otsuka Electronics Co., Ltd.). Alternatively, the light transmittance may be calculated through simulation using an optical design tool Rigorous Coupled Wave Analysis (RCWA).

The thickness of the light-concentrating film may be appropriately set depending on the intended use, but is preferably, for example, 0.03 to 20 mm, and more preferably 0.1 to 5 mm. A thickness in the above range is suitable for light-concentrating films for solar cells.

The film thickness is determined by measuring the maximum thickness of the light-concentrating film using a thickness meter.

The light-concentrating film preferably has a yellow index (ΔYI value) of 20 at most, more preferably 10 at most, and still more preferably 5 at most.

The yellow index (ΔYI value) is determined by measuring the light-concentrating film subjected to a pressure cooker test under a 105° C. and 100% RH atmosphere for 200 hours using a colorimeter.

The light-concentrating film of the present invention can collect even light striking the film at a shallow angle from the in-plane direction of the film, and thus is capable of concentrating light with high efficiency. For this reason, the light-concentrating film, when used for a photovoltaic module, can achieve highly efficient generation (i.e. concentration of light from every direction) with a solar cell which is of a non-sun-tracking type, that is, not of a sun-tracking type that allows the solar cell to move to be oriented to the sun throughout a day. The film also allows the solar cell to collect direct sunlight and diffuse sunlight. This enables efficient collection of diffuse light which could not have been collected, whether it is sunny or cloudy. Hence, such a solar cell can achieve, for example, reduced power generation cost, simple equipment, and reduced cost compared to conventional solar batteries.

The light-concentrating film of the present invention is suitable for solar cells, light concentration uses in buildings, commercial facilities, and common houses, and other uses such as micro fluid devices, optical devices, recording media, and LED diffusers. Examples of the micro fluid devices include micro reactor chips and micro TASs.

Examples of the optical devices include micro lenses and optical elements. The product of the present invention may also be, for example, a biochip, an anti-reflection filter, or a supporting catalyst.

The light-concentrating film of the present invention can be produced by a method including a step of forming a light-concentrating film having alternating concavo-convex structure. In one preferred embodiment, the above production method includes a step of forming a transfer mold (die) having reverse alternating concavo-convex structure (inverted pattern) corresponding to the concavo-convex structure of the film; and a step of forming a light-concentrating film having alternating concavo-convex structure by bringing the die into contact with a film produced from an inorganic or organic material, or a step of forming a light-concentrating film having alternating concavo-convex structure through injection molding with the above die or through molding under heat or ordinary-temperature, or by UV imprinting.

The above transfer mold is another aspect of the present invention. The transfer mold of the present invention is preferably made of a thermoplastic resin, a thermosetting resin, or at least one inorganic material selected from the group consisting of nickel, silicon, quartz, and glass.

The above transfer mold (die) can be produced by photolithography of irradiating a substance with a light source such as electron beams (EB), argon laser (light source wavelength: 363 nm), blue semiconductor laser (light source wavelength: 405 nm), krypton laser (light source wavelength: 413 nm),or helium-cadmium laser (light source wavelength: 442 nm) while changing the intensity depending on the irradiation parts. Developing the resist after the exposure produces a resist master having alternating concavo-convex structure corresponding to the light source intensities of the electron rays radiated. The resist surface of the resist master is subjected to ashing (etching) by plasma, or a metal film is directly deposited on the surface of the developed resist for electroforming, and then the resist is separated from the substrate. Thereby, a metal die is obtained.

Alternatively, the metal film can be directly subjected to a cutting process so that a metal die is produced.

Here, the "reverse alternating concavo-convex structure (inverted pattern) of the concavo-convex structure" refer to the opposite concavo-convex pattern of the alternating concavo-convex pattern of the light-concentrating film, and can, when brought into contact with the target inorganic or organic material, form the alternating concavo-convex structure of the light-concentrating film of the present invention on the material.

The method for bringing the transfer mold into contact with an inorganic or organic material may be, for example, a method that brings the reverse pattern-formed surface of the mold into contact with a film made of an inorganic or organic material to transfer the alternating concavo-convex structure, or a method that subjects the material to injection molding using the mold as a metal pattern.

In another preferred embodiment, the production method of the light-concentrating film includes a step of irradiating a film made of an inorganic or organic material with laser to form a light-concentrating film.

The above resist master is yet another aspect of the present invention. The resist master of the present invention includes a glass substrate and a resist layer formed on at least one surface of the glass substrate. The resist layer has, on the surface opposite to the glass substrate, the same alternating concavo-convex structure as the alternating concavo-convex structure to be formed on the light-concentrating film.

The resist layer is preferably a positive photoresist. Also, the resist layer is preferably a photoresist with a sensitizing agent having a quinone diazide group (e.g. naphthoquinone diazide compound) and a backbone resin such as alkaline soluble resin (e.g. Novolac phenol resin).

The resist master of the present invention can be suitably produced by a production method including the steps of: applying a coating liquid containing a photoresist to a glass substrate, and drying the liquid to form a coating film; firing the coating film to form a resist layer on the glass substrate; irradiating the resist layer with laser to form an exposure pattern; and removing the resist at the exposure region using a developer, washing the resulting product, and thereby obtaining a resist master having alternating concavo-convex structure.

The laser for exposure can be, for example, the above-mentioned electron beams (EB), argon laser (light source wavelength: 363 nm), blue semiconductor laser (light source wavelength: 405 nm), krypton laser (light source wavelength: 413 nm), or helium-cadmium laser (light source wavelength: 442 nm).

The thickness of the resist film is preferably 1 to 50 µm to produce a transfer mold having the reverse alternating concavo-convex structure of the desired alternating concavo-convex structure.

The light-concentrating film of the present invention can be used in various optical fields. For example, the light concentrated by the light-concentrating film can be used for solar cells, and lightings in buildings, commercial facilities, and common houses. For the lighting use, the light can be used for lighting (e.g. LEDs) in plant factories and as a substitute for a TV backlight.

The light-concentrating film of the present invention can also diffuse the incident light, and is also useful as a substitute for a diffusion plate for diffusing light emitted from an LED light source used in, for example, an LED television.

A photovoltaic module including the light-concentrating film of the present invention is yet another aspect of the present invention. The photovoltaic module of the present invention, having the above light-concentrating film, can concentrate light at a wide range of angles, and thus can generate power with high efficiency even when it is used for a non-sun-tracking solar cell. The photovoltaic module can be used for both sun-tracking and non-sun-tracking solar cells but, with the light concentrating ability at a wide range of angles, is preferably used for non-sun-tracking solar cells. The photovoltaic module of the present invention may be a flexible solar cell which is flexible.

The photovoltaic module of the present invention is preferably installed to allow the smooth surface of the light-concentrating film to be exposed to the air. The light-concentrating film of the present invention is not required to receive the sunlight on the surface with alternating fine concavo-convex structure, and can concentrate light with high light-concentration efficiency even when the smooth surface of the light-concentrating film is set to be exposed to the air. Setting the smooth surface of the light-concentrating film to be exposed to the air leads to high antifouling properties.

Figure 13:
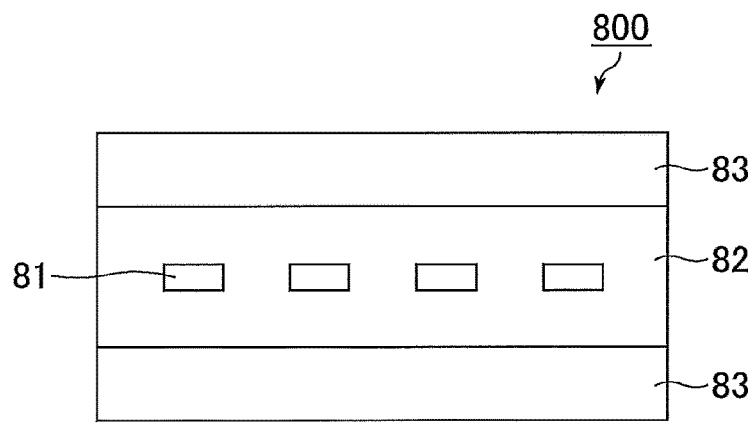
FIG. 13 is a view schematically illustrating an embodiment of the photovoltaic module of the present invention.

The photovoltaic module of the present invention is also a photovoltaic module including: a solar battery cell; a sealing material layer with the solar battery cell sealed inside; and a light-concentrating film formed on either or both sides of the sealing material layer. FIG. 13 is a cross-sectional view schematically illustrating one embodiment of the photovoltaic module of the present invention. A photovoltaic module 800 in the present embodiment has solar battery cells 81, a sealing material layer 82 with the solar battery cells 81 sealed inside, and a light-concentrating film 83 formed on each side of the sealing material layer 82.

Figure 14:
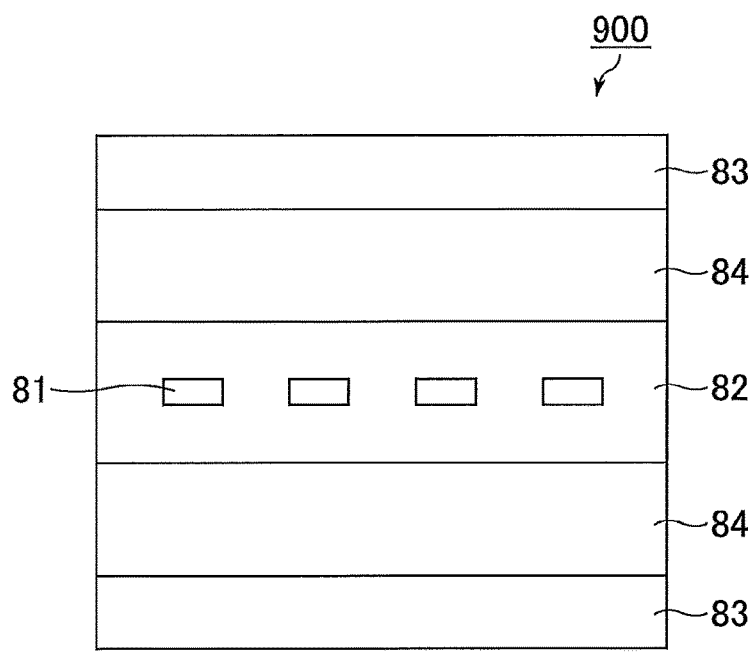
FIG. 14 is a view schematically illustrating another embodiment of the photovoltaic module of the present invention.

The photovoltaic module of the present invention is also a photovoltaic module including: a solar battery cell; a sealing material layer with the solar battery cell sealed inside; a translucent layer formed on either or both sides of the sealing material layer; and the light-concentrating film formed on the translucent layer. FIG. 14 is a cross-sectional view illustrating one embodiment of the photovoltaic module of the present invention. A photovoltaic module 900 in the present embodiment has the solar battery cells 81, the sealing material layer 82 with the solar battery cells 81 sealed inside, a translucent layer 84 formed on each side of the sealing material layer 82, and the light-concentrating films 83 formed on the respective translucent layers 84. A translucent layer may be formed on each side of the sealing material layer, and a light-concentrating film may be formed only on either one of the translucent layers.

The solar battery cell may be any solar battery cell that can generate power upon reception of light, such as a solar battery cell formed through a pn junction between an n-type semiconductor and a p-type semiconductor. The n-type semiconductor and the p-type semiconductor used are not particularly limited, and may each be formed using a material typically used for solar batteries. Examples thereof include group IV semiconductors such as Si and Ge, group III-V compound semiconductors such as GaAs, InP, and AlGaAs, group II-VI compound semiconductors such as CdS, CdTe, and $Cu_2S$, group I-III-VI compound semiconductors such as $CuInSe_2$, $CuInS_2$, and $Cu(In,Ga)Se_2$, organic semiconductors such as phthalocyanine and polyacetylene, triple-junction laminates such as InGaP/(In)GaAs/Ge, and semiconductors such as CdTe. Any of crystalline solar battery cells, amorphous solar battery cells, and microcrystalline solar battery cells can be used. Furthermore, the solar battery cell, whether it forms a quantum effect solar type or dye sensitizing type solar cell, can concentrate light at a wide range of angles, and therefore can generate power with high efficiency whether it forms a sun-tracking or non-sun-tracking solar cell. Typically, a solar cell includes wirings connected to the solar battery cells.

The photovoltaic module of the present invention may include a focusing element having a structure to which a cylindrical Fresnel lens and a light-concentrating film are attached via an adhesive layer respectively, or having a structure to which a light-concentrating film is only attached via an adhesive layer; and a solar battery cell. A photovoltaic module with a focusing element having a Fresnel lens and a light-concentrating film concentrates light in the plane using the light-concentrating film, further concentrates the light to one point using the Fresnel lens, and receives the concentrated light on the solar battery cell. In this way, light concentration is achieved by providing a distance between the focusing element and the solar battery cell. Accordingly, the size of the solar battery cell can be reduced, and thus the cost can be reduced.

Since the light-concentrating film of the present invention can be used for a focusing element and can concentrate light at a wide range of angles, the in-plane light-concentration efficiency of the focusing element can be significantly increased. The focusing element here is only required to have the above light-concentrating film, and may have a shape such as a plane or a dome (semi-sphere). The focusing element preferably has a lens as well as the light-concentrating film. Examples of the lens include, but are not particularly limited to, prism lens, fly eye lens, a lens array, linear Fresnel lens, cylindrical Fresnel lens, the later-described Fresnel lens, and lenticular lens.

The lens is preferably made of a fluororesin. When the lens is made of a fluororesin, the durability of the lens as a focusing element is improved to be suitable for uses such as solar cells. Preferred examples of the fluororesin used for the lens include the fluororesins mentioned above as the examples for the light-concentrating film. The fluororesin is preferably at least one fluororesin selected from the group consisting of ETFE, PCTFE, EFEP, FEP, and PVdF.

The focusing element can further have at least one lens selected from the group consisting of a Fresnel lens and a lenticular lens, as well as the light-concentrating film. The Fresnel lens and the lenticular lens may respectively be any lenses commonly called a Fresnel lens and a lenticular lens. Thereby, the light beams from every direction concentrated in the plane of the light-concentrating film can be further concentrated to one point by the Fresnel lens or the lenticular lens. The light-concentrating film alone can concentrate the light beams from every direction, but use of the light-concentrating film together with a Fresnel lens or a lenticular lens improves the control of the light-concentrating distance and light density, thereby easily, significantly increasing the power generation efficiency.

Controlling the results of the computer-generated hologram enables the light-concentrating film of the present invention to concentrate sunlight in the plane, and to have a function of concentrating light, with high precision, to one point in a more uniform and more aplanatic way than a conventional Fresnel lens and a lenticular lens.

Yet another aspect of the present invention is an organic thin film photovoltaic module, including alternating fine concavo-convex structure on at least one surface, the module having a concavo-convex height (H) of 0.05 to 15 µm and a concavo-convex pitch (P) of 0.05 to 50 µm. The organic thin film photovoltaic module of the present invention, having fine concavo-convex shapes on the surface, allows light concentration at a wide range of angles, and allows, when used for a non-sun-tracking solar cell, highly efficient power generation. The fine concavo-convex shapes are preferably formed on the surface where the light hits the film. Examples of the organic thin film photovoltaic module of the present invention include an organic thin film photovoltaic module having a barrier layer with fine concavo-convex shapes, a film substrate, a transparent electrode (positive electrode), a positive hole transport layer, an active layer, a hole block layer, an electrode (negative electrode), and a barrier layer. The method of forming the concavo-convex shapes is the same as described above.

Yet another aspect of the present invention is an organic thin film photovoltaic module including the light-concentrating film of the present invention. The organic thin film photovoltaic module of the present invention, having the light-concentrating film, allows light concentration at a wide range of angles, and allows, even when used for a non-sub-tracking solar cell, highly efficient power generation. The organic thin film photovoltaic module can be used for both sun-tracking and non-sun-tracking solar cells but, with the light concentrating ability at a wide range of angles, is particularly suitable for a non-sun-tracking solar cell. The organic thin film photovoltaic module of the present invention is preferably installed to allow the smooth surface of the light-concentrating film to be exposed to the air. Examples of the organic thin film photovoltaic module of the present invention include an organic thin film photovoltaic module having a light-concentrating film, a transparent electrode (positive electrode), a positive hole transport layer, an active layer, a positive hole block layer, an electrode (negative electrode), and a sealing substrate. A film substrate may be provided between the light-concentrating film and the transparent electrode.

EXAMPLES

The present invention is described based on examples and comparative examples below. The present invention is not limited to the examples.

Example 1

Studies 1 to 9

(1) Simulation Computation of Light Concentration

The theoretical concavo-convex pattern was simulation-computed for the case where the light-concentration film has a transmittance of light having a wavelength of 600 nm of at least 81% when the light hits the film at an angle of at least 80° from the normal direction of the film, using an optical design tool Rigorous Coupled Wave Analysis (RCWA). Here, the theoretical concavo-convex pattern of the light-concentrating film was computed assuming that the refractive index of the material constituting the film was 1.40, the (maximum) thickness of the film was 50 µm, and the wavelength of the incident light was 600 nm.

(2) Production Example 1 of Transfer Mold

The computed pattern data of the theoretical concavo-convex pattern was converted to the DXF data format, with which conversion CAD data was drawn on a resist film substrate using a drawing device, whereby 24-mm square transfer molds (dies) were produced. Here, the 24-mm square transfer molds were connected side by side to form a master. Nickel was directly deposited on the master, and the metal mold made of nickel, formed on the master, was separated from the master. This method also allows production of a large mold (large transfer mold (die)) with 1-m squares.

(3) Production Example 2 of Transfer Mold

Direct laser photolithography was used to produce a transfer mold (die) having the reverse alternating concavo-convex structure of the desired light-concentrating concavo-convex pattern of the light-concentrating film which was computed by RCWA. That is, a resist (AZ1350: product of Clariant) applied to a glass substrate to a thickness of 10 µm was irradiated with blue semiconductor laser (light source wavelength: 405 nm) with different intensities depending on the sites.

The resist was developed using a developer (AZ-Developer produced by Clariant) at a room temperature of 20° C. for a developing time of 1 minute with swinging, which resulted in a resist master having a resist film with rectangular concavo-convex shapes formed depending on intensities of the irradiation light source. Nickel was directly deposited on the resist film, and the metal pattern formed on the resist film was separated from the resist film. Nine transfer molds were produced by this method. The concavo-convex height (H) and the concavo-convex pitch (P) of each transfer mold are shown in Table 1.

(4) Production of Light-Concentrating Film

An ETFE film was used as an organic material film for forming alternating fine concavo-convex structure (light-concentrating concavo-convex pattern).

Using a nanoimprinting device NANOIMPRINTER NM-0501 (produced by MEISYO KIKO Co., Ltd.), the 9 transfer molds shown in Table 1 each were pressed against an ETFE film (Neoflon ETFE produced by Daikin Industries, Ltd., thermal deformation temperature: 104° C., film thickness: 100 µm), which is an organic material, for 3 minutes at 2500° C. under a pressure of 4 MPa.

Thereby, 9 light-concentrating films having concavo-convex parts with a peripheral shape of a hexagon and a cross-sectional shape of a parabola, as illustrated in FIG. 2, were formed. The average transmittance of each of these films was determined. The results are shown in Table 2.

Figure 18:
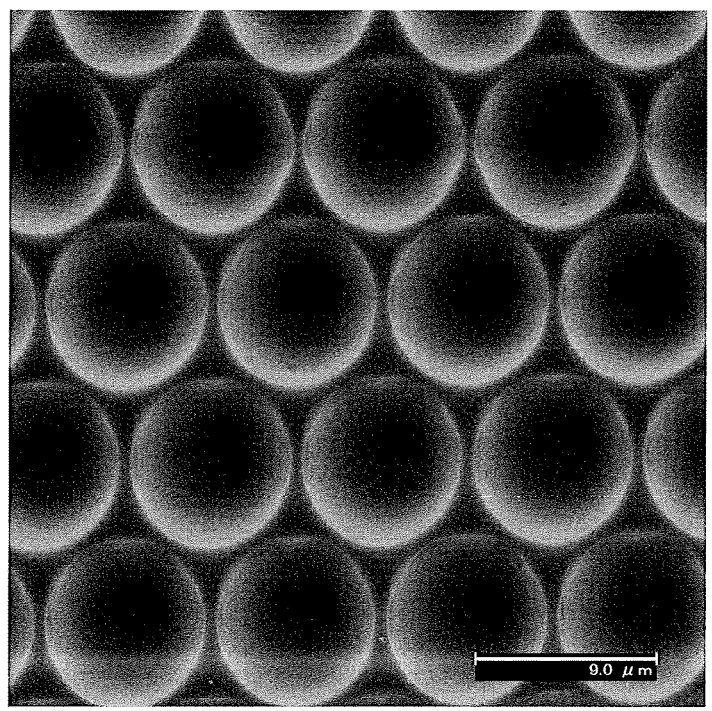
FIG. 18 is an electron microscope photograph of the surface of the light-concentrating film produced in Example 1 (Study 7).

The pattern cross-sectional shape formed on the surface of each of the produced light-concentrating films was observed using a laser probe type non-contact surface profile measurement device (produced by Mitaka Kohki Co., Ltd.) or laser confocal microscope (produced by KEYENCE CORP.). As a result, the obtained light-concentrating films were observed to have the respective shapes of the molds transferred precisely, and have a cross-sectional shape of a parabola as illustrated in FIG. 9 and FIG. 16. The surface of the produced light-concentrating film (Study 7) was observed with a scanning electron microscope (SEM) (S4000 produced by Hitachi, Ltd.). The photograph taken is shown in FIG. 18.

Comparative Example

To evaluate the light-concentrating abilities of the light-concentrating films of Example 1, the transmittances of the films were compared to those of an optical film with a conventional moth-eye structure (cone with a base diameter of 0.1 μm and a height of 0.3 μm) and an unprocessed fluororesin film (ETFE) without a surface concavo-convex pattern (Table 2).

As a result, the light-concentrating films of Example 1 each had a greatly increased light-concentrating ability for light beams with an angle of incidence of at least 80° from the normal direction, compared to the films of Comparative Example.

TABLE 1

|  | P [μm] | H [μm] |
| --- | --- | --- |
| Study 1 | 0.1 | 5.4 |
| Study 2 | 0.3 | 5.4 |
| Study 3 | 0.6 | 5.4 |
| Study 4 | 1.1 | 5.4 |
| Study 5 | 2.3 | 5.4 |
| Study 6 | 4.5 | 5.4 |
| Study 7 | 9.0 | 5.4 |
| Study 8 | 18.0 | 5.4 |
| Study 9 | 36.0 | 5.4 | roresin film to transfer the concavo-convex pattern to the fluororesin film; subjecting the film to an adhesion process using rolls; and cutting the film into desired sizes using a cutter.

(Method for Producing Photovoltaic Module Having Light Concentrating Ability)

A light-concentrating film produced by the above method is adhered to the surface of a photovoltaic module using, for example, an urethane adhesive, ionomer, silicone resin, thermoplastic resin, or thermoplastic resin (EVA) containing a thermoset, so that a light-concentrating module is formed. Such a light-concentrating module serving as a photovoltaic module was placed to cover the entire surface to obtain a focusing element with an ability to concentrate light from every direction. Accordingly, highly efficient solar cell power generation can be achieved.

Example 2

A light-concentrating film having a concavo-convex pattern was prepared in the same manner as in Example 1, except that, during the use of a nanoimprinting device (NANOIMPRINTER NM-0501, produced by Meisyo Kiko Co., Ltd.), an UV coating layer (PAK-01: produced by Toyo Gosei Co., Ltd.) having a thickness of 10 μm was formed on the surface of a transfer base, and a transfer mold was pressed against the UV coating layer at a pressure of 1 MPa and room temperature for one minute, with irradiation of 2000 mJ of ultra violet light.

Example 3

Studies 10 to 15

In the same manner as in Example 1, 6 light-concentrating films each having concavo-convex parts the shapes of which

TABLE 2

| Angle of incidence (°) | Example 1 | | | | | | | | | Comparative Example | |
| --- | --- | --- | --- | --- | --- | --- | --- | --- | --- | --- | --- |
| | Study 1 | Study 2 | Study 3 | Study 4 | Study 5 | Study 6 | Study 7 | Study 8 | Study 9 | Moth-eye film | Unprocessed fluororesin film |
| 0.0 | 99.9 | 99.9 | 99.9 | 99.9 | 99.9 | 99.3 | 99.4 | 99.9 | 99.9 | 99.8 | 97.2 |
| 5.0 | 99.9 | 99.9 | 99.9 | 99.9 | 99.9 | 99.5 | 99.4 | 99.9 | 99.9 | 99.8 | 97.2 |
| 10.0 | 99.9 | 99.9 | 99.9 | 99.9 | 99.9 | 99.7 | 99.4 | 99.9 | 99.9 | 99.8 | 97.3 |
| 15.0 | 99.9 | 99.9 | 99.9 | 99.9 | 99.9 | 99.8 | 99.5 | 99.9 | 99.9 | 99.8 | 97.4 |
| 20.0 | 99.9 | 99.9 | 99.9 | 99.9 | 99.9 | 99.8 | 99.6 | 99.9 | 99.9 | 99.8 | 97.7 |
| 25.0 | 99.9 | 99.9 | 99.9 | 99.9 | 99.9 | 99.8 | 99.7 | 99.9 | 99.9 | 99.8 | 97.9 |
| 30.0 | 99.9 | 99.9 | 99.9 | 99.9 | 99.9 | 99.8 | 99.8 | 99.9 | 99.9 | 99.9 | 98.3 |
| 35.0 | 99.9 | 99.9 | 99.9 | 99.9 | 99.9 | 99.8 | 99.8 | 99.9 | 99.9 | 99.9 | 98.7 |
| 40.0 | 99.9 | 99.9 | 99.9 | 99.9 | 99.9 | 99.8 | 99.9 | 99.9 | 99.9 | 99.9 | 99.1 |
| 45.0 | 99.9 | 99.9 | 99.9 | 99.9 | 99.9 | 99.8 | 99.9 | 99.9 | 99.9 | 99.8 | 99.5 |
| 50.0 | 99.9 | 99.9 | 99.9 | 99.9 | 99.9 | 99.8 | 99.9 | 99.9 | 99.9 | 99.7 | 99.8 |
| 55.0 | 99.9 | 99.9 | 99.9 | 99.9 | 99.9 | 99.8 | 99.9 | 99.9 | 99.9 | 99.5 | 99.9 |
| 60.0 | 99.9 | 99.9 | 99.9 | 99.9 | 99.9 | 99.8 | 99.9 | 99.9 | 99.9 | 99.1 | 99.6 |
| 65.0 | 99.9 | 99.9 | 99.9 | 99.9 | 99.9 | 99.8 | 99.8 | 99.8 | 99.7 | 98.1 | 98.4 |
| 70.0 | 99.9 | 99.9 | 99.9 | 99.9 | 99.9 | 99.8 | 99.8 | 99.7 | 99.5 | 96.0 | 95.3 |
| 75.0 | 99.9 | 99.9 | 99.9 | 99.9 | 99.9 | 99.7 | 99.6 | 99.7 | 99.4 | 91.1 | 88.9 |
| 80.0 | 99.7 | 99.7 | 99.7 | 99.6 | 99.8 | 99.3 | 97.9 | 97.9 | 98.6 | 80.0 | 75.9 |
| 85.0 | 94.2 | 94.1 | 93.8 | 92.8 | 94.4 | 91.5 | 89.1 | 88.9 | 89.4 | 55.2 | 50.4 |
| Average transmittance (%) | 99.5 | 99.5 | 99.5 | 99.4 | 99.5 | 99.2 | 99.0 | 99.1 | 99.1 | 95.3 | 93.8 |

Figure 15:
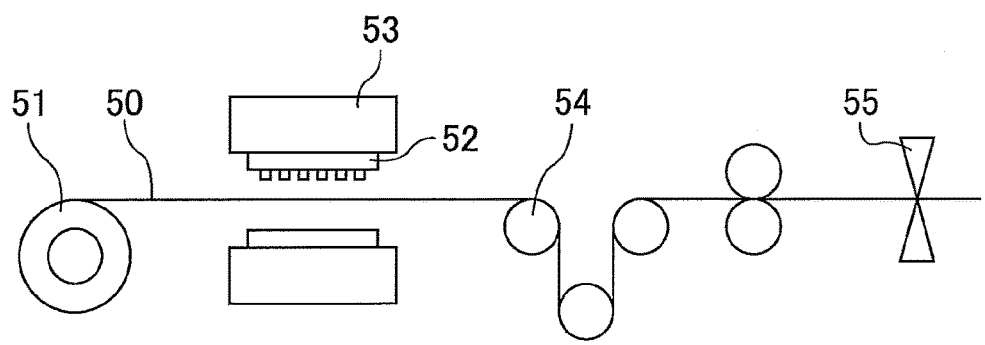
FIG. 15 is a schematic view illustrating an example of the process of forming a light-concentrating film by bringing a transfer mold (die) into contact with an organic material.

(Continuous Production Method of Light-Concentrating Film) A light-concentrating film capable of concentrating light from every direction can also be formed by, as illustrated in FIG. 15, continuously pulling a fluororesin film of ETFE or FEP (trade name: Neoflon ETFE or FEP, produced by Daikin Industries, Ltd.) off a film roll; using an imprinting device, bringing a die having the reverse pattern of the desired concavo-convex pattern into contact with the fluoare convex quadrangular pyramids were formed, and the transmittance of each film was measured. The peripheral shape of each concavo-convex part was a quadrangle as illustrated in FIG. 11, where the peripheries formed concave parts and the cross-sectional shape of the concavo-convex parts was a substantial isosceles triangle. The concavo-convex height (H) and the concavo-convex pitch (P) of each transfer mold are shown in Table 3. The average transmittance of each light-concentrating film is shown in Table 4.

TABLE 3

|  | P [μm] | H [μm] |
|---|---|---|
| Study 10 | 1.13 | 5.4 |
| Study 11 | 2.25 | 5.4 |
| Study 12 | 4.5 | 5.4 |
| Study 13 | 9 | 5.4 |
| Study 14 | 18 | 5.4 |
| Study 15 | 36 | 5.4 |

TABLE 4

| Angle of incidence (°) | Example 3 | | | | | |
|---|---|---|---|---|---|---|
| | Study 10 | Study 11 | Study 12 | Study 13 | Study 14 | Study 15 |
| 0.0 | 99.9 | 99.9 | 99.9 | 99.9 | 99.9 | 99.9 |
| 5.0 | 99.9 | 99.9 | 99.9 | 99.9 | 99.9 | 99.9 |
| 10.0 | 99.9 | 99.9 | 99.9 | 99.9 | 99.9 | 99.9 |
| 15.0 | 99.9 | 99.9 | 99.9 | 99.9 | 99.9 | 99.9 |
| 20.0 | 99.9 | 99.9 | 99.9 | 99.9 | 99.9 | 99.9 |
| 25.0 | 99.9 | 99.9 | 99.9 | 99.9 | 99.9 | 99.9 |
| 30.0 | 99.9 | 99.9 | 99.9 | 99.9 | 99.9 | 99.9 |
| 35.0 | 99.9 | 99.9 | 99.9 | 99.9 | 99.9 | 99.9 |
| 40.0 | 99.9 | 99.9 | 99.9 | 99.9 | 99.9 | 99.9 |
| 45.0 | 99.9 | 99.9 | 99.9 | 99.9 | 99.9 | 99.9 |
| 50.0 | 99.9 | 99.9 | 99.9 | 99.9 | 99.9 | 99.9 |
| 55.0 | 99.9 | 99.9 | 99.9 | 99.9 | 99.9 | 99.9 |
| 60.0 | 99.9 | 99.9 | 99.9 | 99.9 | 99.9 | 99.9 |
| 65.0 | 99.9 | 99.9 | 99.9 | 99.9 | 99.9 | 99.9 |
| 70.0 | 99.9 | 99.9 | 99.6 | 99.9 | 99.9 | 99.8 |
| 75.0 | 99.9 | 99.9 | 98.8 | 99.4 | 99.8 | 99.6 |
| 80.0 | 99.3 | 99.8 | 94.6 | 95.7 | 96.5 | 98.7 |
| 85.0 | 91.2 | 92.6 | 88 | 76.5 | 76.9 | 81.5 |
| Average transmittance (%) | 99.4 | 99.5 | 98.9 | 98.3 | 98.4 | 98.8 |

Example 4

Studies 16 to 21

In the same manner as in Example 1, 6 light-concentrating films each having concavo-convex parts the shapes of which are convex triangular pyramids were formed, and the transmittance of each film was measured. The peripheral shape of the concavo-convex part was a triangle as illustrated in FIG. 12, where the cross-sectional shape of the concavo-convex parts was a substantial isosceles triangle. The concavo-convex height (H) and the concavo-convex pitch (P) of each transfer mold are shown in Table 5. The average transmittance of each light-concentrating film is shown in Table 6.

TABLE 5

|  | P [μm] | H [μm] |
|---|---|---|
| Study 16 | 1.13 | 5.4 |
| Study 17 | 2.25 | 5.4 |
| Study 18 | 4.5 | 5.4 |
| Study 19 | 9 | 5.4 |
| Study 20 | 18 | 5.4 |
| Study 21 | 36 | 5.4 |

TABLE 6

| Angle of incidence (°) | Example 4 | | | | | |
|---|---|---|---|---|---|---|
| | Study 16 | Study 17 | Study 18 | Study 19 | Study 20 | Study 21 |
| 0.0 | 99.9 | 99.9 | 99.9 | 99.9 | 99.9 | 99.9 |
| 5.0 | 99.9 | 99.9 | 99.9 | 99.9 | 99.9 | 99.9 |
| 10.0 | 99.9 | 99.9 | 99.9 | 99.9 | 99.9 | 99.9 |
| 15.0 | 99.9 | 99.9 | 99.9 | 99.9 | 99.9 | 99.9 |
| 20.0 | 99.9 | 99.9 | 99.9 | 99.9 | 99.9 | 99.9 |
| 25.0 | 99.9 | 99.9 | 99.9 | 99.9 | 99.9 | 99.9 |
| 30.0 | 99.9 | 99.9 | 99.9 | 99.9 | 99.9 | 99.9 |
| 35.0 | 99.9 | 99.9 | 99.9 | 99.9 | 99.9 | 99.9 |
| 40.0 | 99.9 | 99.9 | 99.9 | 99.9 | 99.9 | 99.9 |
| 45.0 | 99.9 | 99.9 | 99.9 | 99.9 | 99.9 | 99.9 |
| 50.0 | 99.9 | 99.9 | 99.9 | 99.9 | 99.9 | 99.9 |
| 55.0 | 99.9 | 99.9 | 99.9 | 99.9 | 99.9 | 99.9 |
| 60.0 | 99.9 | 99.9 | 99.9 | 99.9 | 99.9 | 99.9 |
| 65.0 | 99.9 | 99.9 | 99.9 | 99.9 | 99.9 | 99.9 |
| 70.0 | 99.9 | 99.9 | 99.9 | 99.9 | 99.9 | 99.9 |
| 75.0 | 99.9 | 99.9 | 99.9 | 99.9 | 99.9 | 99.9 |
| 80.0 | 99.6 | 99.5 | 98.1 | 98.9 | 99.3 | 99.7 |
| 85.0 | 91.1 | 92.4 | 93.3 | 86.6 | 90.8 | 92.2 |
| Average transmittance (%) | 99.4 | 99.5 | 99.4 | 99.1 | 99.4 | 99.5 |

Example 5

Studies 22 to 27

In the same manner as in Example 1, 6 light-concentrating films each having concavo-convex parts the shapes of which are concave quadrangular pyramids were formed, and the transmittance of each film was measured. The peripheral shape of the concavo-convex part was a quadrangle as illustrated in FIG. 11, where the peripheries formed convex parts and the cross-sectional shape of the concavo-convex parts was a substantial isosceles triangle as illustrated in FIGS. 7 and 8. The concavo-convex height (H) and the concavo-convex pitch (P) of each transfer mold are shown in Table 7. The average transmittance of each light-concentrating film is shown in Table 8.

TABLE 7

|  | P [μm] | H [μm] |
|---|---|---|
| Study 22 | 1.13 | 5.4 |
| Study 23 | 2.25 | 5.4 |
| Study 24 | 4.5 | 5.4 |
| Study 25 | 9 | 5.4 |
| Study 26 | 18 | 5.4 |
| Study 27 | 36 | 5.4 |

TABLE 8

| Angle of incidence (°) | Example 5 | | | | | |
|---|---|---|---|---|---|---|
| | Study 22 | Study 23 | Study 24 | Study 25 | Study 26 | Study 27 |
| 0.0 | 99.9 | 99.9 | 99.9 | 100 | 99.9 | 99.9 |
| 5.0 | 99.9 | 99.9 | 99.9 | 100 | 99.9 | 99.9 |
| 10.0 | 99.9 | 99.9 | 99.9 | 100 | 99.9 | 99.9 |
| 15.0 | 99.9 | 99.9 | 99.9 | 100 | 99.9 | 99.9 |
| 20.0 | 99.9 | 99.9 | 99.9 | 100 | 99.9 | 99.9 |
| 25.0 | 99.9 | 99.9 | 99.9 | 100 | 99.9 | 99.9 |
| 30.0 | 99.9 | 99.9 | 99.9 | 100 | 99.9 | 99.9 |
| 35.0 | 99.9 | 99.9 | 99.9 | 100 | 99.9 | 99.9 |
| 40.0 | 99.9 | 99.9 | 99.9 | 99.9 | 99.9 | 99.9 |
| 45.0 | 99.9 | 99.9 | 99.9 | 99.9 | 99.9 | 99.9 |
| 50.0 | 99.9 | 99.9 | 99.9 | 99.9 | 99.9 | 99.9 |

TABLE 8-continued

| Angle of incidence (°) | Example 5 | | | | | |
|---|---|---|---|---|---|---|
| | Study 22 | Study 23 | Study 24 | Study 25 | Study 26 | Study 27 |
| 55.0 | 99.9 | 99.9 | 99.9 | 99.9 | 99.9 | 99.9 |
| 60.0 | 99.9 | 99.9 | 99.9 | 99.8 | 99.8 | 99.9 |
| 65.0 | 99.9 | 99.9 | 99.8 | 99.7 | 99.8 | 99.7 |
| 70.0 | 99.6 | 99.6 | 99.7 | 99.6 | 99.6 | 99.5 |
| 75.0 | 98.5 | 99.1 | 99.1 | 99.2 | 98.6 | 98.6 |
| 80.0 | 93.6 | 95.5 | 95.8 | 96.6 | 96.9 | 97.2 |
| 85.0 | 74.2 | 77.9 | 80.1 | 82.1 | 84.9 | 86 |
| Average transmittance (%) | 98 | 98.4 | 98.5 | 98.7 | 98.8 | 98.9 |

Example 6

Studies 28 to 33

In the same manner as in Example 1, 6 light-concentrating films each having concavo-convex parts the shapes of which are concave triangular pyramids were formed, and the transmittance of each film was measured. The peripheral shape of the concavo-convex part was a triangle as illustrated in FIG. 12, where the peripheries formed convex parts and the cross-sectional shape of the concavo-convex parts was a substantial isosceles triangle as illustrated in FIG. 7. The concavo-convex height (H) and the concavo-convex pitch (P) of each transfer mold are shown in Table 9. The average transmittance of each light-concentrating film is shown in Table 10.

TABLE 9

| | P [μm] | H [μm] |
|---|---|---|
| Study 28 | 1.13 | 5.4 |
| Study 29 | 2.25 | 5.4 |
| Study 30 | 4.5 | 5.4 |
| Study 31 | 9 | 5.4 |
| Study 32 | 18 | 5.4 |
| Study 33 | 36 | 5.4 |

TABLE 10

| Angle of incidence (°) | Example 6 | | | | | |
|---|---|---|---|---|---|---|
| | Study 28 | Study 29 | Study 30 | Study 31 | Study 32 | Study 33 |
| 0.0 | 99.9 | 99.9 | 99.9 | 99.8 | 99.8 | 99.8 |
| 5.0 | 99.9 | 99.9 | 99.9 | 99.8 | 99.8 | 99.8 |
| 10.0 | 99.9 | 99.9 | 99.9 | 99.8 | 99.8 | 99.8 |
| 15.0 | 99.9 | 99.9 | 99.9 | 99.8 | 99.8 | 99.8 |
| 20.0 | 99.9 | 99.9 | 99.9 | 99.8 | 99.8 | 99.8 |
| 25.0 | 99.9 | 99.9 | 99.9 | 99.8 | 99.8 | 99.8 |
| 30.0 | 99.9 | 99.9 | 99.9 | 99.9 | 99.8 | 99.8 |
| 35.0 | 99.9 | 99.9 | 99.9 | 99.9 | 99.9 | 99.9 |
| 40.0 | 99.9 | 99.9 | 99.9 | 99.9 | 99.9 | 99.9 |
| 45.0 | 99.9 | 99.9 | 99.9 | 99.9 | 99.9 | 99.9 |
| 50.0 | 99.9 | 99.9 | 99.9 | 99.9 | 99.9 | 99.9 |
| 55.0 | 99.9 | 99.9 | 99.9 | 99.9 | 99.9 | 99.9 |
| 60.0 | 99.9 | 99.9 | 99.9 | 99.9 | 99.8 | 99.9 |
| 65.0 | 99.9 | 99.8 | 99.8 | 99.8 | 99.8 | 99.7 |
| 70.0 | 99.8 | 99.7 | 99.5 | 99.6 | 99.7 | 99.6 |
| 75.0 | 98.6 | 99.2 | 98.9 | 98.8 | 99 | 99 |

TABLE 10-continued

| Angle of incidence (°) | Example 6 | | | | | |
|---|---|---|---|---|---|---|
| | Study 28 | Study 29 | Study 30 | Study 31 | Study 32 | Study 33 |
| 80.0 | 93.6 | 95.9 | 95.6 | 95.6 | 96.4 | 97.5 |
| 85.0 | 74.1 | 78.7 | 79.2 | 79.8 | 82.1 | 85.1 |
| Average transmittance (%) | 98 | 98.4 | 98.4 | 98.4 | 98.6 | 98.8 |

Example 7

Figure 17:
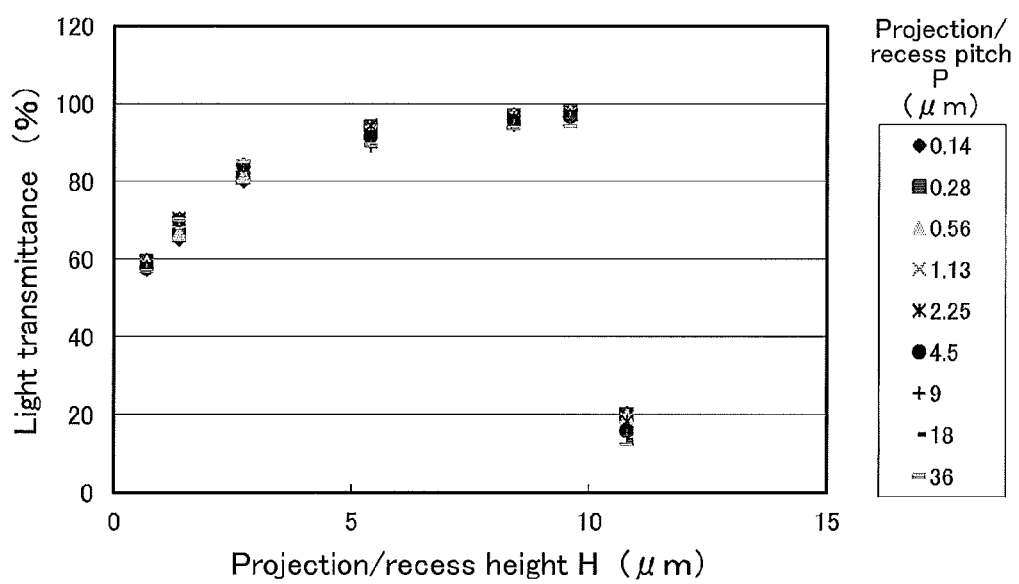
FIG. 17 is a graph showing the light transmittance of the light-concentrating films produced in Example 7.

In the same manner as in Example 1, 63 light-concentrating films having different concavo-convex heights (H) and concavo-convex pitches (P) were produced. The obtained light-concentrating films were irradiated with light at an angle of incidence of 850 from the normal direction (an angle to a horizontal plane of 50) to measure the transmittance of the light. The shape of the concavo-convex parts is the same as in Example 1. The results are shown in Table 11 and FIG. 17.

TABLE 11

| | | Projection/recess height H (μm) | | | | | | |
|---|---|---|---|---|---|---|---|---|
| | | 0.68 | 1.35 | 2.7 | 5.4 | 8.4 | 9.6 | 10.8 |
| Projection/recess pitch P (μm) | 0.14 | 59.7 | 65.1 | 80.1 | 94.2 | 97.2 | 98.2 | 20.3 |
| | 0.28 | 59.4 | 66.2 | 80.9 | 94.1 | 97 | 98 | 20.1 |
| | 0.56 | 59.1 | 66.7 | 81.4 | 93.8 | 96.8 | 97.8 | 19.7 |
| | 1.13 | 58.5 | 67.4 | 81.9 | 92.8 | 96.6 | 97.5 | 18.9 |
| | 2.25 | 58.1 | 70.3 | 83.8 | 94.4 | 96.4 | 97.2 | 18.4 |
| | 4.50 | 57.6 | 70.1 | 84.1 | 91.5 | 95.5 | 96.7 | 15.8 |
| | 9.00 | 57.2 | 70.3 | 84.5 | 89.1 | 94.4 | 96.3 | 14.7 |
| | 18.00 | 57.1 | 70.5 | 84.6 | 88.9 | 94.1 | 96.1 | 13.4 |
| | 36.00 | 56.8 | 70.2 | 85.2 | 89.4 | 93.8 | 94.2 | 12.4 |

Example 8

The light-concentrating film of Study 7 in Example 1 was heat-adhered to the surface glass of a polycrystalline silicon photovoltaic module at 135° C. over 20 minutes, using a 150-μm-thick thermoplastic resin (EVA: product of Sanvic) containing a heat-curing agent. Thereby, a photovoltaic module was produced.

On Apr. 7 and Apr. 8 in 2012, the photovoltaic module and a photovoltaic module without a light-concentrating film (filmless module: blank) were left to stand outside, and the output power [Wh] of each module was measured. The photovoltaic module with the light-concentrating film produced an output power 6.7% higher than the blank module under the cloudy weather on April 7, and produced an output power 3.27% higher than the blank module under the sunny/cloudy weather on April 8.

The results of the experiment on Apr. 7, 2012 are shown in Table 12. The results of the experiment on Apr. 8, 2012 are shown in Table 13.

TABLE 12

| | | No film | | | Film of Study 7 in Example 1 | | |
|---|---|---|---|---|---|---|---|
| | Amount of sunlight [kWh/m$^2$] | Output voltage [V] | Output current [A] | Output power [Wh] | Output voltage [V] | Output current [A] | Output power [Wh] |
| 12:00 am | 0 | 0 | 0 | 0 | 0 | 0 | 0 |
| 1:00 am | 0 | 0 | 0 | 0 | 0 | 0 | 0 |
| 2:00 am | 0 | 0 | 0 | 0 | 0 | 0 | 0 |
| 3:00 am | 0 | 0 | 0 | 0 | 0 | 0 | 0 |
| 4:00 am | 0 | 0 | 0 | 0 | 0 | 0 | 0 |
| 5:00 am | 0.01 | 0 | 0.1 | 0 | 0 | 0.1 | 0 |
| 6:00 am | 0.05 | 0.1 | 0.4 | 0 | 0.1 | 0.4 | 0 |
| 7:00 am | 0.16 | 0.2 | 1.3 | 0.3 | 0.3 | 1.4 | 0.4 |
| 8:00 am | 0.2 | 0.4 | 1.8 | 0.7 | 0.4 | 1.9 | 0.7 |
| 9:00 am | 0.31 | 0.5 | 2.6 | 1.5 | 0.5 | 2.8 | 1.7 |
| 10:00 am | 0.39 | 0.6 | 3 | 2.1 | 0.6 | 3.1 | 2.2 |
| 11:00 am | 0.52 | 0.7 | 3.6 | 2.9 | 0.7 | 3.7 | 2.9 |
| 12:00 pm | 0.42 | 0.6 | 3.1 | 2.1 | 0.6 | 3.2 | 2.3 |
| 1:00 pm | 0.43 | 0.6 | 3.2 | 2.3 | 0.7 | 3.3 | 2.4 |
| 2:00 pm | 0.24 | 0.4 | 2.1 | 1 | 0.4 | 2.2 | 1.1 |
| 3:00 pm | 0.24 | 0.4 | 2.2 | 1.1 | 0.5 | 2.3 | 1.2 |
| 4:00 pm | 0.13 | 0.4 | 1.9 | 0.8 | 0.4 | 2 | 1 |
| 5:00 pm | 0.03 | 0.1 | 0.4 | 0 | 0.1 | 0.4 | 0.1 |
| 6:00 pm | 0 | 0 | 0 | 0 | 0 | 0 | 0 |
| 7:00 pm | 0 | 0 | 0 | 0 | 0 | 0 | 0 |
| 8:00 pm | 0 | 0 | 0 | 0 | 0 | 0 | 0 |
| 9:00 pm | 0 | 0 | 0 | 0 | 0 | 0 | 0 |
| 10:00 pm | 0 | 0 | 0 | 0 | 0 | 0 | 0 |
| 11:00 pm | 0 | 0 | 0 | 0 | 0 | 0 | 0 |
| Average value | — | 0.2 | 1.1 | — | 0.2 | 1.1 | — |
| Integrated value | 3.15 | — | 25.7 | 14.9 | — | 26.8 | 15.9 |

TABLE 13

| | | No film | | | Film of Study 7 in Example 1 | | |
|---|---|---|---|---|---|---|---|
| | Amount of sunlight [kWh/m$^2$] | Output voltage [V] | Output current [A] | Output power [Wh] | Output voltage [V] | Output current [A] | Output power [Wh] |
| 12:00 am | 0 | 0 | 0 | 0 | 0 | 0 | 0 |
| 1:00 am | 0 | 0 | 0 | 0 | 0 | 0 | 0 |
| 2:00 am | 0 | 0 | 0 | 0 | 0 | 0 | 0 |
| 3:00 am | 0 | 0 | 0 | 0 | 0 | 0 | 0 |
| 4:00 am | 0 | 0 | 0 | 0 | 0 | 0 | 0 |
| 5:00 am | 0.01 | 0 | 0.1 | 0 | 0 | 0.1 | 0 |
| 6:00 am | 0.13 | 0.2 | 0.8 | 0.2 | 0.2 | 1 | 0.2 |
| 7:00 am | 0.33 | 0.5 | 2.6 | 1.4 | 0.6 | 2.8 | 1.7 |
| 8:00 am | 0.5 | 0.8 | 4.1 | 3.3 | 0.8 | 4.2 | 3.5 |
| 9:00 am | 0.62 | 0.9 | 4.4 | 3.8 | 0.9 | 4.4 | 3.8 |
| 10:00 am | 0.75 | 0.9 | 4.4 | 3.8 | 0.9 | 4.4 | 3.8 |
| 11:00 am | 0.71 | 0.9 | 4.4 | 3.8 | 0.9 | 4.4 | 3.8 |
| 12:00 pm | 0.73 | 0.9 | 4.4 | 3.9 | 0.9 | 4.4 | 3.9 |
| 1:00 pm | 0.65 | 0.9 | 4.4 | 3.8 | 0.9 | 4.4 | 3.9 |
| 2:00 pm | 0.51 | 0.8 | 4.3 | 3.6 | 0.9 | 4.3 | 3.7 |
| 3:00 pm | 0.34 | 0.7 | 3.3 | 2.3 | 0.7 | 3.5 | 2.4 |
| 4:00 pm | 0.12 | 0.3 | 1.6 | 0.5 | 0.3 | 1.7 | 0.6 |
| 5:00 pm | 0.04 | 0.1 | 0.4 | 0 | 0.1 | 0.5 | 0.1 |
| 6:00 pm | 0 | 0 | 0 | 0 | 0 | 0 | 0 |
| 7:00 pm | 0 | 0 | 0 | 0 | 0 | 0 | 0 |
| 8:00 pm | 0 | 0 | 0 | 0 | 0 | 0 | 0 |
| 9:00 pm | 0 | 0 | 0 | 0 | 0 | 0 | 0 |
| 10:00 pm | 0 | 0 | 0 | 0 | 0 | 0 | 0 |
| 11:00 pm | 0 | 0 | 0 | 0 | 0 | 0 | 0 |
| Average value | — | 0.3 | 1.6 | — | 0.3 | 1.7 | — |
| Integrated value | 5.46 | — | 39.2 | 30.5 | — | 40.1 | 31.5 |

Example 9

The light-concentrating film of Study 7 in Example 1 was heat-adhered to a transparent electrode of an organic thin film photovoltaic module using a thermoplastic resin containing a thermosetting agent, whereby an organic thin film photovoltaic module was produced.

The light-concentrating film of the present invention having the above structure can be used in a wide range of fields such as a focusing element for solarcells, and substitution of lighting by solar lighting.

Example 10

The light-concentrating film of Study 7 in Example 1 was heat-adhered to the surface glass of a polycrystalline silicon photovoltaic module at 135° C. over 20 minutes, using a 150-μm-thick thermoplastic resin (EVA: product of Sanvic) containing a heat-curing agent. Thereby, a photovoltaic module was produced.

The short-circuit current value of the photovoltaic module at each angle of incidence was measured by a new evaluation method using a new solar simulator found by the present inventors. The measurement method can reflect the path of the sun throughout the day and the amount of sunlight throughout the day to the evaluation conditions, which allows evaluation of the output properties of the photovoltaic module under the conditions close to the power generation conditions of actually installed photovoltaic modules.

Figure 19:
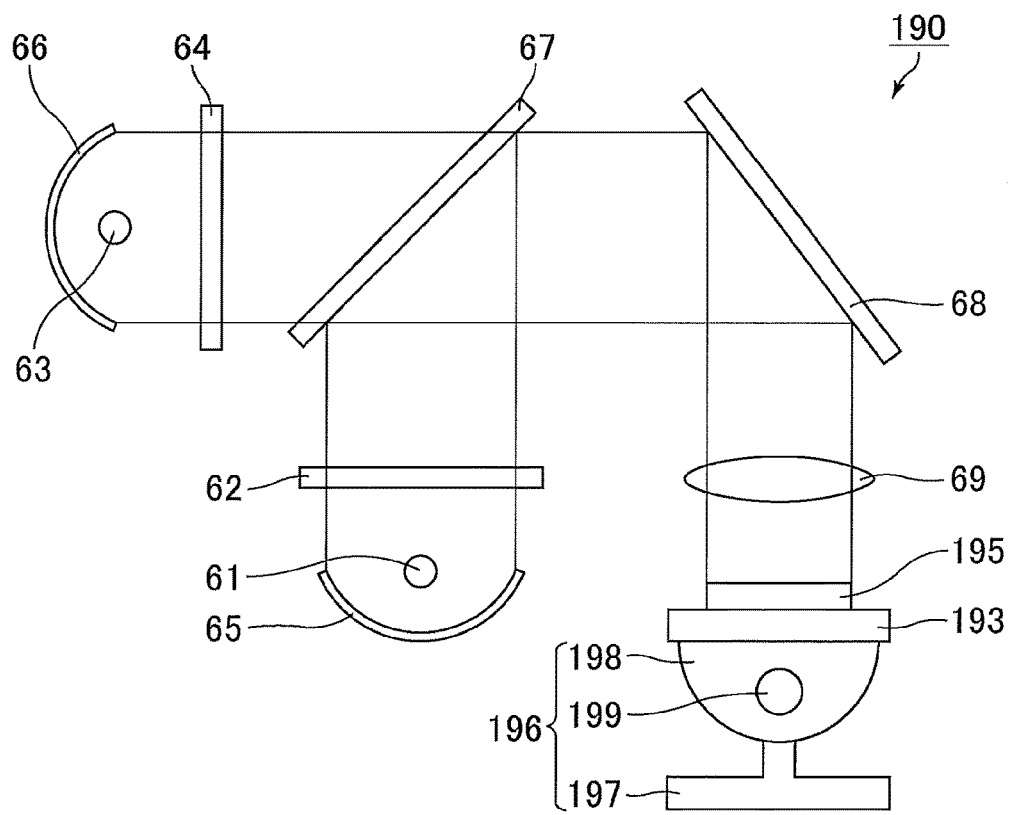
FIG. 19 is a view for describing a solar simulator used in Example 10.

The outline of the solar simulator used is shown in FIG. 19. As illustrated in FIG. 19, a solar simulator 190 used has a light source 61, a light source 63, a spectral correction filter 62 facing the light source 61, and a spectral correction filter 64 facing the light source 63. The filters modify the respective light spectral distributions to the desired spectral distributions before the light beams reach a wavelength mixing filter 67. The wavelength mixing filter 67 combines the light beams of wavelengths in the two different spectral distributions to produce artificial sunlight. The artificial sunlight produced by combining light beams is reflected by a reflector 68 at the desired angle, goes through a collimator lens 69, and is irradiated to a photovoltaic module 195 held on a stage 193.

One of the light source 61 and the light source 63 is a xenon light source, and the other is a halogen light source.

The stage 193 has an angle adjustor 196. The angle adjustor 196 has a base 197, a support 198 capable of inclining at a predetermined angle from the normal of the base 197, and an engagement screw 199 rotatably engaging the support 198 with the base 197. To the support 198 is fixed the stage 193.

In the solar simulator, the stage having the photovoltaic module thereon was inclined by 50 at a time using the angle adjustor such that the photovoltaic module was irradiated with the light from the light source at an angle of incidence of 0 to 85°. The short-circuit current values outputted by the photovoltaic module were recorded. Here, the short-circuit current values of a photovoltaic module without a light-concentrating film were measured in the same manner. The results are shown in Table 14. In Table 14, an amplification ratio represents a ratio of the short-circuit current value outputted from the photovoltaic module having the light-concentrating film to the short-circuit current value outputted from the photovoltaic module without a light-concentrating film.

TABLE 14

| Angle of incidence (°) | Light-concentration film Short-circuit current [A] | No film Short-circuit current [A] | Amplification ratio |
|---|---|---|---|
| 0.0 | 0.188481 | 0.180067 | 1.046727 |
| 5.0 | 0.186332 | 0.178244 | 1.045376 |
| 10.0 | 0.184044 | 0.176135 | 1.044903 |
| 15.0 | 0.179943 | 0.172199 | 1.044971 |
| 20.0 | 0.174136 | 0.167132 | 1.041907 |
| 25.0 | 0.168156 | 0.161691 | 1.039984 |
| 30.0 | 0.159343 | 0.153539 | 1.037801 |
| 35.0 | 0.150718 | 0.145951 | 1.032662 |
| 40.0 | 0.138191 | 0.135110 | 1.022804 |
| 45.0 | 0.128273 | 0.126229 | 1.016193 |
| 50.0 | 0.112797 | 0.111611 | 1.010626 |
| 55.0 | 0.101421 | 0.100435 | 1.009817 |
| 60.0 | 0.087424 | 0.087262 | 1.001856 |
| 65.0 | 0.076380 | 0.074558 | 1.024437 |
| 70.0 | 0.061982 | 0.057331 | 1.081125 |
| 75.0 | 0.046166 | 0.038052 | 1.213235 |
| 80.0 | 0.031313 | 0.020157 | 1.553455 |
| 85.0 | 0.012633 | 0.006611 | 1.910906 |

Figure 20:
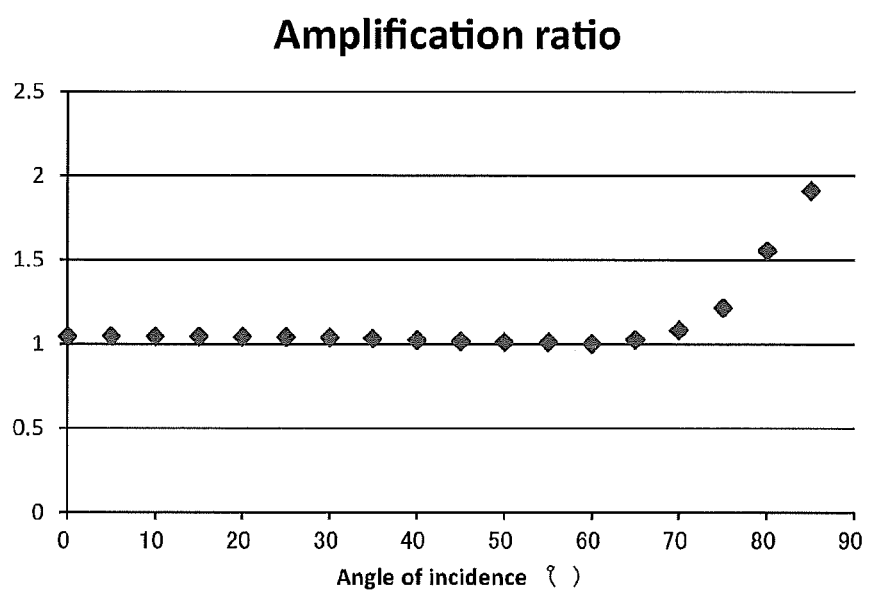
FIG. 20 is a graph showing the results of Example 10.

A graph of the amplification ratios of the short-circuit current values at some angles of incidence is shown in FIG. 20. The power generation at an angle of incidence of at least 60° is greatly increased (4.6% increase).

REFERENCE SIGNS LIST 10, 20, 90, 100 Light-concentrating film
11 Base material
81 Solar battery cell
82 Sealing material layer
116
83 Light-concentrating film
84 Translucent layer
800, 900 Photovoltaic module
50 Film
51 Film roll
52 Die
53 Imprinting device
54 Roll
55 Cutter
161 Intersection of peripheries of respective concavo-convex parts
190 Solar simulator
195 Photovoltaic module

The invention claimed is:

1. A light-concentrating film comprising at least one surface having an alternating fine concavo-convex structure comprising plural concavo-convex parts,
the film having a concavo-convex height (H) of 2.7 to 9.6 μm and a concavo-convex pitch (P) of 4.5 to 50 μm, the film comprising at least one fluororesin selected from the group consisting of an ethylene/tetrafluoroethylene copolymer, an ethylene/chlorotrifluoroethylene copolymer, a chlorotrifluoroethylene/tetrafluoroethylene copolymer, a tetrafluoroethylene/hexafluoropropylene copolymer, a tetrafluoroethylene/perfluoro(alkyl vinyl ether) copolymer, polyvinylidene fluoride, and a tetrafluoroethylene/hexafluoropropylene/ethylene copolymer,
the film concentrating at least one of direct sunlight and diffuse sunlight,
wherein each concavo-convex part has a peripheral shape of at least one polygon selected from a triangle and a hexagon, the peripheral shape referring to the shape of a base of the concavo-convex part when viewed in a direction perpendicular to the film.

2. The light-concentrating film according to claim 1, wherein the concavo-convex parts are disposed with a side of each polygon overlapping one side of an adjacent polygon.

3. The light-concentrating film according to claim 1, wherein each concavo-convex part has a cross-sectional shape of a substantially isosceles trapezoid, a substantially isosceles triangle, a semi-sphere, or a parabola.

4. The light-concentrating film according to claim 1, which is made of an organic material with a refractive index of 1.30 to 1.65.

5. The light-concentrating film according to claim 1, which is transmissive.

6. A photovoltaic module comprising the light-concentrating film according to claim 1.

7. A photovoltaic module comprising:
a solar battery cell;
a sealing material layer with the solar battery cell sealed inside; and
the light-concentrating film according to claim 1 formed on either or both sides of the sealing material layer.

8. A photovoltaic module comprising:
a solar battery cell;
a sealing material layer with the solar battery cell sealed inside;
a translucent layer formed on either or both sides of the sealing material layer; and
the light-concentrating film according to claim 1 disposed on the translucent layer.

9. An organic thin film photovoltaic module comprising at least one surface having an alternating fine concavo-convex structure comprising plural concavo-convex parts,
the module having a concavo-convex height (H) of 2.7 to 9.6 μm and a concavo-convex pitch (P) of 4.5 to 50 μm,
the film comprising at least one fluororesin selected from the group consisting of an ethylene/tetrafluoroethylene copolymer, an ethylene/chlorotrifluoroethylene copolymer, a chlorotrifluoroethylene/tetrafluoroethylene copolymer, a tetrafluoroethylene/hexafluoropropylene copolymer, a tetrafluoroethylene/perfluoro(alkyl vinyl ether) copolymer, polyvinylidene fluoride, and a tetrafluoroethylene/hexafluoropropylene/ethylene copolymer
wherein each concavo-convex part has a peripheral shape of at least one polygon selected from a triangle and a hexagon, the peripheral shape referring to the shape of a base of the concavo-convex part when viewed in a direction perpendicular to the film.

10. The light-concentrating film according to claim 1, wherein the concavo-convex height (H) is 5.4 to 9.6 μm.

* * * * *